(12) United States Patent
Brady et al.

(10) Patent No.: US 12,310,136 B2
(45) Date of Patent: *May 20, 2025

(54) SOLID-STATE IMAGING DEVICE AND IMAGING DEVICE WITH SHARED CIRCUIT ELEMENTS

(71) Applicant: SONY SEMICONDUCTOR SOLUTIONS CORPORATION, Kanagawa (JP)

(72) Inventors: Frederick Brady, Webster, NY (US); Pooria Mostafalu, New York, NY (US); Hongyi Mi, New York, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 200 days.

This patent is subject to a terminal disclaimer.

(21) Appl. No.: 17/638,345

(22) PCT Filed: Aug. 7, 2020

(86) PCT No.: PCT/JP2020/030500
§ 371 (c)(1),
(2) Date: Feb. 25, 2022

(87) PCT Pub. No.: WO2021/044807
PCT Pub. Date: Mar. 11, 2021

(65) Prior Publication Data
US 2022/0293643 A1     Sep. 15, 2022

Related U.S. Application Data

(63) Continuation of application No. 16/561,890, filed on Sep. 5, 2019, now Pat. No. 11,195,869.

(51) Int. Cl.
*H04N 25/74* (2023.01)
*H04N 25/75* (2023.01)
(Continued)

(52) U.S. Cl.
CPC .......... *H10F 39/807* (2025.01); *H04N 25/74* (2023.01); *H04N 25/75* (2023.01); *H04N 25/778* (2023.01); *H10F 39/8037* (2025.01)

(58) Field of Classification Search
CPC .................................................. H10H 20/8232
See application file for complete search history.

(56) References Cited

U.S. PATENT DOCUMENTS 9,001,245 B2    4/2015   Wang et al.
9,986,179 B2    5/2018   Govil
(Continued)

FOREIGN PATENT DOCUMENTS

CN    108695347 A    10/2018
JP    2017535999 A    11/2017
(Continued)

OTHER PUBLICATIONS

International Search Report prepared by the European Patent Office on Nov. 2, 2020, for International Application No. PCT/JP2020/030500, 3 pgs.

(Continued)

*Primary Examiner* — Cynthia Segura
(74) *Attorney, Agent, or Firm* — Sheridan Ross PC

(57) ABSTRACT

An imaging device includes a plurality of unit pixels disposed into pixel groups that are separated from one another by isolation structures. Unit pixels within each pixel group are separated from one another by isolation structures and share circuit elements. The isolation structures between pixel groups are full thickness isolation structures. At least a portion of the isolation structures between unit pixels within a pixel group are deep trench isolation structures.

20 Claims, 37 Drawing Sheets

(51) Int. Cl.
    *H04N 25/778*     (2023.01)
    *H10F 39/00*     (2025.01)

(56) References Cited

U.S. PATENT DOCUMENTS

| | | | |
|---|---|---|---|
| 1,195,869 | A1 | 12/2021 | Mi et al. |
| 11,195,869 | B2 | 12/2021 | Mi et al. |
| 2009/0090845 | A1 | 4/2009 | Yin et al. |
| 2010/0123771 | A1 | 5/2010 | Moon |
| 2012/0217602 | A1* | 8/2012 | Enomoto .......... H01L 27/14654 257/E31.127 |
| 2013/0002915 | A1 | 1/2013 | Itonaga et al. |
| 2014/0110809 | A1 | 4/2014 | Kitamura et al. |
| 2014/0291481 | A1 | 10/2014 | Zhang et al. |
| 2015/0312461 | A1 | 10/2015 | Kim et al. |
| 2016/0043119 | A1* | 2/2016 | Lee .................. H01L 27/14645 257/446 |
| 2016/0056199 | A1 | 2/2016 | Kim et al. |
| 2017/0059399 | A1* | 3/2017 | Suh ....................... H04N 25/77 |
| 2018/0098007 | A1 | 4/2018 | Sano et al. |
| 2018/0190709 | A1 | 7/2018 | Lee et al. |
| 2018/0219035 | A1 | 8/2018 | Otsuki |
| 2019/0368924 | A1 | 12/2019 | Suh et al. |
| 2020/0077055 | A1* | 3/2020 | Kim ....................... H04N 25/11 |
| 2020/0185438 | A1 | 6/2020 | Go et al. |
| 2020/0244910 | A1 | 7/2020 | Ma et al. |
| 2020/0358977 | A1 | 11/2020 | Niwa et al. |
| 2021/0084246 | A1 | 3/2021 | Mostafalu et al. |
| 2021/0098512 | A1* | 4/2021 | Kaklin .............. H01L 27/14643 |
| 2021/0168314 | A1 | 6/2021 | Mehta et al. |

FOREIGN PATENT DOCUMENTS

| | | | |
|---|---|---|---|
| KR | 20160023218 | A | 3/2016 |
| KR | 20170027107 | A | 3/2017 |
| WO | WO-2017187957 | A1 | 11/2017 |
| WO | WO-2019146527 | A1 | 8/2019 |

OTHER PUBLICATIONS

Written Opinion prepared by the European Patent Office on Nov. 2, 2020, for International Application No. PCT/JP2020/030500, 5 pgs.

\* cited by examiner

SOLID-STATE IMAGING DEVICE AND IMAGING DEVICE WITH SHARED CIRCUIT ELEMENTS

CROSS REFERENCE TO RELATED APPLICATIONS

This application is a national stage application under 35 U.S.C. 371 and claims the benefit of PCT Application No. PCT/JP2020/030500, having an international filing date of 7 Aug. 2020, which designated the United States, which PCT application claimed the benefit of U.S. patent application Ser. No. 16/561,890, filed 5 Sep. 2019, the entire disclosures of each of which are incorporated herein by reference.

TECHNICAL FIELD

The present disclosure relates to an imaging device with dynamic vison sensor capabilities.

BACKGROUND

In the related art, a synchronization-type solid-state imaging device that captures image data in synchronization with a synchronization signal such as a vertical synchronization signal has been used in an imaging device and the like. In the typical synchronization-type solid-state imaging device, it is difficult to acquire image data for every period of the synchronization signal (for example, for every 1/60 seconds), and thus it is difficult to cope with cases in which relatively high-speed processing is demanded, such as in fields demanding high speed (e.g. real time) processing, such as autonomous vehicles, robotics, and the like. In this regard, there is suggested a non-synchronization-type solid-state imaging device in which a detection circuit is provided for every pixel to detect a situation in which a light-reception amount exceeds a threshold value as an address event in real time. The non-synchronization-type solid-state imaging device that detects the address event for every pixel is also referred to as a dynamic vision sensor (DVS).

SUMMARY

Technical Problem

However, in a DVS system, it is necessary to provide a circuit configuration for detecting the address event in addition to a circuit configuration for reading out a pixel signal of a voltage value corresponding to a light-reception amount, and thus an occupation ratio of a light-receiving element on a light-receiving surface decreases. By utilizing shared transistors, embodiments of the present disclosure enable a high resolution imaging device with sufficient sensitivity to be provided. In addition, isolation between different pixels or photodetectors within a DVS system is required in order to reduce cross talk. For example, in prior DVS systems full-thickness dielectric trench (RFTI) isolation has been adopted. However, the implementation of RFTI isolation structures in prior DVS systems has precluded or made difficult the sharing of transistors or other circuit elements between photodetectors. As a result, the quantum efficiency with respect to incident light (hereinafter, referred to as "light-reception efficiency") of DVS systems has been relatively poor.

Therefore, the present disclosure provides a solid-state imaging device and an imaging device which are capable of improving the light-reception efficiency.

Solution to Problem

In accordance with embodiments and aspects of the present disclosure, there is provided in imaging device comprising a plurality of photoelectric conversion regions or pixels arranged in an array. Groups of multiple photoelectric conversion regions or pixels that share at least some circuit elements, including but not limited to transistors, are formed within the array. Full-thickness rear deep trench isolation (RFTI) structures are provided between the groups of multiple photoelectric conversion regions. Rear deep trench isolation (RDTI) is provided along at least portions of borders between adjacent photoelectric conversion regions within each group of multiple photoelectric conversion regions.

In accordance with further embodiments and aspects of the present disclosure, some or all of the photoelectric conversion regions are each operatively connected to first and second readout circuits. Moreover, circuit elements shared between photoelectric conversion regions within a group of photoelectric conversion regions can include at least some elements of the first and second readout circuits that are shared between the photoelectric conversion regions within any one group of photoelectric conversion regions. Shared elements can include, but are not limited to, transistors, floating diffusions, and signal lines.

In accordance with still further embodiments and aspects of the present disclosure, at least portions of one or more of the shared elements can be formed underneath an RDTI isolation structure, that is, between an end of an RDTI structure that terminates within a substrate and a non-incident light side surface of the substrate. The present disclosure provides solid-state imaging device and imaging devices with dynamic vision sensing and imaging capabilities that are capable of improved light-reception efficiencies. More particularly, embodiments of the present disclosure provide an imaging device with improved occupation ratios.

DESCRIPTION OF EMBODIMENTS

Figure 1:
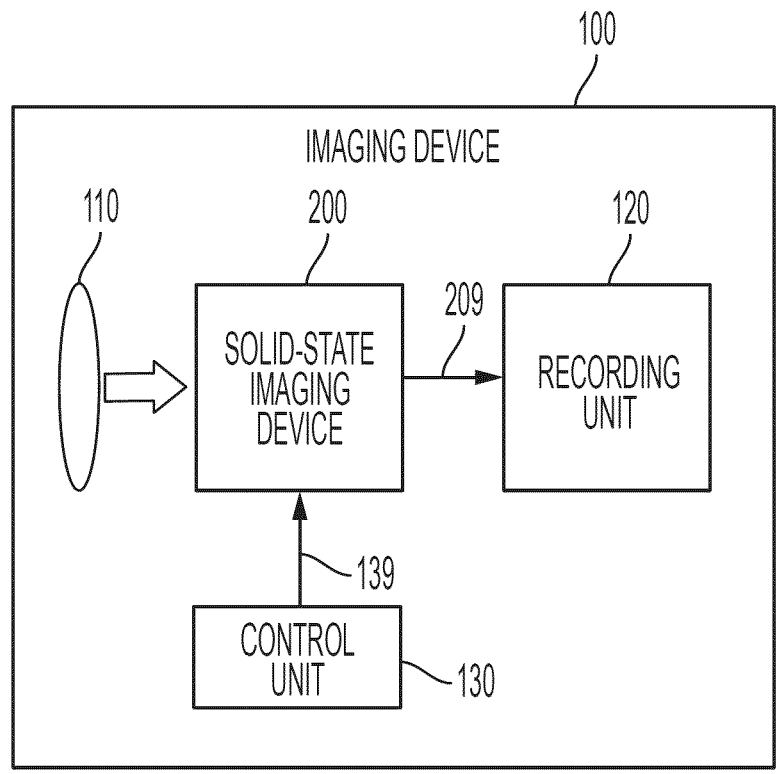
FIG. 1 is a block diagram illustrating a schematic configuration example of a solid-state imaging device in accordance with embodiments of the present disclosure.

Hereinafter, an embodiment of the present disclosure will be described in detail on the basis of the accompanying drawings. Furthermore, in the following embodiments, the same reference numeral will be given to the same portion, and redundant description thereof will be omitted.

A typical dynamic vision sensor (DVS) employs a so-called event-driven type driving method in which the existence or nonexistence of address event ignition is detected for every unit pixel, and a pixel signal is read out from a unit pixel in which the address event ignition is detected.

Furthermore, the unit pixel in this description represents a minimum unit of a pixel including one photoelectric conversion element (also referred to as "light-receiving element"), and can correspond to each dot in image data that is read out from an image sensor as an example. In addition, the address event represents an event that occurs for every address that is allocable to each of a plurality of the unit pixels which are arranged in a two-dimensional lattice shape. An event detection sensor responds to a change in intensity asynchronously. Intensity change is correlated with a change in photocurrent, and if this change exceeds a constant threshold value it could be detected as an event.

FIG. 1 is a block diagram illustrating a schematic configuration example of an imaging device according to at least some embodiments of the present disclosure. As illustrated in FIG. 1, for example, an imaging device 100 includes an imaging lens 110, a solid-state imaging device 200, a recording unit 120, and a control unit 130. As examples, the imaging device 100 can be provided as or as part of a camera that is mounted in an industrial robot, an in-vehicle camera, and the like are assumed.

The imaging lens 110 can include an optical system that directs (e.g. condenses) incident light and images an image of the incident light on a light-receiving surface of the solid-state imaging device 200. The light-receiving surface is a surface on which photoelectric conversion elements in the solid-state imaging device 200 are arranged. The solid-state imaging device 200 photoelectrically converts the incident light to generate image data. In addition, the solid-state imaging device 200 can execute predetermined signal processing such as noise removal and white balance adjustment with respect to the generated image data. A result obtained by the signal processing and a detection signal indicating the existence or nonexistence of an address event ignition are output to the recording unit 120 through a signal line 209. Furthermore, a method of generating the detection signal indicating the existence or nonexistence of the address event ignition will be described later.

The recording unit 120 is, for example, constituted by a flash memory, a dynamic random access memory (DRAM), a static random access memory (SRAM), or the like, and records data input from the solid-state imaging device 200.

The control unit 130 is, for example, constituted by a central processing unit (CPU) and the like, and outputs various instructions through a signal line 139 to control respective units such as the solid-state imaging device 200 in the imaging device 100.

Next, a configuration example of the solid-state imaging device 200 will be described in detail with reference to the accompanying drawings.

Figure 2:
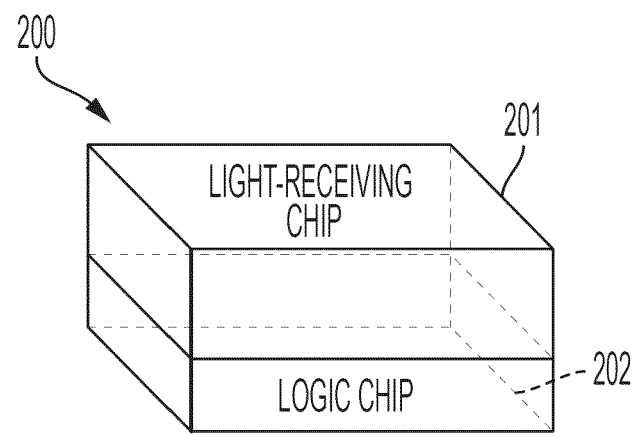
FIG. 2 is a view illustrating a lamination structure example of a solid-state imaging device according to in accordance with embodiments of the present disclosure.

FIG. 2 is a view illustrating a lamination structure example of a solid-state imaging device in accordance with at least some embodiments of the present disclosure. As illustrated in FIG. 2, the solid-state imaging device 200 can have a structure in which a light-receiving chip 201 and a logic chip 202 are vertically laminated. In joining of the light-receiving chip 201 and the logic chip 202, for example, so-called direct joining in which joining surfaces of the chips are planarized, and the chips are laminated with an inter-electron force can be used. However, there is no limitation thereto, and for example, so-called Cu—Cu joining in which copper (Cu) electrode pads formed on joining surfaces are bonded, bump joining, and the like can also be used.

In addition, the light-receiving chip 201 and the logic chip 202 are electrically connected to each other, for example, through a connection portion such as a through-silicon via (TSV) that penetrates through a semiconductor substrate. In the connection using the TSV, for example, a so-called twin TSV method in which two TSVs including a TSV that is formed in the light-receiving chip 201 and a TSV that is formed from the light-receiving chip 201 to the logic chip 202 are connected to each other on chip external surfaces, a so-called shared TSV method in which the light-receiving chip 201 and the logic chip 202 are connected with a TSV that penetrates through both the chips, and the like can be employed.

However, in the case of using the Cu—Cu joining or the bump joining in the joining of the light-receiving chip 201 and the logic chip 202, both the light-receiving chip 201 and the logic chip 202 are electrically connected to each other through a Cu—Cu joint or a bump joint.

Figure 3:
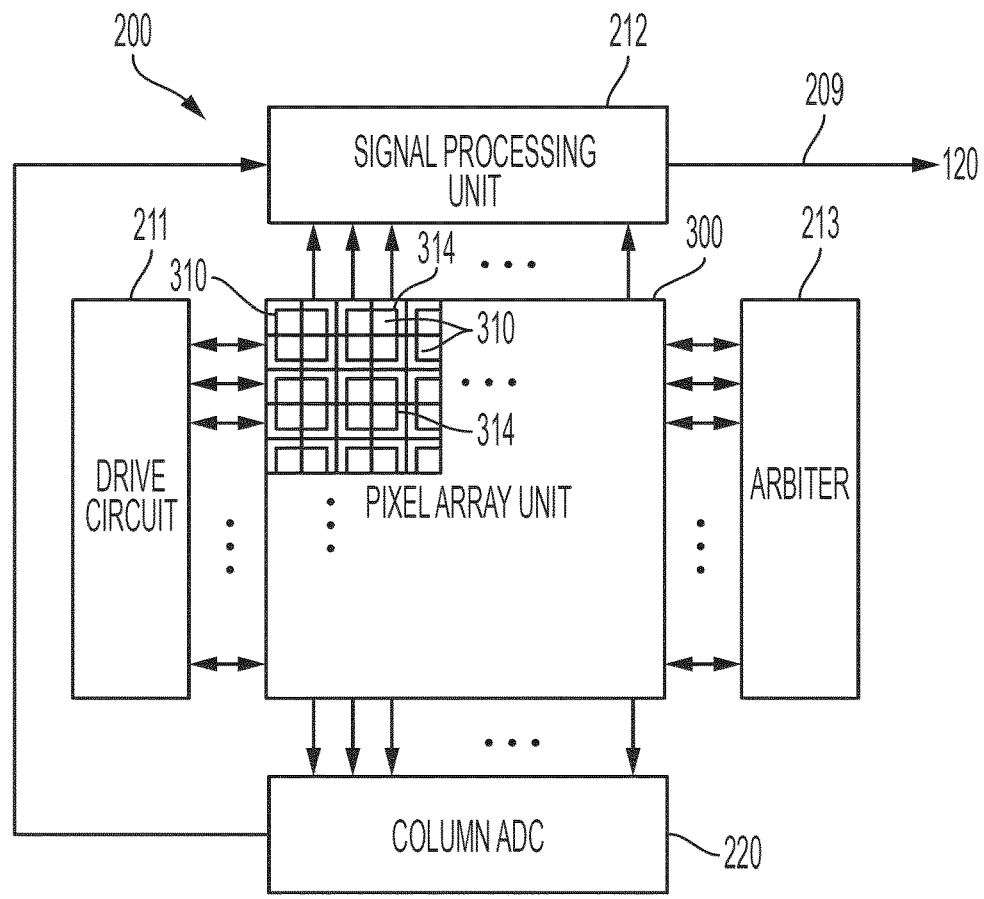
FIG. 3 is a block diagram illustrating a functional configuration example of a solid-state imaging device in accordance with embodiments of the present disclosure.

FIG. 3 is a block diagram illustrating a functional configuration example of the solid-state imaging device according to at least some embodiments of the present disclosure. As illustrated in FIG. 3, the solid-state imaging device 200 includes a drive circuit 211, a signal processing unit 212, an arbiter 213, a column ADC 220, and a pixel array unit 300.

A plurality of unit cells or pixels 310 are arranged in the pixel array unit 300 in a two-dimensional lattice shape. Details of the unit pixels 310 will be described later. For example, each of the unit pixels 310 includes a photoelectric conversion element such as a photodiode, and a circuit that generates a pixel signal of a voltage value corresponding to the amount of charges generated in the photoelectric conversion element (hereinafter, referred to as a pixel circuit or a pixel imaging signal generation readout circuit). Here, the pixel circuit may be shared by a plurality of photoelectric conversion elements. In this case, the unit pixels 310 each includes one photoelectric conversion element and a pixel circuit that is shared.

The plurality of unit pixels 310 are arranged in the pixel array unit 300 in a two-dimensional lattice shape. The plurality of unit pixels 310 may be grouped into a plurality pixel blocks, each including a predetermined number of unit pixels. Hereinafter, an assembly of unit pixels which are arranged in a horizontal direction is referred to as "row", and an assembly of unit pixels which are arranged in a direction orthogonal to the row is referred to as "column".

Each of the unit pixels 310 generates charges corresponding to an amount of light received at the respective photoelectric conversion element. In addition, the unit pixels 310, alone or in combination with one or more other unit pixels 310 in the same group, can be operated to detect the existence or nonexistence of address event ignition on the basis of whether or not a value of a current (hereinafter, referred to as a photocurrent) produced by charges generated in the photoelectric conversion element or a variation amount thereof exceeds a predetermined threshold value. In addition, when the address event is ignited, a request for reading out a pixel signal of a voltage value corresponding to the light-reception amount of the photoelectric conversion element is output to the arbiter 213.

The drive circuit 211 drives each of the unit pixels 310, and allows each of the unit pixels 310 to output a pixel signal to the column ADC 220.

The arbiter 213 arbitrates requests from the unit pixels, and transmits a predetermined response to the unit pixel 310 which issues the request on the basis of the arbitration result. The unit pixel 310 which receives the response supplies a detection signal indicating the existence or nonexistence of the address event ignition (hereinafter, simply referred to as "address event detection signal") to the drive circuit 211 and the signal processing unit 212.

For every unit pixel 310 column, the column ADC 220 converts an analog pixel signal from the column into a digital signal. In addition, the column ADC 220 supplies a digital signal generated through the conversion to the signal processing unit 212.

The signal processing unit 212 executes predetermined signal processing such as correlated double sampling (CDS) processing (noise removal) and white balance adjustment with respect to the digital signal transmitted from the column ADC 220. In addition, the signal processing unit 212 supplies a signal processing result and an address event detection signal to the recording unit 120 through the signal line 209.

The unit pixels 310 within the pixel array unit 300 may be disposed in pixel groups 314. In the configuration illustrated in FIG. 3, for example, the pixel array unit 300 is constituted by pixel groups 314 that include an assembly of unit pixels 310 that receive wavelength components necessary to reconstruct a color. For example, in the case of reconstructing a color on the basis of three primary colors of RGB, in the pixel array unit 300, a unit pixel 310 that receives light of a red (R) color, a unit pixel 310 that receives light of a green (G) color, and a unit pixel 310 that receives light of a blue (B) color are arranged in groups 314a according to a predetermined color filter array.

Examples of the color filter array configuration include various arrays such as a Bayer array of 2×2 pixels, a color filter array of 3×3 pixels which is employed in an X-Trans (registered trademark) CMOS sensor (hereinafter, also referred to as "X-Trans (registered trademark) type array"), a Quad Bayer array of 4×4 pixels (also referred to as "Quadra array"), and a color filter of 4×4 pixels in which a white RGB color filter is combined to the Bayer array (hereinafter, also referred to as "white RGB array"). Here, in the following description, a case where the Bayer array is employed as the color filter array will be exemplified.

Figure 4:
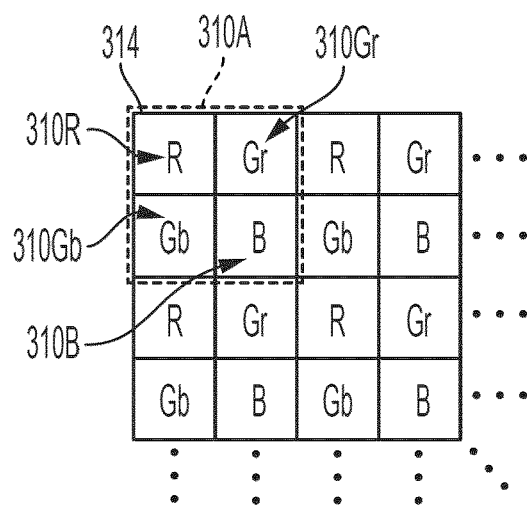
FIG. 4 is a schematic view illustrating an array example of unit pixels in accordance with embodiments of the present disclosure in a case of employing a Bayer array in a color filter array.

FIG. 4 is a schematic view illustrating an array example of unit pixels 310 in the case of employing pixel groups 314 with an arrangement of unit pixels 310 and associated color filters in the color filter array configured to form a plurality of Bayer arrays 310A. As illustrated in FIG. 4, in the case of employing the Bayer array as the color filter array configuration, in the pixel array unit 300, a basic pattern 310A including a total of four unit pixels of 2×2 pixels is repetitively arranged in a column direction and a row direction. For example, the basic pattern 310A is constituted by a unit pixel 310R including a color filter of a red (R) color, a unit pixel 310Gr including a color filter of a green (Gr) color, a unit pixel 310Gb including a color filter of a green (Gb) color, and a unit pixel 310B including a color filter of a blue (B) color.

Figure 5:
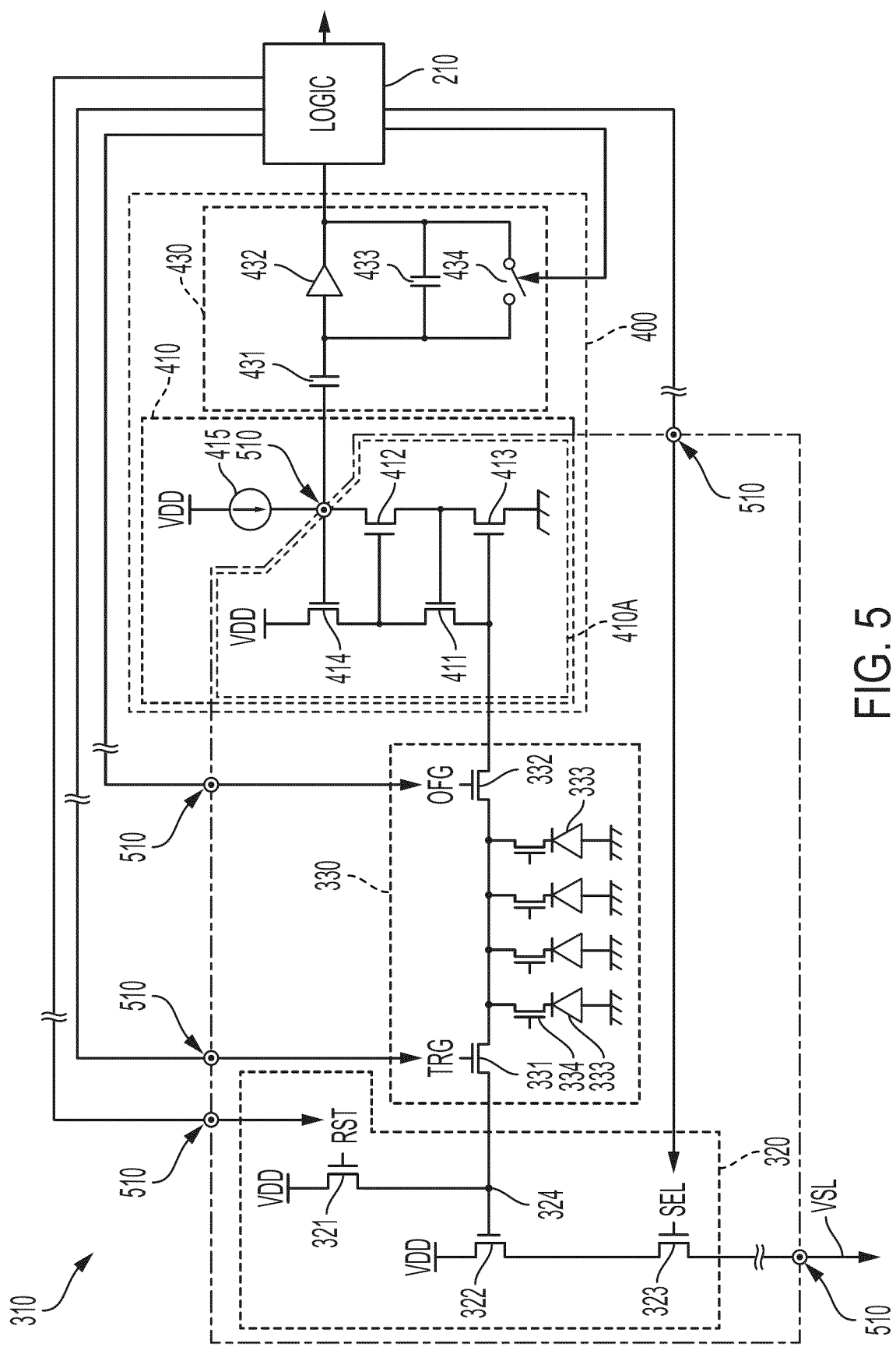
FIG. 5 is a circuit diagram illustrating a schematic configuration example of a unit pixel in accordance with embodiments of the present disclosure.

Next, a configuration example of a unit pixel 310 will be described. FIG. 5 is a circuit diagram illustrating a schematic configuration example of the unit pixel 310 according to at least some embodiments of the present disclosure. As illustrated in FIG. 5, the unit pixel 310 includes, for example, a pixel imaging signal generation unit (or readout circuit) 320, a light-receiving unit 330, and an address event detection unit (or readout circuit) 400. According to at least one example embodiment, the readout circuit 400 is configured to control the readout circuit 320 based on charge generated by one or more photoelectric conversion elements (or photoelectric conversion regions) 333. Each photoelectric conversion element 333 can be associated with a unit pixel transistor 334. Furthermore, the logic circuit 210 in FIG. 5 is a logic circuit including, for example, the drive circuit 211, the signal processing unit 212, and the arbiter 213 in FIG. 3.

For example, the light-receiving unit 330 includes a transmission transistor (first transistor) 331, an overflow gate (OFG) transistor (fifth transistor) 332, and a photoelectric conversion element 333. A transmission signal TRG transmitted from the drive circuit 211 is supplied to a gate of the pixel group transmission transistor 331 of the light-receiving unit 330, and a control signal OFG transmitted from the drive circuit 211 is supplied to a gate of the OFG transistor 332. An output through the pixel group transmission transistor 331 of the light-receiving unit 330 is connected to the pixel imaging signal generation unit 320, and an output through the OFG transistor 332 is connected to the address event detection unit 400.

For example, the pixel imaging signal generation unit 320 includes a reset transistor (second transistor) 321, an amplification transistor (third transistor) 322, a selection transistor (fourth transistor) 323, and a floating diffusion layer (FD) 324.

The pixel group transmission transistor 331 and the OFG transistor 332 of the light-receiving unit 330 are constituted, for example, by using an N-type metal-oxide-semiconductor (MOS) transistor (hereinafter, simply referred to as "NMOS transistor"). Similarly, the reset transistor 321, the amplification transistor 322, and the selection transistor 323 of the pixel imaging signal generation unit 320 are each constituted, for example, by using the NMOS transistor.

For example, the address event detection unit 400 includes a current-voltage conversion unit 410 and a subtractor 430. However, the address event detection unit 400 is further provided with a buffer, a quantizer, and a transmission unit. Details of the address event detection unit 400 will be described in the following description by using FIG. 6 and the like.

In the illustrated configuration, the photoelectric conversion element 333 of the light-receiving unit 330 photoelectrically converts incident light to generate a charge. The pixel group transmission transistor 331 transmits a charge generated in the photoelectric conversion element 333 to the floating diffusion layer 324 in accordance with the transmission signal TRG. The OFG transistor 332 supplies an electric signal (photocurrent) based on the charge generated in the photoelectric conversion element 333 to the address event detection unit 400 in accordance with the control signal OFG.

The floating diffusion layer 324 accumulates charges transmitted from the photoelectric conversion element 333 through the pixel group transmission transistor 331. The reset transistor 321 discharges (initializes) the charges accumulated in the floating diffusion layer 324 in accordance with a reset signal transmitted from the drive circuit 211. The amplification transistor 322 allows a pixel signal of a voltage value corresponding to a charge amount of charges accumulated in the floating diffusion layer 324 to appear in a vertical signal line VSL. The selection transistor 323 switches a connection between the amplification transistor 322 and the vertical signal line VSL in accordance with a selection signal SEL transmitted from the drive circuit 211. Furthermore, the analog pixel signal that appears in the vertical signal line VSL is read out by the column ADC 220, and is converted into a digital pixel signal.

When an instruction for address event detection initiation is given by the control unit 130, the drive circuit 211 in the logic circuit 210 outputs the control signal OFG for setting the OFG transistor 332 of all light-receiving units 330 in the pixel array unit 300 to an ON-state. With this arrangement, a photocurrent generated in the photoelectric conversion element 333 of the light-receiving unit 330 is supplied to the address event detection unit 400 of each unit pixel 310 through the OFG transistor 332.

When detecting address event ignition on the basis of the photocurrent from the light-receiving unit 330, the address event detection unit 400 of each unit pixel 310 outputs a request to the arbiter 213. With respect to this, the arbiter 213 arbitrates the request transmitted from each of the unit pixels 310, and transmits a predetermined response to the unit pixel 310 that issues the request on the basis of the arbitration result. The unit pixel 310 that receives the response supplies a detection signal indicating the existence or nonexistence of the address event ignition (hereinafter, referred to as "address event detection signal") to the drive circuit 211 and the signal processing unit 212 in the logic circuit 210.

The drive circuit 211 sets the OFG transistor 332 in the unit pixel 310 that is a supply source of the address event detection signal to an OFF-state. With this arrangement, a supply of the photocurrent from the light-receiving unit 330 to the address event detection unit 400 in the unit pixel 310 is stopped.

Next, the drive circuit 211 sets the pixel group transmission transistor 331 in the light-receiving unit 330 of the unit pixel 310 to an ON-state by the transmission signal TRG. With this arrangement, a charge generated in the photoelectric conversion element 333 of the light-receiving unit 330 is transmitted to the floating diffusion layer 324 through the pixel group transmission transistor 331. In addition, a pixel signal of a voltage value corresponding to a charge amount of charges accumulated in the floating diffusion layer 324 appears in the vertical signal line VSL that is connected to the selection transistor 323 of the pixel imaging signal generation unit 320.

As described above, in the solid-state imaging device 200, a pixel signal SIG is output from the unit pixel 310 in which the address event ignition is detected to the column ADC 220.

Furthermore, for example, the light-receiving unit 330, the pixel imaging signal generation unit 320, and two log (LG) transistors (sixth and seventh transistors) 411 and 414 and two amplification transistors (eighth and ninth transistors) 412 and 413 in the current-voltage conversion unit 410 of the address event detection unit 400 are disposed, for example, in the light-receiving chip 201 illustrated in FIG. 2, and other components can be disposed, for example, in the logic chip 202 that is joined to the light-receiving chip 201 through the Cu—Cu joining. Therefore, in the following description, in the unit pixel 310, configurations which are disposed in the light-receiving chip 201 are referred to as "upper layer circuit".

Figure 6:
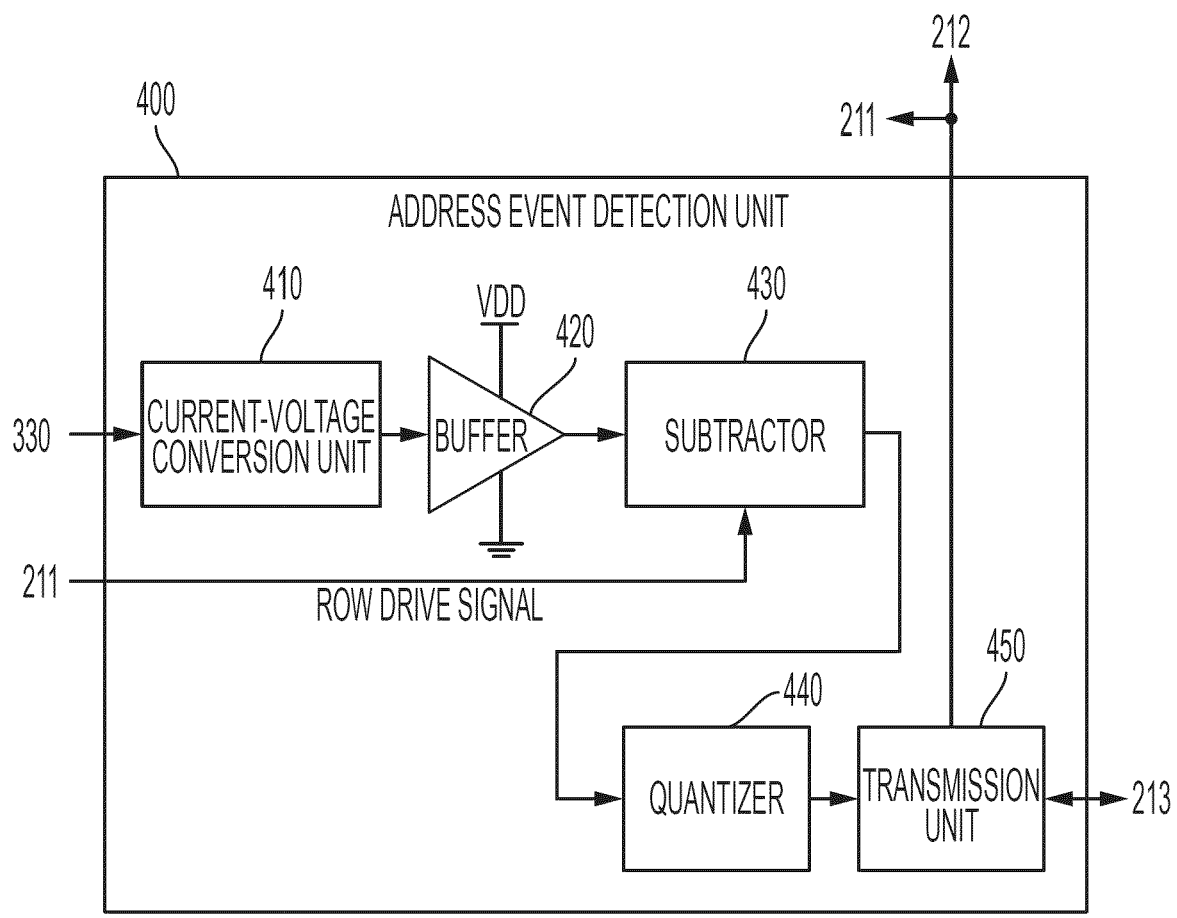
FIG. 6 is a block diagram illustrating a schematic configuration example of an address event detection unit in accordance with embodiments of the present disclosure.

FIG. 6 is a block diagram illustrating a schematic configuration example of the address event detection unit according to at least some embodiments of the present disclosure. As illustrated in FIG. 6, the address event detection unit 400 includes a current-voltage conversion unit 410, a buffer 420, a subtractor 430, a quantizer 440, and a transmission unit 450.

The current-voltage conversion unit 410 converts the photocurrent from the light-receiving unit 330 into a voltage signal in a logarithm thereof, and supplies the voltage signal generated through the conversion to the buffer 420.

The buffer 420 corrects the voltage signal transmitted from the current-voltage conversion unit 410, and outputs a voltage signal after correction to the subtractor 430.

The subtractor 430 lowers a voltage level of the voltage signal transmitted from the buffer 420 in accordance with a row drive signal transmitted from the drive circuit 211 and, supplies the lowered voltage signal to the quantizer 440.

The quantizer 440 quantizes the voltage signal transmitted from the subtractor 430 into a digital signal, and outputs the digital signal generated through the quantization to the transmission unit 450 as a detection signal.

The transmission unit 450 transmits the detection signal transmitted from the quantizer 440 to the signal processing unit 212 and the like. For example, when address event ignition is detected, the transmission unit 450 supplies a request for transmission of an address event detection signal from the transmission unit 450 to the drive circuit 211 and the signal processing unit 212 to the arbiter 213. In addition, when receiving a response with respect to the request from the arbiter 213, the transmission unit 450 supplies the detection signal to the drive circuit 211 and the signal processing unit 212.

For example, the current-voltage conversion unit 410 in the configuration illustrated in FIG. 6 includes the two LG transistors 411 and 414, the two amplification transistors 412 and 413, and a constant-current circuit 415 as illustrated in FIG. 5.

For example, a source of the LG transistor 411 and a gate of the amplification transistor 413 are connected to a drain of the OFG transistor 332 of the light-receiving unit 330. In addition, for example, a drain of the LG transistor 411 is connected to a source of the LG transistor 414 and a gate of the amplification transistor 412. For example, a drain of the LG transistor 414 is connected to a power supply terminal VDD.

In addition, for example, a source of the amplification transistor 413 is grounded, and a drain thereof is connected to a gate of the LG transistor 411 and a source of the amplification transistor 412. For example, a drain of the amplification transistor 412 is connected to a power supply terminal VDD through the constant-current circuit 415. For example, the constant-current circuit 415 is constituted by a load MOS transistor such as a p-type MOS transistor.

In this connection relationship, a loop-shaped source follower circuit is constructed.

With this arrangement, a photocurrent from the light-receiving unit 330 is converted into a voltage signal in a logarithmic value corresponding to a charge amount thereof. Furthermore, the LG transistors 411 and 414, and the amplification transistors 412 and 413 may be each constituted, for example, by an NMOS transistor.

Figure 7:
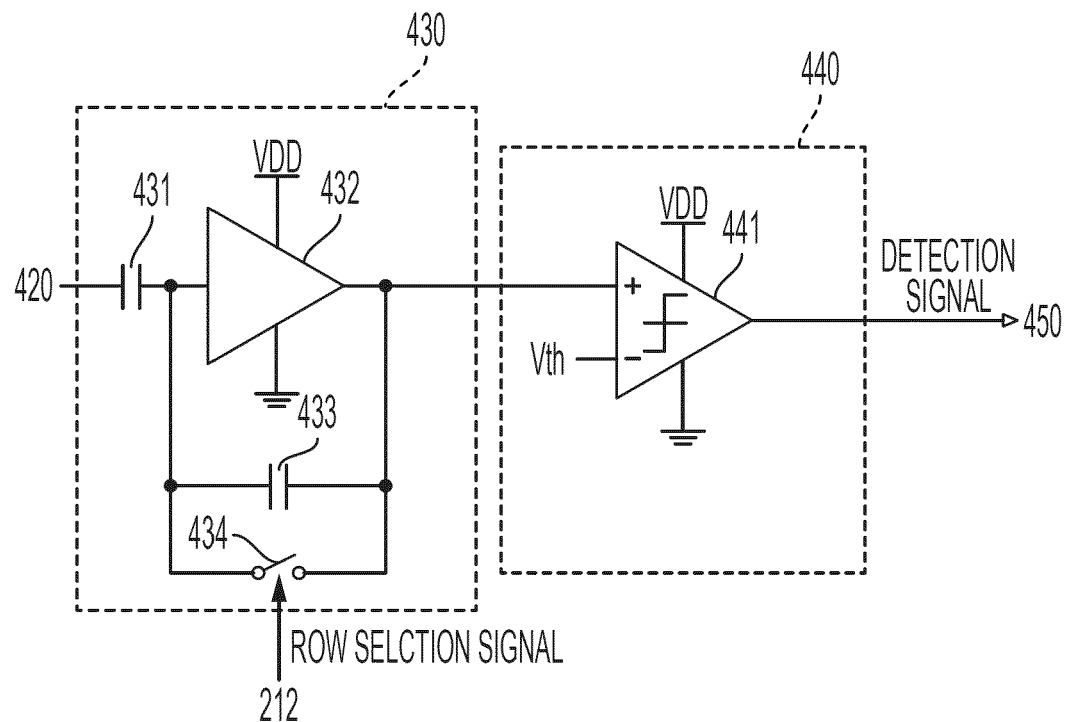
FIG. 7 is a circuit diagram illustrating a schematic configuration example of a subtractor and a quantizer in accordance with embodiments of the present disclosure.

FIG. 7 is a circuit diagram illustrating a schematic configuration example of the subtractor and the quantizer according to at least some embodiments of the present disclosure. As illustrated in FIG. 7, the subtractor 430 includes capacitors 431 and 433, an inverter 432, and a switch 434. In addition, the quantizer 440 includes a comparator 441.

One end of the capacitor 431 is connected to an output terminal of the buffer 420, and the other end is connected to an input terminal of the inverter 432. The capacitor 433 is connected to the inverter 432 in parallel. The switch 434 opens or closes a route connecting both ends of the capacitor 433 in accordance with a row drive signal.

The inverter 432 inverts a voltage signal that is input through the capacitor 431. The inverter 432 outputs an inverted signal to a non-inverting input terminal (+) of the comparator 441.

When the switch 434 is turned on, a voltage signal Vinit is input to a buffer 420 side of the capacitor 431. In addition, the opposite side becomes a virtual ground terminal. A potential of the virtual ground terminal is set to zero for convenience. At this time, when a capacity of the capacitor 431 is set as C1, a potential Qinit that is accumulated in the capacitor 431 is expressed by the following Expression (1). On the other hand, both ends of the capacitor 433 are short-circuited, and thus an accumulated charge thereof becomes zero.

$$Q\text{init} = C1 \times V\text{init} \quad (1)$$

Next, when considering a case where the switch 434 is turned off, and a voltage of the capacitor 431 on the buffer 420 side varies and reaches Vafter, a charge Qafter accumulated in the capacitor 431 is expressed by the following Expression (2).

$$Q\text{after} = C1 \times V\text{after} \quad (2)$$

On the other hand, when an output voltage is set as Vout, a charge Q2 accumulated in the capacitor 433 is expressed by the following Expression (3).

$$Q2 = -C2 \times V\text{out} \quad (3)$$

At this time, a total charge amount of the capacitors 431 and 433 does not vary, and thus the following Expression (4) is established.

$$Q\text{init} = Q\text{after} + Q2 \quad (4)$$

When Expression (1) to Expression (3) are substituted for Expression (4), the following Expression (5) is obtained.

$$V\text{out} = -(C1/C2) \times (V\text{after} - V\text{init}) \quad (5)$$

Expression (5) represents a subtraction operation of a voltage signal, and a gain of the subtraction result becomes C1/C2. Typically, it is desired to maximize (or alternatively, improve) the gain, and thus it is preferable to make a design so that C1 becomes large and C2 becomes small. On the other hand, when C2 is excessively small, kTC noise increases, and thus there is a concern that noise characteristics deteriorate. Accordingly, a reduction in the capacity of C2 is limited to a range capable of permitting noise. In addition, since the address event detection unit 400 including the subtractor 430 is mounted for every unit pixel 310, a restriction on an area is present in capacities C1 and C2. Values of the capacities C1 and C2 are determined in consideration of the restriction.

The comparator 441 compares a voltage signal transmitted from the subtractor 430 and a predetermined threshold voltage Vth that is applied to an inverting input terminal (−). The comparator 441 outputs a signal indicating the comparison result to the transmission unit 450 as a detection signal.

In addition, when a conversion gain by the current-voltage conversion unit 410 is set as $CG_{log}$, and a gain of the buffer 420 is set to "1", a gain A of the entirety of the address event detection unit 400 is expressed by the following Expression (6).

[Math. 1]

$$A = \frac{CG_{log} \cdot C1}{C2} \sum_{n=1}^{N} i_{photo\_n} \quad (6)$$

In Expression (6), $i_{photo\_n}$ represents a photocurrent of an nth unit pixel 310, and a unit thereof is, for example, an ampere (A). N represents the number of the unit pixels 310 in a pixel block, and is "1" in this embodiment.

Figure 8:
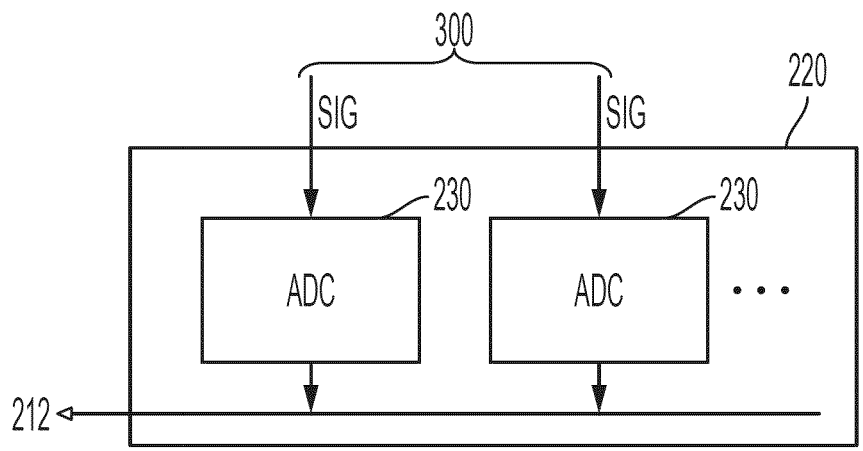
FIG. 8 is a block diagram illustrating a schematic configuration example of a column ADC in accordance with embodiments of the present disclosure.

FIG. 8 is a block diagram illustrating a schematic configuration example of the column ADC according to at least some embodiments of the present disclosure. The column ADC 220 includes a plurality of ADCs 230 which are provided for every column of the unit pixels 310.

Each of the ADCs 230 converts an analog pixel signal that appears in the vertical signal line VSL into a digital signal. For example, the pixel signal is converted into a digital signal in which a bit length is greater than that of a detection signal. For example, when the detection signal is set to two bits, the pixel signal is converted into a digital signal of three or greater bits (16 bits and the like). The ADC 230 supplies a generated digital signal to the signal processing unit 212.

Next, an operation of the solid-state imaging device 200 according to at least embodiments of the present disclosure will be described in detail with reference to the accompanying drawings.

Figure 9:
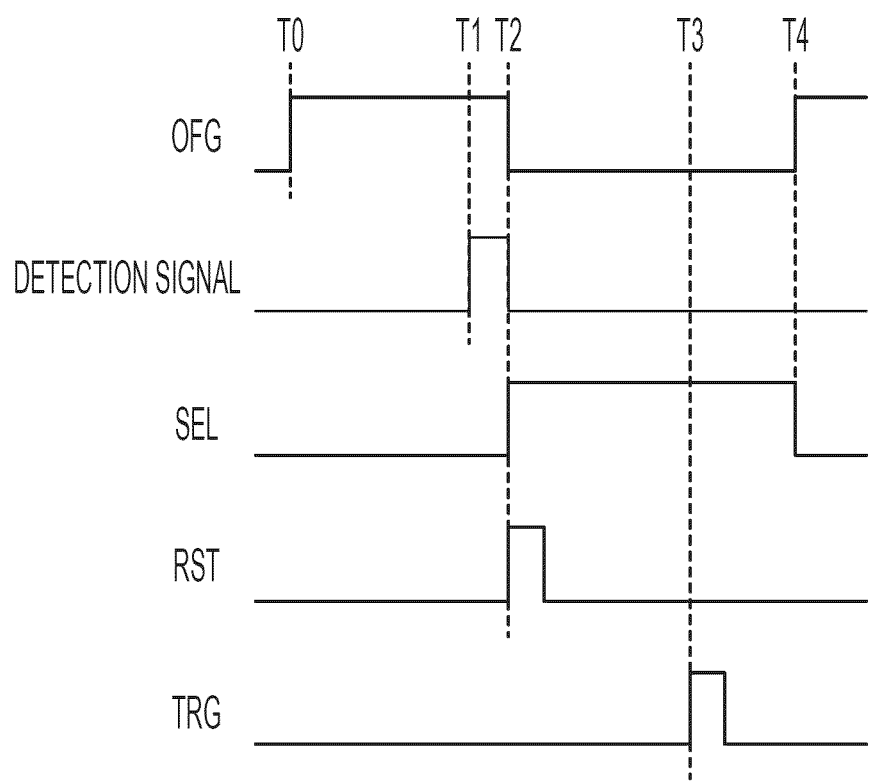
FIG. 9 is a timing chart illustrating an example of an operation of a solid-state imaging device in accordance with embodiments of the present disclosure.

First, an example of the operation of the solid-state imaging device 200 will be described by using a timing chart. FIG. 9 is a timing chart illustrating an example of the operation of the solid-state imaging device according to the first embodiment.

As illustrated in FIG. 9, at a timing T0, when an instruction for address event detection initiation is given by the control unit 130, the drive circuit 211 raises the control signal OFG applied to the gate of the OFG transistor 332 of all of the light-receiving units 330 in the pixel array unit 300 to a high level. With this arrangement, a plurality of the OFG transistors 332 of all of the light-receiving units 330 enter an ON-state, and a photocurrent based on a charge generated in the photoelectric conversion element 333 of each of the light-receiving units 330 is supplied from each the light-receiving units 330 to each of a plurality of the address event detection units 400.

In addition, in a period in which the control signal OFG is in a high level, all of the transmission signals TRG applied to the gate of the pixel group transmission transistor 331 in each of the light-receiving units 330 are maintained in a low level. Accordingly, in this period, a plurality of the transmission transistors 331 in all of the light-receiving units 330 are in an OFF-state.

Next, a case where the address event detection unit 400 of an arbitrary unit pixel 310 detects address event ignition in a period in which the control signal OFG is in a high level will be assumed. In this case, the address event detection unit 400 that detects the address event ignition transmits a request to the arbiter 213. With respect to this, the arbiter 213 arbitrates the request, and returns a response for the request to the address event detection unit 400 that issues the request.

The address event detection unit 400 that receives the response raises a detection signal that is input to the drive circuit 211 and the signal processing unit 212 to a high level, for example, in a period of a timing T1 to a timing T2. Furthermore, in this description, it is assumed that the detection signal is a one-bit signal.

The drive circuit 211 to which a high-level detection signal is input from the address event detection unit 400 at the timing T1 lowers all control signals OFG to a low level at a subsequent timing T2. With this arrangement, supply of a photocurrent from all of the light-receiving units 330 of the pixel array unit 300 to the address event detection unit 400 is stopped.

In addition, at the timing T2, the drive circuit 211 raises a selection signal SEL that is applied to a gate of the selection transistor 323 in the pixel imaging signal generation unit 320 of the unit pixel 310 in which the address event ignition is detected (hereinafter, referred to as "reading-out target unit pixel") to a high level, and raises a reset signal RST that is applied to a gate of the reset transistor 321 of the same pixel imaging signal generation unit 320 to a high level for a constant pulse period, thereby discharging (initializing) charges accumulated in the floating diffusion layer 324 of the pixel imaging signal generation unit 320. In this manner, a voltage, which appears in the vertical signal line VSL in a state in which the floating diffusion layer 324 is initialized, is read out by the ADC 230 connected to the vertical signal line VSL in the column ADC 220 as a reset-level pixel signal (hereinafter, simply referred to as "reset level"), and is converted into a digital signal.

Next, at a timing T3 after reading out the reset level, the drive circuit 211 applies a transmission signal TRG of a constant pulse period to the gate of the pixel group transmission transistor 331 of the light-receiving unit 330 in the reading-out target unit pixel 310. With this arrangement, a charge generated in the photoelectric conversion element 333 of the light-receiving unit 330 is transmitted to the floating diffusion layer 324 in the pixel imaging signal generation unit 320, and a voltage corresponding to charges accumulated in the floating diffusion layer 324 appears in the vertical signal line VSL. In this manner, the voltage that appears in the vertical signal line VSL is read out by the ADC 230 connected to the vertical signal line VSL in the column ADC 220 as a signal-level pixel signal of the light-receiving unit 330 (hereinafter, simply referred to as "signal level") and is converted into a digital value.

The signal processing unit 212 executes CDS processing in which a difference between the reset level and the signal level which are read out as described above is obtained as a net pixel signal corresponding to a light-reception amount of the photoelectric conversion element 333.

Next, at a timing T4, the drive circuit 211 lowers the selection signal SEL that is applied to the gate of the selection transistor 323 in the pixel imaging signal generation readout circuit 320 of the reading-out target unit pixel 310 to a low level, and raises the control signal OFG that is applied to the gate of the OFG transistor 332 of all of the light-receiving units 330 in the pixel array unit 300 to a high level. With this arrangement, address event ignition detection in all of the light-receiving units 330 in the pixel array unit 300 is restarted.

Figure 10:
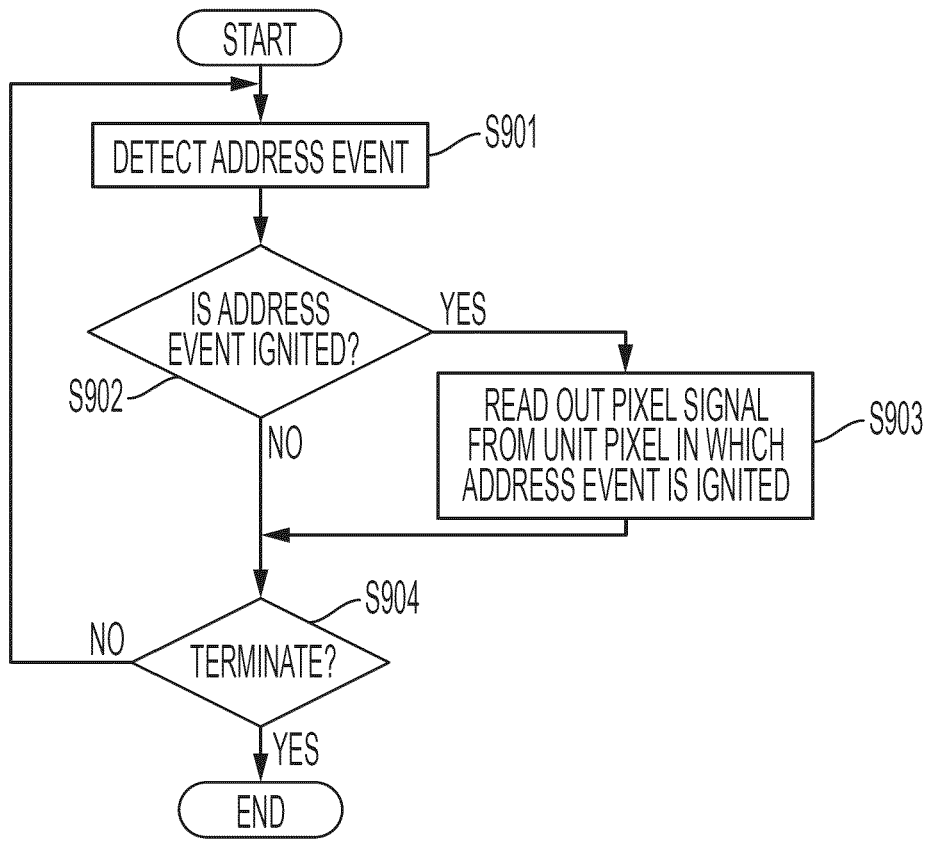
FIG. 10 is a flowchart illustrating an example of the operation of a solid-state imaging device in accordance with embodiments of the present disclosure.

Next, an example of the operation of the solid-state imaging device 200 will be described by using a flowchart. FIG. 10 is a flowchart illustrating an example of the operation of the solid-state imaging device according to at least some embodiments of the present disclosure. For example, this operation is initiated when a predetermined application for detecting an address event is executed.

As illustrated in FIG. 10, in this operation, first, each of the unit pixels 310 in the pixel array unit 300 detects existence or nonexistence of address event ignition (step S901). In addition, the drive circuit 211 determines whether or not address event ignition is detected in any one of the unit pixels 310 (step S902).

In a case where the address event ignition is not detected (NO in step S902), this operation proceeds to step S904. On the other hand, in a case where the address event ignition is detected (YES in step S902), the drive circuit 211 executes reading-out of a pixel signal with respect to the unit pixel 310 in which the address event ignition is detected (step S903), and proceeds to step S904.

In step S904, it is determined whether or not to terminate this operation. In a case where this operation is not terminated (NO in step S904), this operation returns to step S901, and the subsequent operations are repeated. On the other hand, in a case where this operation is terminated (YES in step S904), this operation is terminated.

Figure 11:
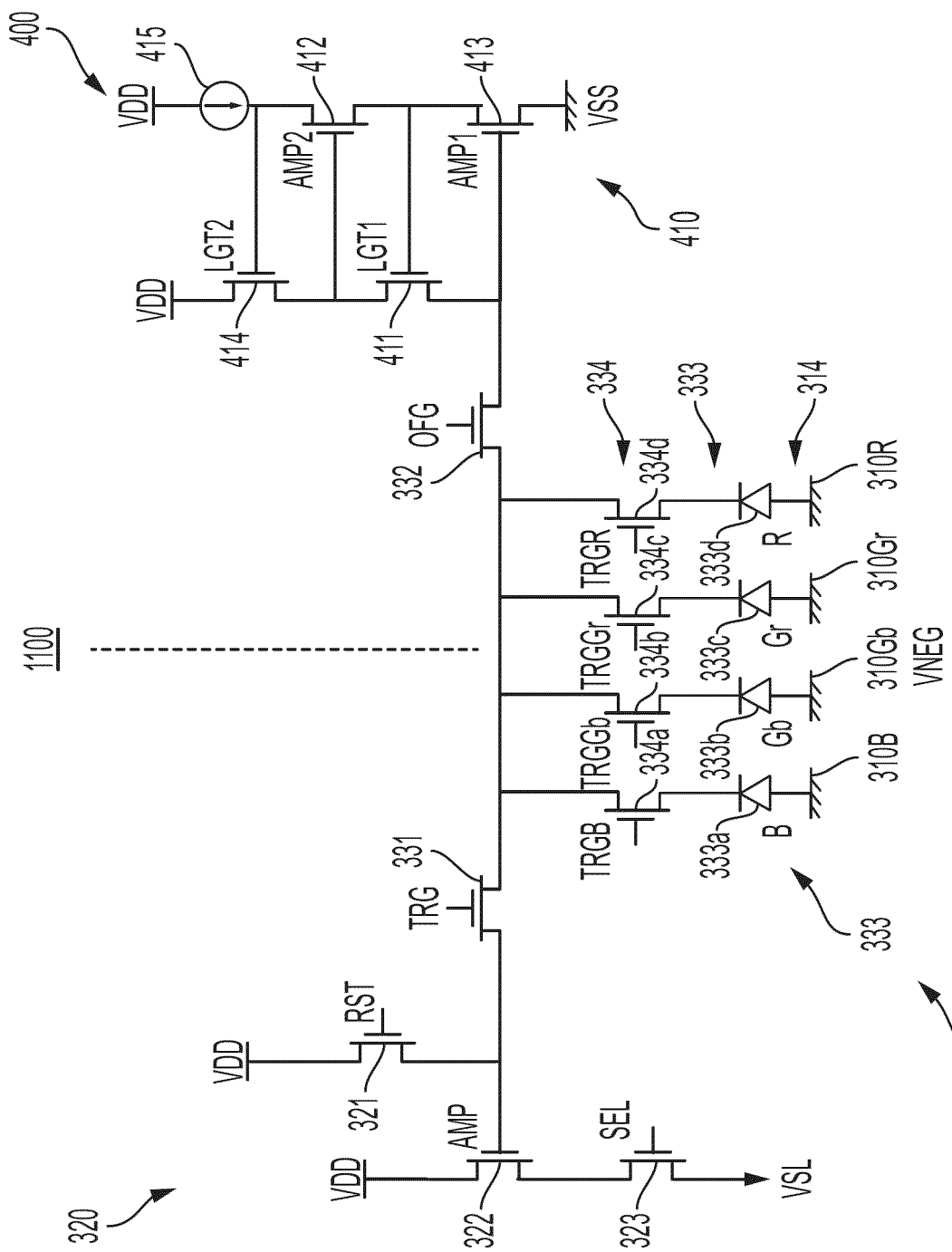
FIG. 11 is a circuit diagram illustrating a schematic configuration example of a unit pixel group in accordance with at least some embodiments of the present disclosure.

FIG. 11 is a circuit diagram illustrating a schematic configuration example of a pixel group circuit 1100 for a group 314 of unit pixels 310 in accordance with at least some embodiments of the present disclosure. More particularly, FIG. 11 illustrates a pixel group circuit 1100 in which the photoelectric conversion units 333 of all of the unit pixels 310 included in a group 314 of unit pixels 310 share elements of the circuit 1100. In this example, the unit pixels 310 are part of a pixel group 314 comprising a basic Bayer array pattern 310A, with a first unit pixel 310R associated with a red color filter, a second unit pixel 310Gb associated with a green color filter, a third unit pixel 310Gr associated with a green color filter, and a fourth unit pixel 310B associated with a blue color filter. Accordingly, this example includes a group 314 of four unit pixels 310. However, other arrangements and configurations are possible.

The pixel group circuit 1100 generally includes a light receiving unit 330 having a plurality of photoelectric conversion units 333. As an example, but without limitation, the photoelectric conversion units 333 can include photodiodes. In this example, one photoelectric conversion unit 333 is included in each unit pixel 310, although other configurations are possible. Moreover, in this circuit 1100 in which at least some elements are shared between multiple unit pixels 310, the light receiving unit 330 includes a plurality of unit pixel transistors 334, with the photoelectric conversion unit 333 of each unit pixel 310 being selectively connected to the pixel group transmission transistor 331 and the pixel group overflow gate transistor 332 by a respective unit pixel transmission transistor 334. The pixel group circuit 1100 also includes a pixel imaging signal generation readout circuit 320 and an address event detection readout circuit 400. The pixel imaging signal generation readout circuit 320 and the address event detection readout circuit 400 can be configured in the same way as or similarly to the readout circuits 320 and 400 of FIG. 5. The address event detection readout circuit 400 could also be formed from two transistors, depending on the desired sensitivity and pixel size.

As noted, each photoelectric conversion unit 333 is selectively connected to other circuit elements by a respective unit pixel transmission transistor 334. Moreover, one or multiple photoelectric conversion units 333 can be connected to other circuit elements simultaneously through operation of the unit pixel transistors 334. For instance, in an imaging mode, the unit pixel transmission transistor 334 associated with each selected photoelectric conversion unit 333 and the pixel group transmission transistor 331 are placed in a conductive state in order to operatively connect the selected photoelectric conversion unit 333 to the pixel imaging signal generation readout circuit 320. In an event detection or dynamic vision sensor (DVS) mode, the unit pixel transmission transistor 334 associated with each selected photoelectric conversion unit 333 and the pixel group overflow gate transistor 332 are placed in a conductive state in order to operatively connect the selected photoelectric conversion unit 333 to the address event detection readout circuit 400. In a typical operating condition, in the imaging mode a single one of the photoelectric conversion units 333 is operable at any one time to provide a signal to the pixel imaging signal generation readout circuit 320, while in a DVS mode one, some, or all of the photoelectric conversion units 333 are operable at any one time to provide a signal to the address event detection readout circuit 400.

The connection between any one of the photoelectric conversion units 333 and the pixel imaging signal generation readout circuit 320 is established by operating the unit pixel transmission transistor 334a-d of a selected photoelectric conversion unit 333a-d and the pixel group transmission transistor 331 to allow charge to pass from the selected photoelectric conversion unit 333 to the FD 324 of the pixel imaging signal generation readout circuit 320. The charge can then be read out from the FD 324, for example as described in connection with FIG. 5. Although charge from a single photoelectric conversion unit 333 is passed to the pixel imaging signal generation readout circuit 320 in a typical imaging operation, other modes in which signals from multiple photoelectric conversion units 333, corresponding to multiple unit pixels 310 are passed to the pixel imaging signal generation readout circuit 320 are possible. As can be appreciated by one of skill in the art after consideration of the present disclosure, the pixel group overflow gate transistor 332 remains closed during an imaging operation. As can further be appreciated by one of skill in the art after consideration of the present disclosure, the operation of the pixel image signal generation circuit 320 can be triggered by the detection of an event by the address event detection readout circuit 400 for the pixel group 314.

The connection between any one or more of the photoelectric conversion units 333 and the address event detection readout circuit 400 is established by operating the unit pixel transmission transistor 334 of each selected photoelectric conversion unit 333 and the pixel group overflow gate transistor 332 to allow charge to pass from the selected photoelectric conversion units 333 to the address event detection readout circuit 400. In accordance with at least some embodiments of the present disclosure, all of the unit pixel transmission transistors 334 and the pixel group overflow gate transistor 332 are operated to connect all of the photoelectric conversion units 333 within a pixel group 314 to the address event detection readout circuit 400 for that pixel group 314 simultaneously when the pixel group circuit 1100 is operated in an address event detection mode. As can be appreciated by one of skill in the art after consideration of the present disclosure, the pixel group transmission transistor 331 remains closed (off) during an event detection operation.

Accordingly, the circuit configuration of FIG. 11 is an example of an arrangement in which a plurality of unit pixels 310 of an imaging device 100 capable of performing both event detection and imaging operations, and in which the photoelectric conversion units 333 of the respective unit pixels 310 share elements of the event detection 400 and pixel imaging signal generation readout 320 circuits.

Figure 12A:
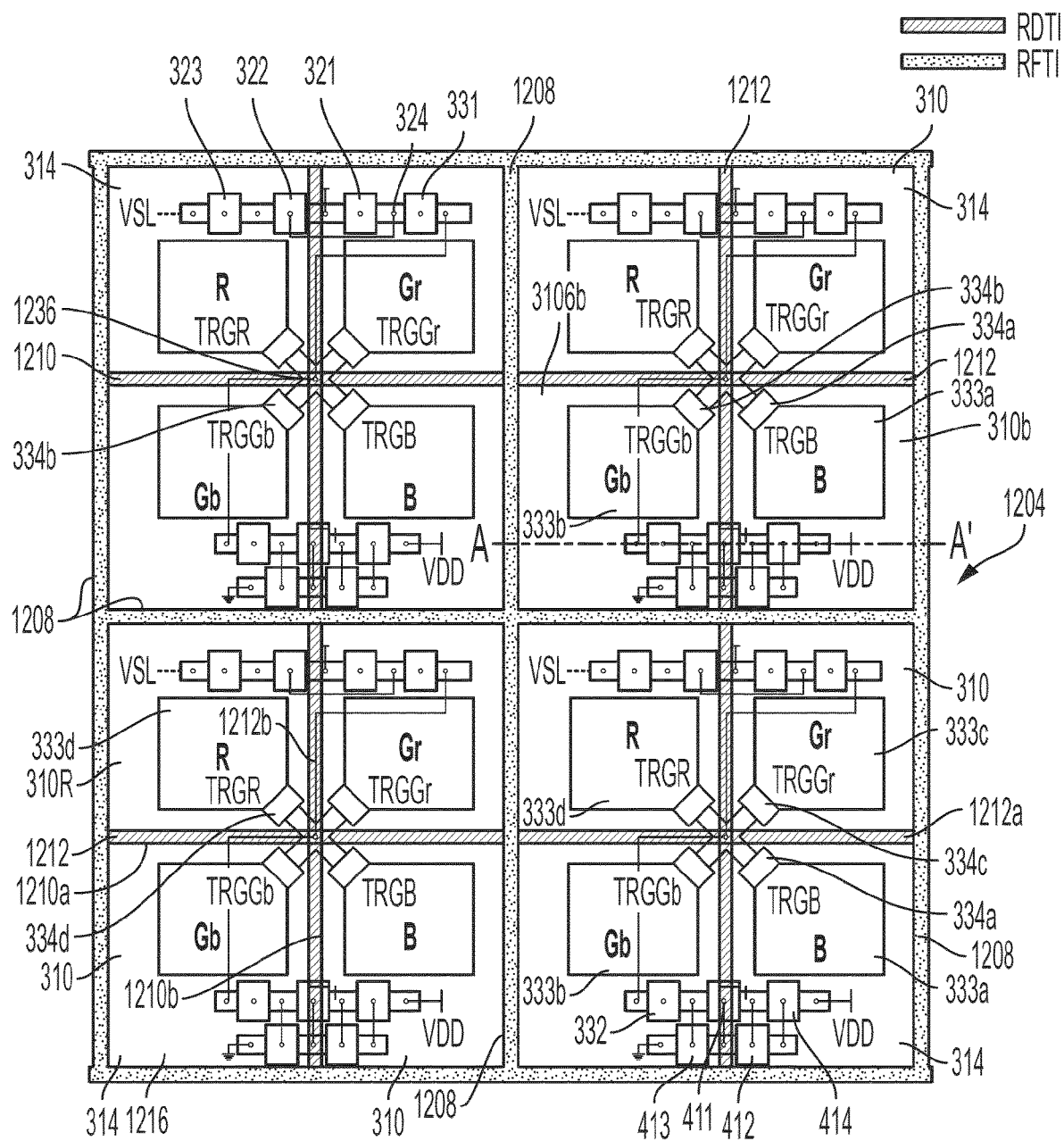
FIG. 12A is a plan view of a pixel configuration in accordance with a first exemplary embodiment of the present disclosure.
Figure 12B:
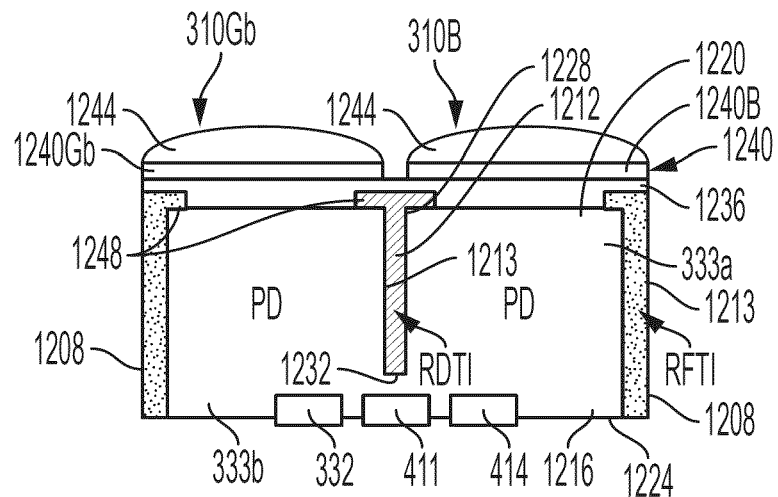
FIG. 12B is a cross section of a portion of the first exemplary embodiment.

FIG. 12A is a plan view of a portion of a pixel array unit 300, and FIG. 12B is a cross section taken along line A-A' in FIG. 12A, illustrating a pixel group 314 configuration 1204 in accordance with a first exemplary embodiment of the present disclosure. In this example, groups 314 of unit pixels 310 are defined and are separated from one another by full thickness dielectric trench isolation or simply full thickness trench isolation (RFTI) structures 1208. Within each pixel group 314, unit pixels 310 are separated from one another by an inter-pixel group isolation structure 1210 in the form of deep trench isolation (RDTI) structures 1212. The inter pixel group isolation structure 1210 within a pixel group 314 can include a horizontal portion 1210a that extends between unit pixels 310 in adjacent rows, and a vertical portion 1210b that extends between unit pixels 310 in adjacent columns. More particularly, the pixel configuration 1204 features RDTI structures 1212 along the entire extent of the boundaries between adjacent unit pixels 310 within each pixel group 314, with a first RDTI structure 1212a extending between adjacent rows of unit pixels 310 within each pixel group 314, and a second RDTI structure 1212b extending between adjacent columns of unit pixels 310 within each pixel group 314. Although in this example four pixel groups 314 in a 2×2 array in which each of the pixel groups 314 includes four unit pixels 310 in a 2×2 sub-array or group array pattern are shown, other configurations are possible.

In accordance with embodiments of the present disclosure, and as illustrated in FIG. 12B, RFTI structures 1208 extend through the entire thickness of a substrate 1216 in which the photodiodes 333 of the unit pixels 314 are formed. That is, the RFTI structures 1208 extend from at least a first, light incident surface 1220, to a second, non-light incident surface 1224, of the substrate 1216. The RDTI structures 1212 extend from a first end 1228 at or above the first surface 1220 to a second end 1232 that is formed towards the second surface 1224 of the substrate 1216. In particular, the RDTI structures 1212 extend for distance that is less than a thickness of the substrate 1216, and thus do not reach the second surface 1224. Accordingly, substrate 1216 material remains between the second end 1232 of the RDTI structures 1212 and the second surface 1224 of the substrate 1216. Both the RFTI structures 1208 and the RDTI structures 1212 can be formed with a dielectric core 1213. As an example, but without limitation, the dielectric core 1213 can be formed from silicon dioxide.

As also shown in FIG. 12B, each unit pixel 310 can include an insulation or planarizing layer 1236 formed on the first surface 1220 of the substrate 1216. In addition, a color filter 1240 can be provided for each unit pixel 310. In this example, a green color filter 1240Gb is provided as part of a first one of the illustrated unit pixels 310Gb, and a blue color filter 1240B is provided as part of a second one of the illustrated unit pixels 310B. Each unit pixel 310 can also be provided with an on-chip lens 1244. In accordance with still further embodiments, a light shielding element or structure 1248 can be formed on or as part of the RFTI 1208 and/or RDTI 1212 structures at or on the first surface 1220 of the substrate 1216.

The circuit elements associated with each pixel group 314 in the example pixel group configuration 1204 of FIGS. 12A and 12B may be the same as or similar to those illustrated in the pixel group circuit 1100 of FIG. 11. In accordance with embodiments of the present disclosure, one or more circuit elements, such as transistor, conductor, or other elements of a pixel group circuit 1100, are at least partially formed or located between the second end 1232 of one or more of the RDTI structures 1212 within an area of the pixel group 314 and the second surface 1224 of the substrate 1216. For instance, in the example of FIGS. 12A and 12B, at least a portion of a log transistor 414 of the address event detection readout circuit 400 for the pixel group circuit 1100 can be formed between the second end 1232 of an RDTI structure 1212 and the second surface 1224 of the substrate 1216. As a further example, at least a portion of a drain/source region of amplification transistors 412 and 413 can be formed in an area between the second end 1232 of an RDTI structure 1212 and the second surface 1224 of the substrate 1216. As still another example, at least a portion of a node 1236 at which the unit pixel transistors 334 are connected to the pixel group transmission transistor 331 and the pixel group overflow gate transistor 332 can be formed between the second ends 1232 of two intersecting RDTI structures 1212 and the second surface 1224 of the substrate 1216.

Accordingly, embodiments of the present disclosure can provide suitable isolation between pixel groups 314 using RFTI structures 1208, and between unit pixels 310 within a pixel group 314 using RDTI structures 1212, while providing a more favorable ratio of a total area of a pixel group 314 to areas of the photoelectric conversion units 333 of the unit pixels 310 within the pixel group 314 by facilitating the sharing of pixel group circuit 1100 elements, and by enabling the formation of at least portions of elements of the pixel group circuit 1100 in areas between an end of an RDTI structure 1212 and a surface of the substrate 1216. Moreover, by allowing the area of the photo detector conversion unit 333 to be increased relative to the total pixel group 314 area, as compared to alternative configurations that do not feature RDTI 1212 or other partial thickness structures 1208, the performance of the unit pixels 310 within the pixel group 314 can be improved, for example by improving the saturation signal and sensitivity of the unit pixels 310 in the group 314.

Figure 29A:
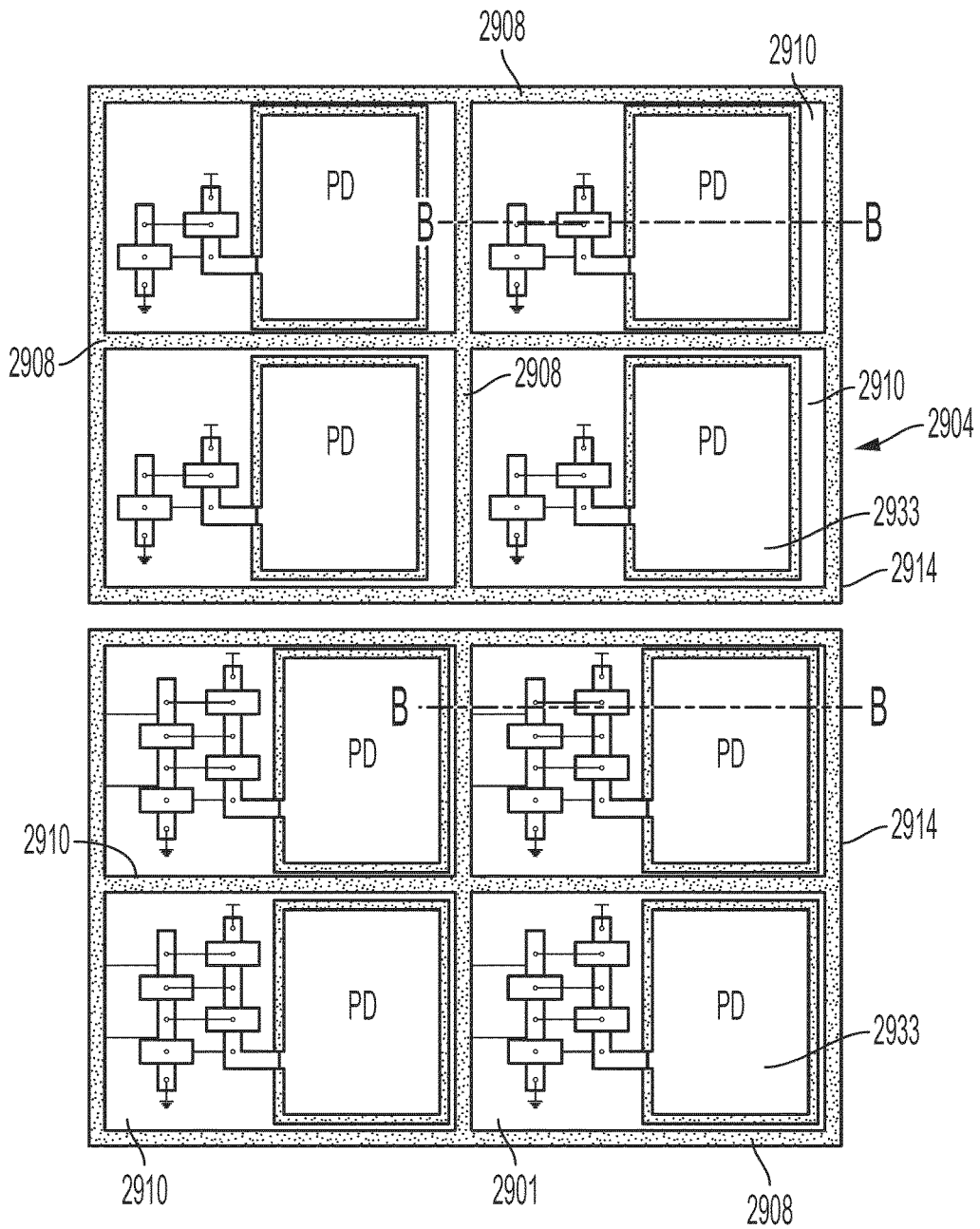
FIG. 29A is a plan view of a prior art pixel group configuration.
Figure 29B:
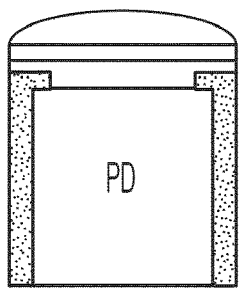
FIG. 29B is a cross section of a portion of the prior art configuration.

The advantages of embodiments of the present disclosure can be further appreciated by comparing a pixel group 314 configuration 1204 in accordance with embodiments of the present disclosure to the background pixel group configuration 2904 depicted in FIGS. 29A, and 29B. In that background example, the boundaries between unit pixels 2910 within a pixel group 2914, as well as between pixel groups 2914, are defined using RFTI structures 2908. In particular, in this example background configuration, sharing of transistors or other circuit elements between unit pixels 2910 is not provided. Moreover, the inclusion of circuit elements in areas also occupied by RFTI structures 2908 is not possible. As a result, the area of a circuit element portion 2901 relative to a photoelectric conversion unit portion 2933 of a unit pixel 2910 in this prior art example is large. Said another way, the area of the photoelectric conversion unit portion 2933 of this prior art example is a relatively small proportion of the total unit pixel 310 area.

Figure 13A:
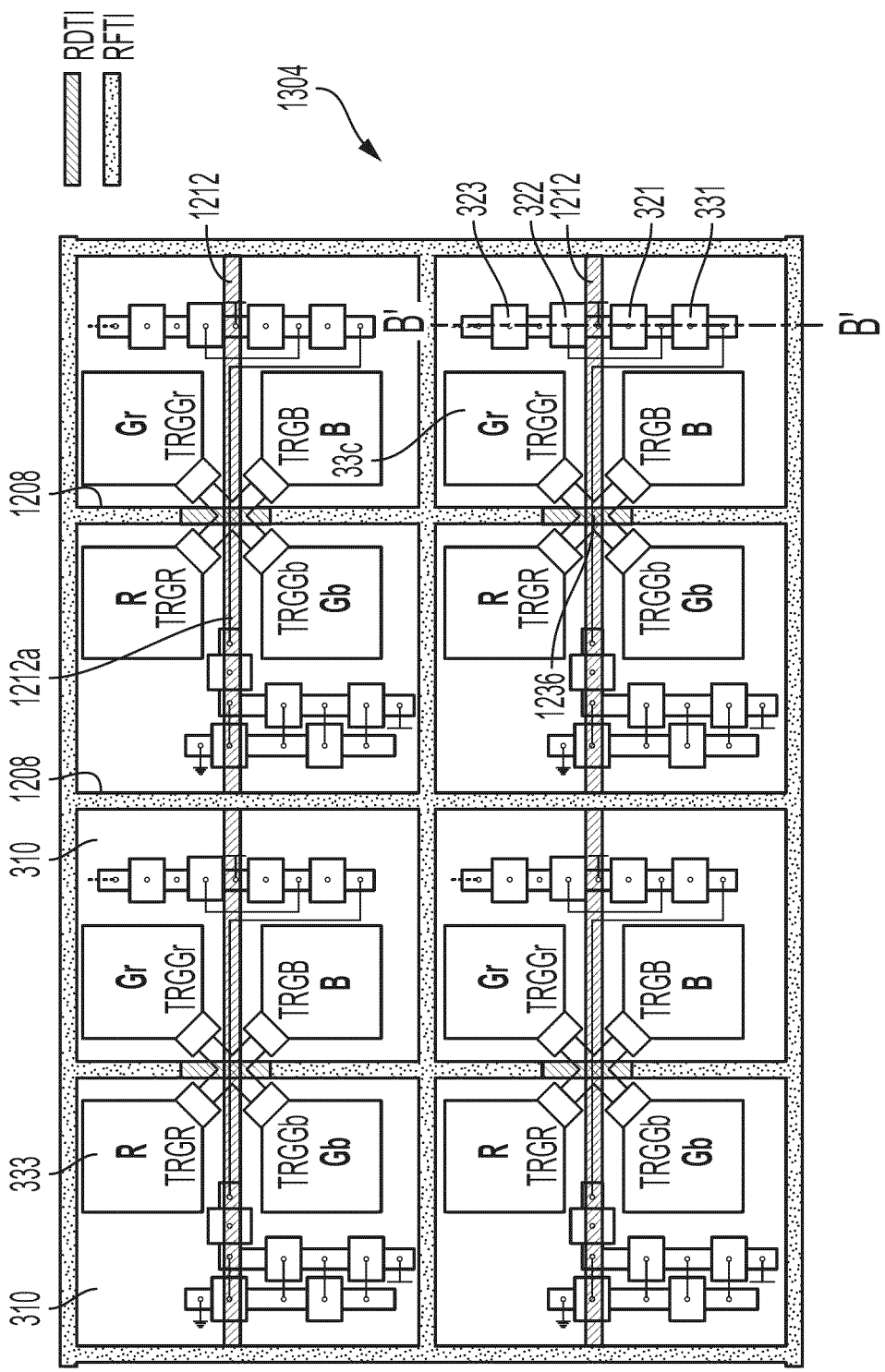
FIG. 13A is a plan view of a pixel configuration in accordance with a second exemplary embodiment of the present disclosure.
Figure 13B:
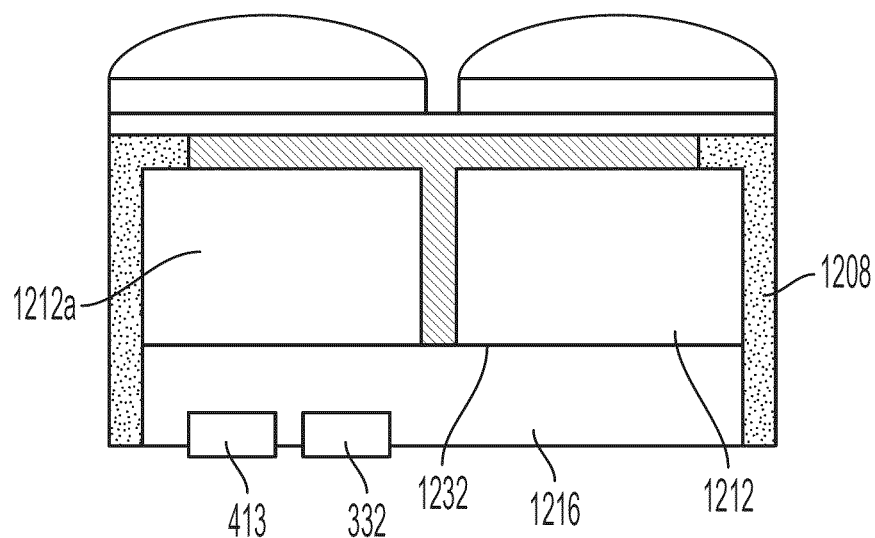
FIG. 13B is a cross section of a portion of the second exemplary embodiment.
Figure 13C:
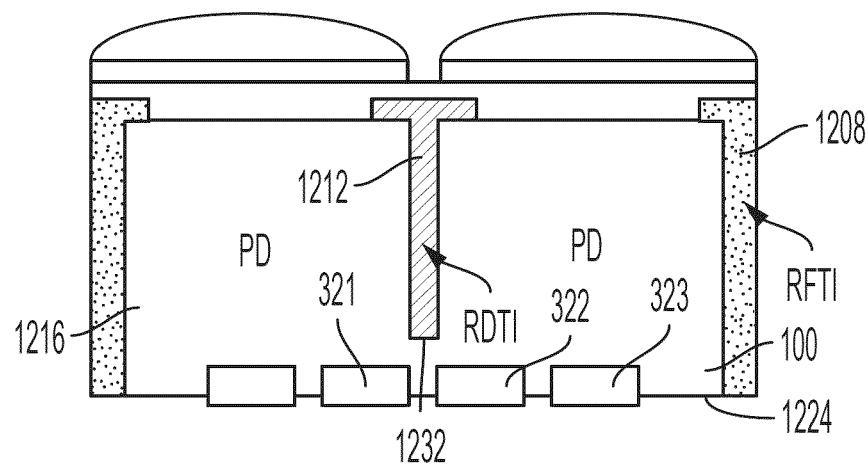
FIG. 13C is a cross section of another portion of the second exemplary embodiment.

FIG. 13A is a plan view of a pixel group 314 configuration 1304 in accordance with a second exemplary embodiment of the present disclosure, FIG. 13B is a cross section of a portion of the second exemplary embodiment taken along line A-A' of FIG. 13A, and FIG. 13C is a cross section of another portion of the second exemplary embodiment taken along line B-B' of FIG. 13A. In this example, groups 314 of unit pixels 310 are defined and are separated from one another by RFTI structures 1208. In addition, an inter-pixel group isolation structure 1210 is provided that includes RFTI 1208 and RDTI 1212 structures. More particularly, RFTI structures 1208 form portions of the boundaries between unit pixels 310 within different columns of unit pixels 310 in the same pixel group 314, and RDTI structures 1212 form the remaining portions of the boundaries between unit pixels 310 within different columns of the unit pixels 310 in the same pixel group 314. RDTI structures 1212 form the boundaries between unit pixels 310 within different rows of unit pixels 310 in the same pixel group 314. Although in this example four pixel groups 314 in a 2×2 array in which each of the pixel groups 314 includes four unit pixels 310 in a 2×2 sub-array or group array pattern are shown, other configurations are possible.

As depicted in FIGS. 13B and 13C, at least portions of various circuit elements can be formed between a second end 1232 of an RDTI structure 1212 and the second surface 1224 of the substrate 1216. For example, as shown in FIG. 13B, at least portions of an amplification transistor 413 and of a pixel group overflow gate transistor 332 can be formed between a second end 1232 of an RDTI structure 1212 that extends between different rows of unit pixels 310 within a pixel group 314. As a further example, and as shown in FIG. 13C, at least portions of a reset transistor 321 and of an amplification transistor 322 can be formed between an end 1232 of an RDTI structure 1212 and the second surface 1224 of the substrate 1216.

With reference again to FIG. 13A, the portion of the inter-pixel group isolation structure 1210b between adjacent columns of unit pixels 310 within a pixel group 314 has a single RDTI structure 1212 portion that intersects the portion of the inter-pixel group isolation structure 1210a that is formed entirely from an RDTI structure 1212. Accordingly, at least a portion of a node 1236 at which the unit pixel transistors 334 are connected to the pixel group transmission transistor 331 and the pixel group overflow gate transistor 332 can be formed in the area where the two RDTI structures 1212 within a pixel group 314 intersect.

Figure 14A:
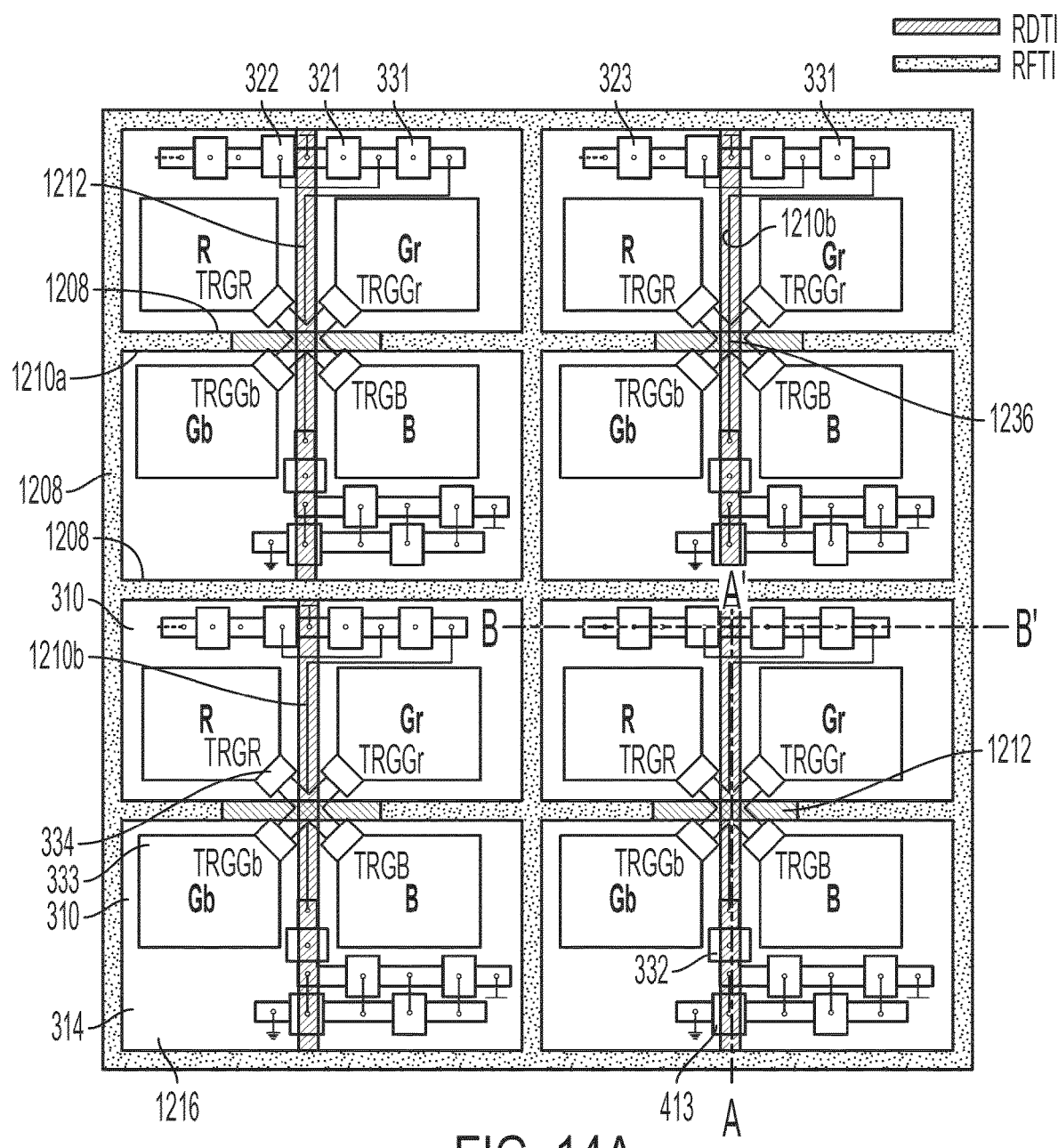
FIG. 14A is a plan view of a pixel configuration in accordance with a third exemplary embodiment of the present disclosure.
Figure 14B:
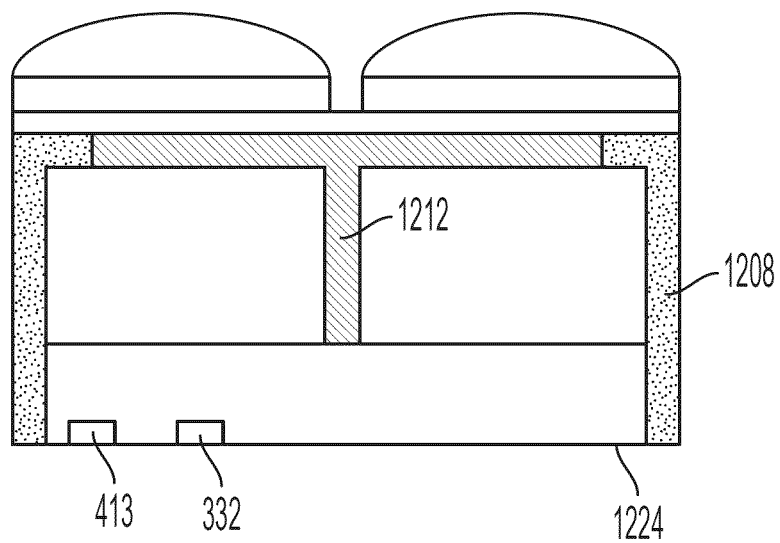
FIG. 14B is a cross section of a portion of the third exemplary embodiment.
Figure 14C:
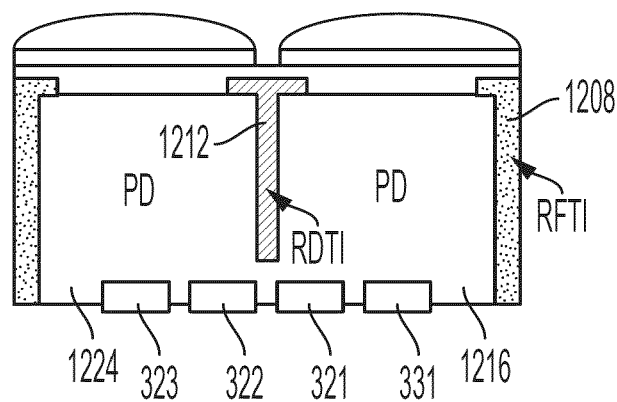
FIG. 14C is a cross section of another portion of the third exemplary embodiment.

FIG. 14A is a plan view of a pixel group 314 configuration 1404 in accordance with a third exemplary embodiment of the present disclosure, FIG. 14B is a cross section of a portion of the third exemplary embodiment taken along line A-A' of FIG. 14A, and FIG. 14C is a cross section of another portion of the third exemplary embodiment taken along line B-B' of FIG. 14A. In this example, groups 314 of unit pixels 310 are defined and are separated from one another by RFTI structures 1208. In addition, an inter-pixel group isolation structure 1210 is provided that includes RFTI 1208 and RDTI 1212 structures. More particularly, the inter-pixel group isolation structure 1210 within a pixel group 314 can include a horizontal portion 1210a that extends between unit pixels 310 in adjacent rows and that includes both RFTI 1208 and RDTI 1212 structures, and a vertical portion 1210b that extends between unit pixels 310 in adjacent columns and that is formed from an RDTI structure 1212. Although in this example four pixel groups 314 in a 2×2 array in which each of the pixel groups 314 includes four unit pixels 310 in a 2×2 sub-array or group array pattern are shown, other configurations are possible.

As depicted in FIGS. 14B and 14C, at least portions of various circuit elements can be formed between a second end 1232 of an RDTI structure 1212 and the second surface 1224 of the substrate 1216. For example, as shown in FIG. 14B, at least portions of an amplification transistor 413 and of an pixel group overflow gate transistor 332 can be formed between a second end 1232 of an RDTI structure 1212 that extends between different columns of unit pixels 310 within a pixel group 314. As a further example, and as shown in FIG. 14C, at least portions of a reset transistor 321 and of an amplification transistor 322 can be formed between an end 1232 of an RDTI structure 1212.

With reference again to FIG. 14A, the portion of the inter-pixel group isolation structure 1210a between adjacent rows of unit pixels 310 within a pixel group 314 has a single RDTI structure 1212 portion that intersects the portion of the inter-pixel group isolation structure 1210b that is formed entirely from an RDTI structure 1212. Accordingly, at least a portion of a node 1236 at which the unit pixel transistors 334 are connected to the pixel group transmission transistor 331 and the pixel group overflow gate transistor 332 can be formed in the area where the two RDTI structures 1212 within a pixel group 314 intersect.

Figure 15A:
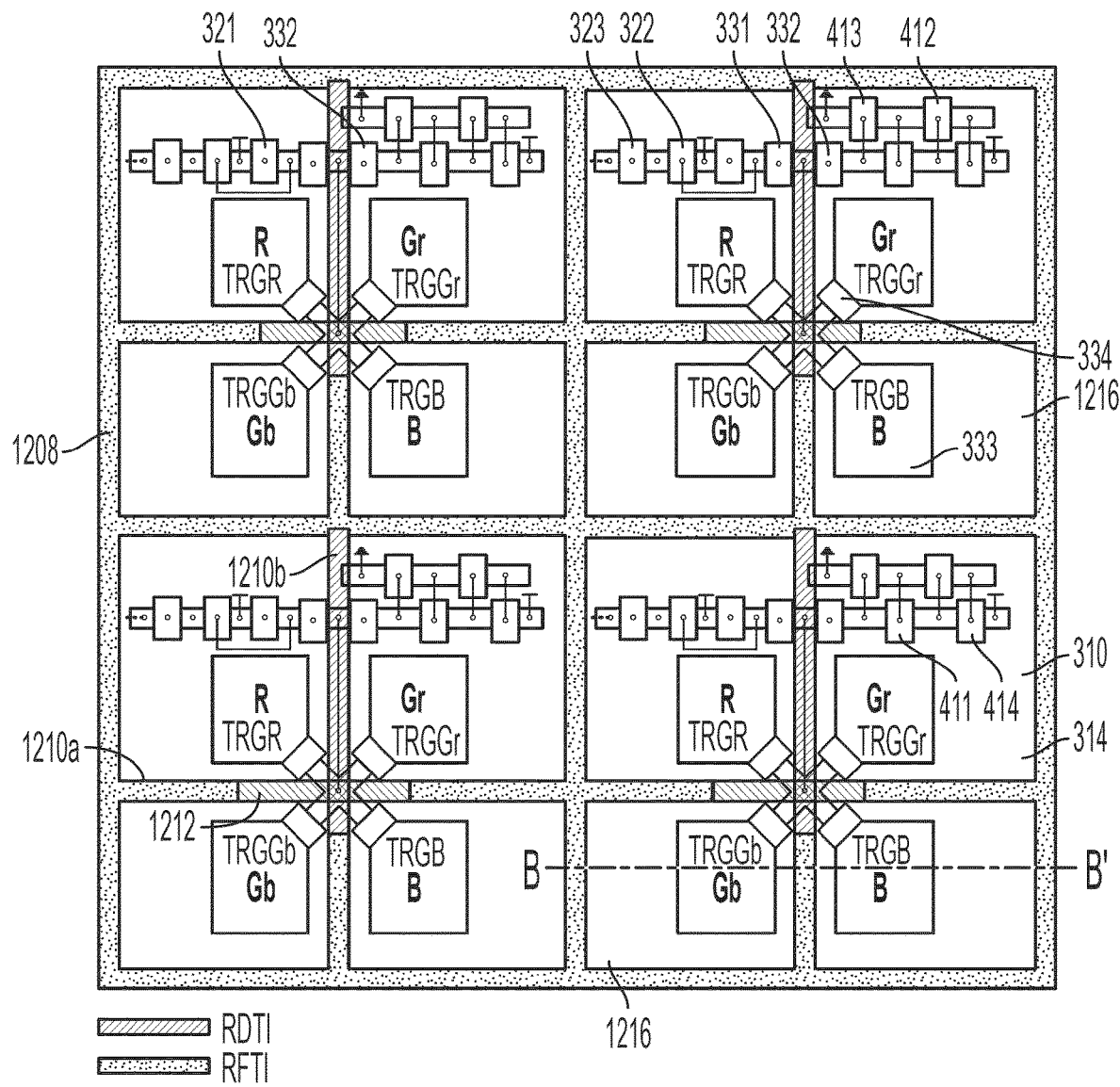
FIG. 15A is a plan view of a pixel configuration in accordance with a fourth exemplary embodiment of the present disclosure.
Figure 15B:
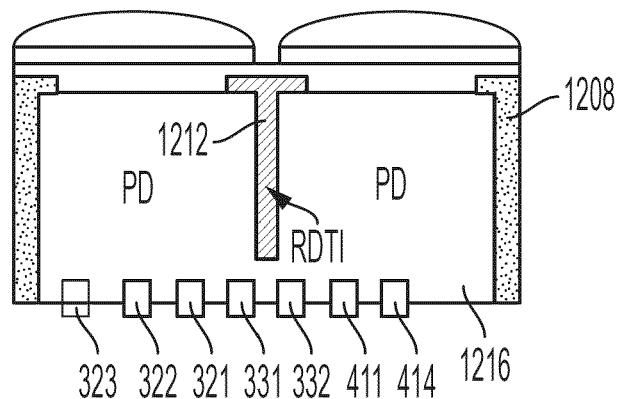
FIG. 15B is a cross section of a portion of the fourth exemplary embodiment.
Figure 15C:
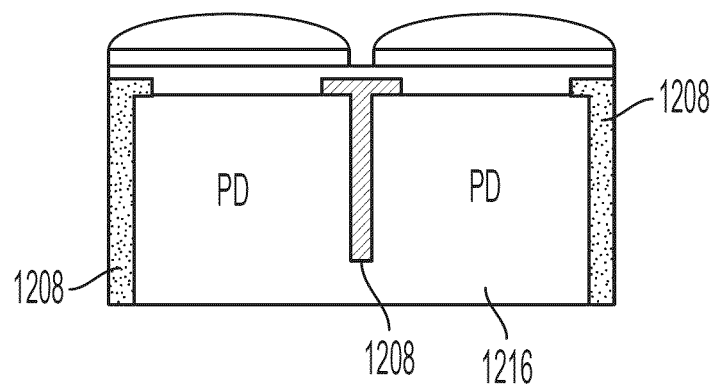
FIG. 15C is a cross section of another portion of the fourth exemplary embodiment.

FIG. 15A is a plan view of a pixel group 314 configuration in accordance with a fourth exemplary embodiment of the present disclosure, FIG. 15B is a cross section of a portion of the fourth exemplary embodiment taken along line A-A' of FIG. 15A, and FIG. 15C is a cross section of another portion of the fourth exemplary embodiment taken along line B-B' of FIG. 15A. In this example, groups 314 of unit pixels 310 are defined and are separated from one another by RFTI structures 1208. In addition, an interpixel group isolation structure 1210 is provided that includes RFTI 1208 and RDTI 1212 structures. More particularly, the inter-pixel group isolation structure 1210 within a pixel group can include a horizontal portion that extends between unit pixels 310 in adjacent rows that includes both RFTI 1208 and RDTI 1212 structures, and a vertical portion 1210*b* that extends between unit pixels 310 in adjacent columns and that includes both RFTI 1208 and RDTI 1212 structures. In the example of FIG. 15A, two segments of RFTI structure 1208 extend horizontally from the RFTI structures 1208 located between pixel groups 314 in different columns of pixel groups 314, one segment of RFTI 1208 extends vertically from the RFTI structure 1208 located along a lower border of the pixel group 314, and one segment of RDTI structure 1212 extends vertically from the RFTI structure 1208 along an upper border of the pixel group 314. In addition, a segment of horizontal RDTI structure 1212 is located between the two segments of horizontal RFTI structures 1208.

As depicted in FIGS. 15A and 15B, at least portions of various circuit elements can be formed between a second end 1232 of an RDTI structure 1212 and the second surface 1224 of the substrate 1216. For example, as shown in FIG. 15B, at least a portion of a drain/source region between the pixel group transmission transistor 331 and the pixel group overflow gate transistor 332, a portion of the pixel group transmission transistor 331, and/or a portion of the pixel group overflow gate transistor 332 can be formed between a second end 1232 of an RDTI structure 1212 that extends between different columns of unit pixels 310 within a pixel group 314. In addition, at least portions of the boundaries between adjacent unit pixels 310 can be separated from one another by portions of an RFTI structure 1208. Accordingly, embodiments of the present disclosure allow for the sharing of pixel group circuit 1100 elements between unit pixels 310 within the same pixel group, while also allowing for isolation between those unit pixels 310.

FIG. 15A also illustrates an example of a pixel group 314 configuration in which shared transistors are located in a single row of unit pixels 310 within each pixel group 314. For example, the selection transistor 323, the amplification transistor 322, the reset transistor 321, the pixel group transmission transistor 331, the OFG transistor 332, the first 411 and second 414 log transistors, and amplification transistors 412 and 413 can all be formed in one of the two rows of unit pixels 310. Moreover, the transistors can all be formed in the row in which an entirety of a division between the adjacent unit pixels 310 of any one pixel group within that row is formed by an RDTI structure 1212.

Figure 16A:
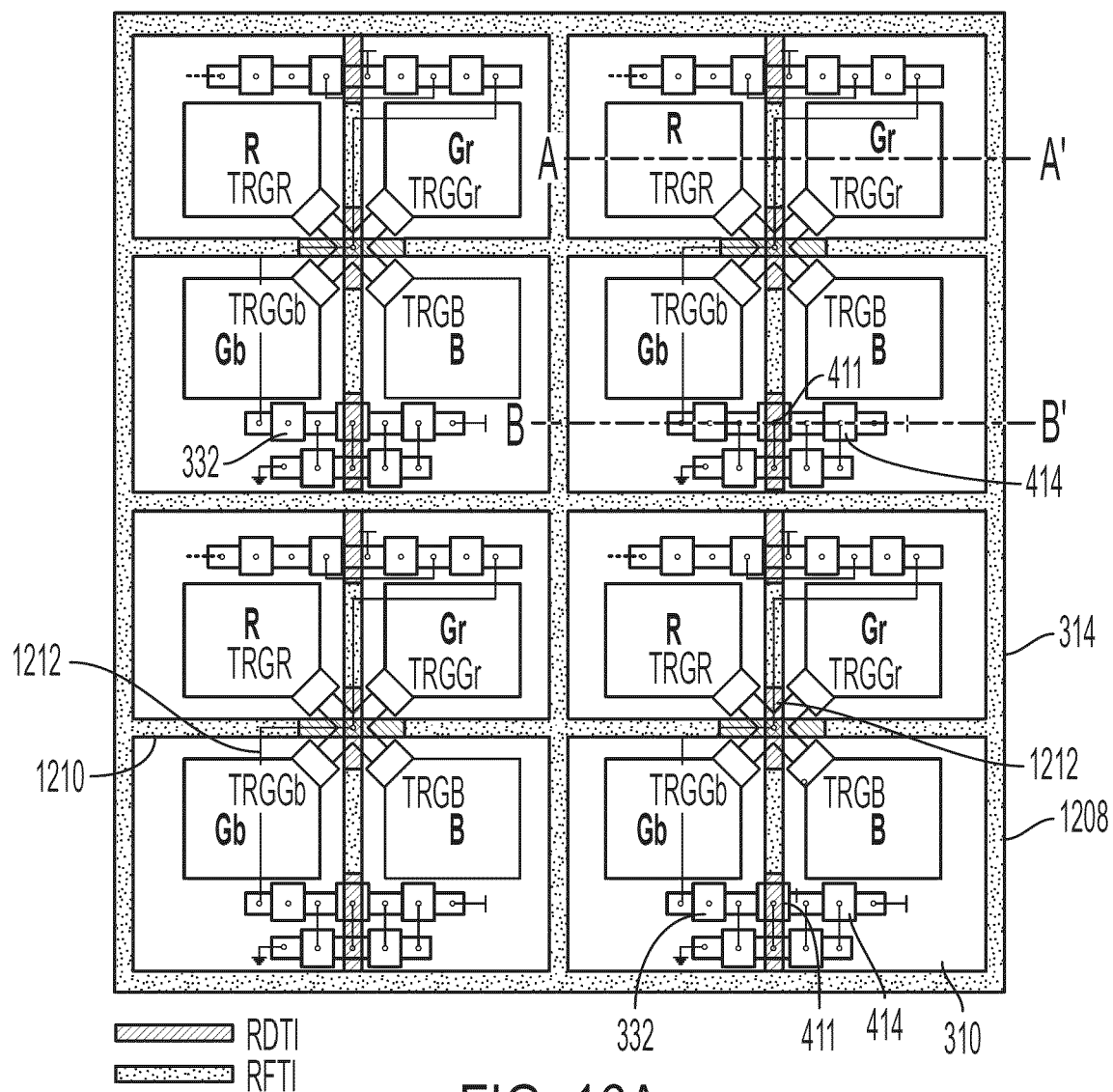
FIG. 16A is a plan view of a pixel configuration in accordance with a fifth exemplary embodiment of the present disclosure.
Figure 16B:
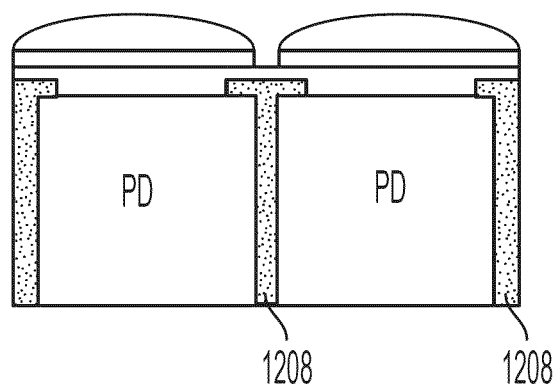
FIG. 16B is a cross section of a portion of the fifth exemplary embodiment.
Figure 16C:
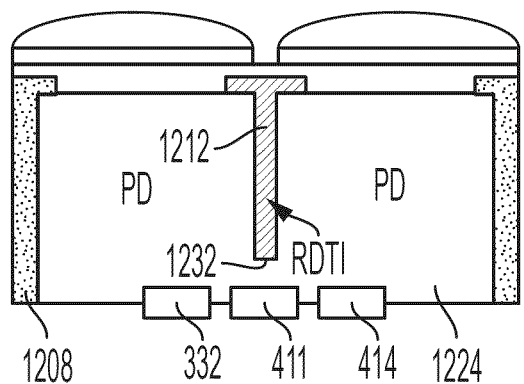
FIG. 16C is a cross section of another portion of the fifth exemplary embodiment.

FIG. 16A is a plan view of a pixel configuration in accordance with a fifth exemplary embodiment of the present disclosure, FIG. 16B is a cross section of a portion of the fifth exemplary embodiment taken along line A-A' in FIG. 16A, and FIG. 16C is a cross section of another portion of the fifth exemplary embodiment taken along line B-B' in FIG. 16A. In this example, groups 314 of unit pixels 310 are defined and are separated from one another by RFTI structures 1208. In addition, an interpixel group isolation structure 1210 is provided that includes RFTI 1208 and RDTI 1212 structures. More particularly, the inter-pixel group isolation structure 1210 within a pixel group 314 can include a horizontal portion that extends between unit pixels 310 in adjacent rows that includes both RFTI 1208 and RDTI 1212 structures, and a vertical portion 1210*b* that extends between unit pixels 310 in adjacent columns and that includes both RFTI 1208 and RDTI 1212 structures. In the example of FIG. 16A, two segments of RFTI structure 1208 extend horizontally from the RFTI structures 1208 between pixel groups 314 in different columns of pixel groups 314, and one segment of RDTI structure 1212 extends horizontally between the two horizontal segments of RFTI structures 1208. Two segments of RDTI structures 1212 extend vertically from the RFTI structures 1208 at the top and bottom of the pixel group 314, with one vertical segment of RFTI structure 1208 extending from the vertical RDTI structures 1212. Each vertical segment of RFTI structure 1208 within the pixel group 314 is separated from one another by a vertical segment of RDTI structure 1212 at a middle area of the pixel group 314. The vertical segment of RDTI structure 1212 also intersects the horizontal segment of RDTI structure 1212 at the middle area of the pixel group.

As depicted in FIGS. 16B and 16C, isolation between adjacent unit pixels 310 is provided, while also allowing at least portions of various circuit elements to be formed between a second end 1232 of an RDTI structure 1212 and the second surface 1224 of the substrate 1216. For example, as shown in FIG. 16B, an RFTI structure 1208 extends between at least some of a shared border between adjacent unit pixels 314. As shown in FIG. 16C, at least a portion of a log transistor 411 can be formed between a second end 1232 of an RDTI structure 1212 that extends between different columns of unit pixels 310 within a pixel group 314. Accordingly, embodiments of the present disclosure allow for the sharing of pixel group circuit 1100 elements between unit pixels 310 within the same pixel group, while also allowing for isolation between those unit pixels 310.

Figure 17A:
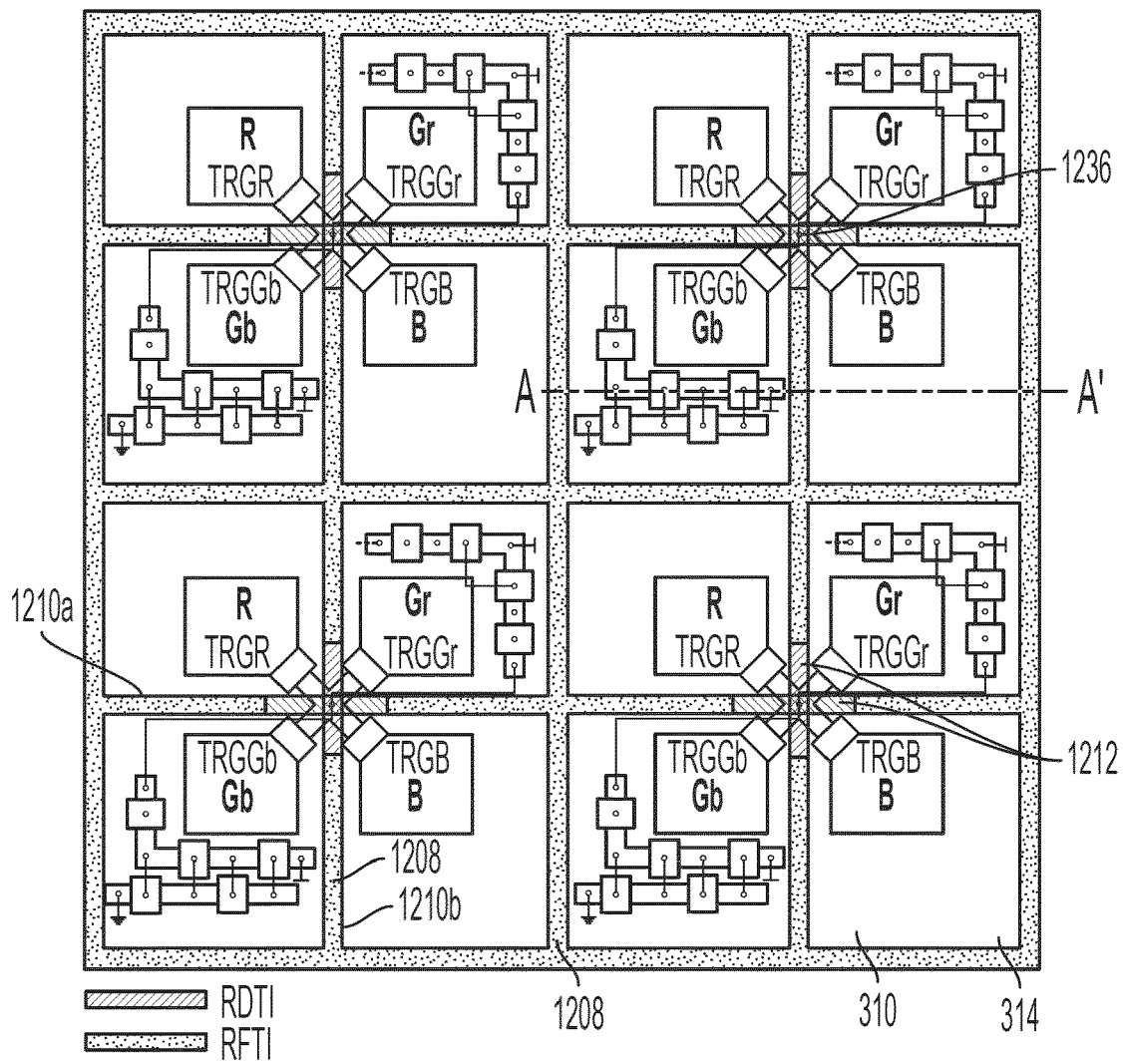
FIG. 17A is a plan view of a pixel configuration in accordance with a sixth exemplary embodiment of the present disclosure.
Figure 17B:
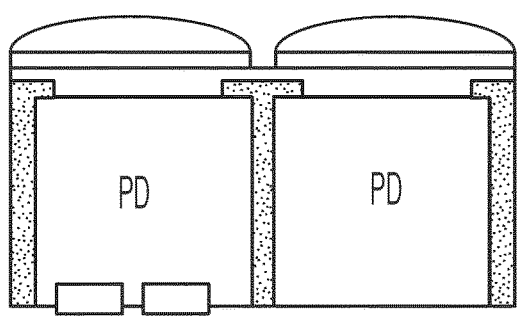
FIG. 17B is a cross section of a portion of the sixth exemplary embodiment.

FIG. 17A is a plan view of a pixel configuration in accordance with a sixth exemplary embodiment of the present disclosure, and FIG. 17B is a cross section of a portion of the sixth exemplary embodiment taken along line A-A' in FIG. 17A. In this example, groups 314 of unit pixels 310 are defined and are separated from one another by RFTI structures 1208. In addition, an interpixel group isolation structure 1210 is provided that includes RFTI 1208 and RDTI 1212 structures. More particularly, the inter-pixel group isolation structure 1210 within a pixel group 314 can include a horizontal portion 1210*a* that extends between unit pixels 310 in adjacent rows that includes both RFTI 1208 and RDTI 1212 structures, and a vertical portion 1210*b* that extends between unit pixels 310 in adjacent columns and that includes both RFTI 1208 and RDTI 1212 structures. In the example of FIG. 17A, two segments of RFTI structure 1208 extend horizontally from the RFTI structures 1208 between pixel groups 314 in different columns of pixel groups 314, and one segment of RDTI structure 1212 extends horizontally between the two horizontal segments of RFTI structures 1208. In addition, two segments of RFTI structure 1208 extend vertically from the RFTI structures 1208 at the top and bottom of the pixel group 314, with one vertical segment of RDTI structure 1212 extending vertically between the two segments of RFTI structure 1208. The vertical segment of RDTI structure 1212 also intersects the horizontal segment of RDTI structure 1212 at the middle area of the pixel group.

As depicted in FIGS. 17A and 17B, isolation between adjacent unit pixels 310 is provided. In particular, an RFTI structure 1208 extends between at least some of a shared border between adjacent unit pixels 310. Isolation between adjacent unit pixels 310 in a center area of the pixel group 314 is provided by RDTI structures 1212, enabling at least a portion of a node 1236 at which the unit pixel transistors 334 are connected to the pixel group transmission transistor 331 and the pixel group overflow gate transistor 332 to be formed in the area where the two RDTI structures 1212 within a pixel group 314 intersect. Accordingly, embodiments of the present disclosure allow for the sharing of pixel group circuit 1100 elements between unit pixels 310 within the same pixel group, while also allowing for isolation between those unit pixels 310.

Figure 18A:
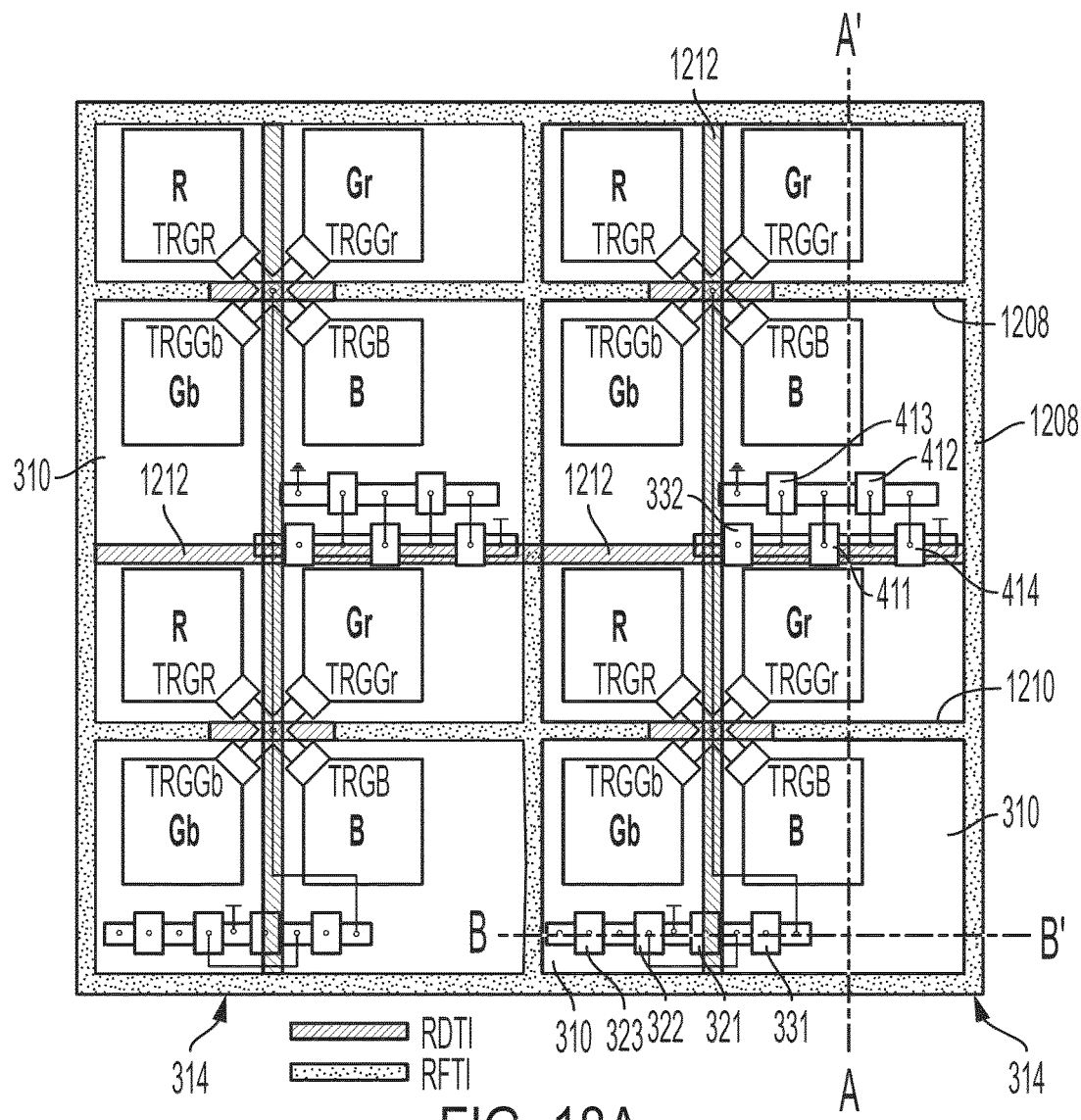
FIG. 18A is a plan view of a pixel configuration in accordance with a seventh exemplary embodiment of the present disclosure.
Figure 18B:
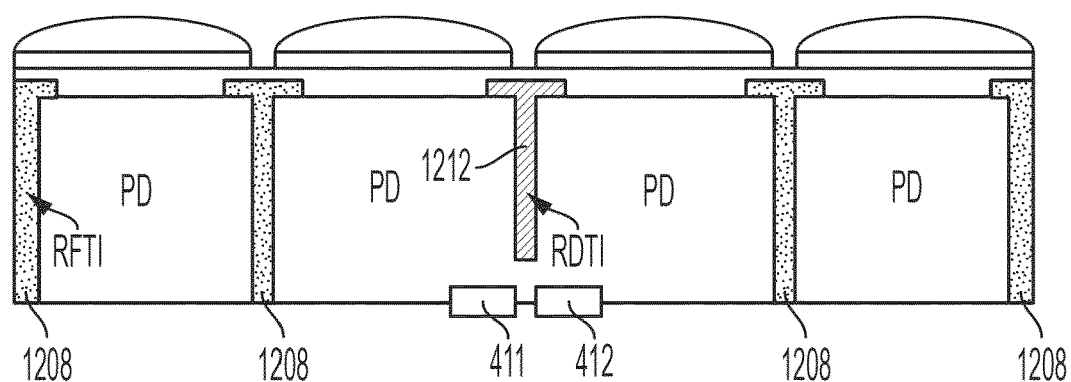
FIG. 18B is a cross section of a portion of the seventh exemplary embodiment.
Figure 18C:
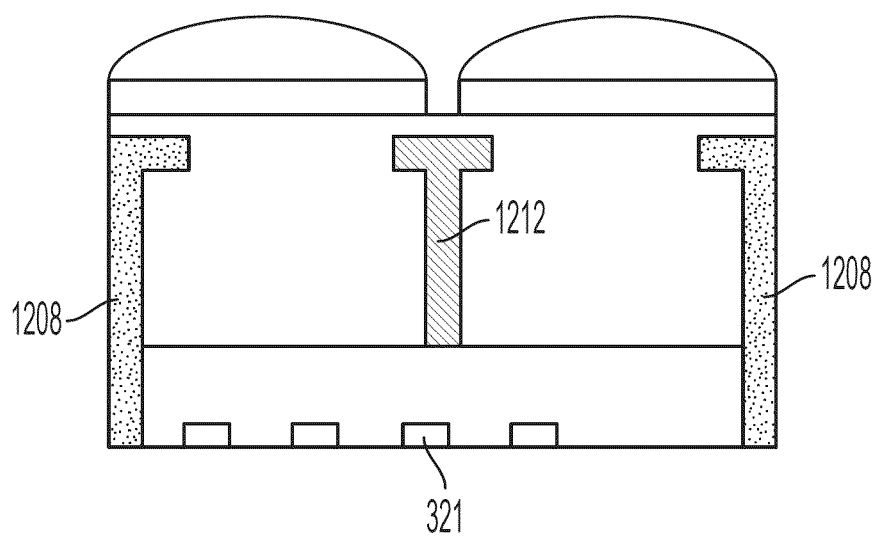
FIG. 18C is a cross section of another portion of the seventh exemplary embodiment.

FIG. 18A is a plan view of a pixel configuration in accordance with a seventh exemplary embodiment of the present disclosure, FIG. 18B is a cross section of a portion of the seventh exemplary embodiment taken along line A-A' in FIG. 18A, and FIG. 18C is a cross section of a portion of the seventh exemplary embodiment taken along line B-B' in FIG. 18A. In this embodiment, each pixel group 314 includes eight unit pixels 310, with the unit pixels 310 disposed in four rows and two columns. In addition, the eight unit pixels 310 within a pixel group 314 share at least some circuit elements. A mix of separation structures 1210 are applied to provide isolation between adjacent unit pixels 310. In particular, the separation between the first and second rows of unit pixels 310 and between the third and fourth rows of unit pixels 310 is provided by two horizontal RFTI structures 1208 that extend from vertical isolation structures 1208 on either side of the pixel group 314, with a horizontal RDTI structure 1212 extending between the two horizontal RFTI structures 1208 in each case. The separation between the second and third rows of unit pixels 310 is provided entirely by an RDTI structure 1212. The separation between the first and second columns of unit pixels 310 is provided entirely by an RDTI structure 1212.

As shown in FIGS. 18A, 18B, and 18C, isolation between adjacent unit pixels 310 within a pixel group 314 is provided by a mix of RFTI 1208 and RDTI 1212 structures. In addition, circuit elements are shared between unit pixels, and at least portions of various circuit elements can be formed in areas of the substrate 1216 that are at least partially located between an end 1228 of an RDTI structure 1212 and a surface 1224 of the substrate 1216. For example, at least portions of two log transistors 411 and 414 can be formed between an end of an RDTI structure 1212 and a second surface 1224 of the substrate 1216, and at least a portion of a reset transistor 321 can be formed between an end of an RDTI structure 1212 and the second surface 1224 of the substrate 1216. Accordingly, isolation is provided, while making more area available for photoelectric conversion elements 333 as compared to prior configurations.

Figure 19A:
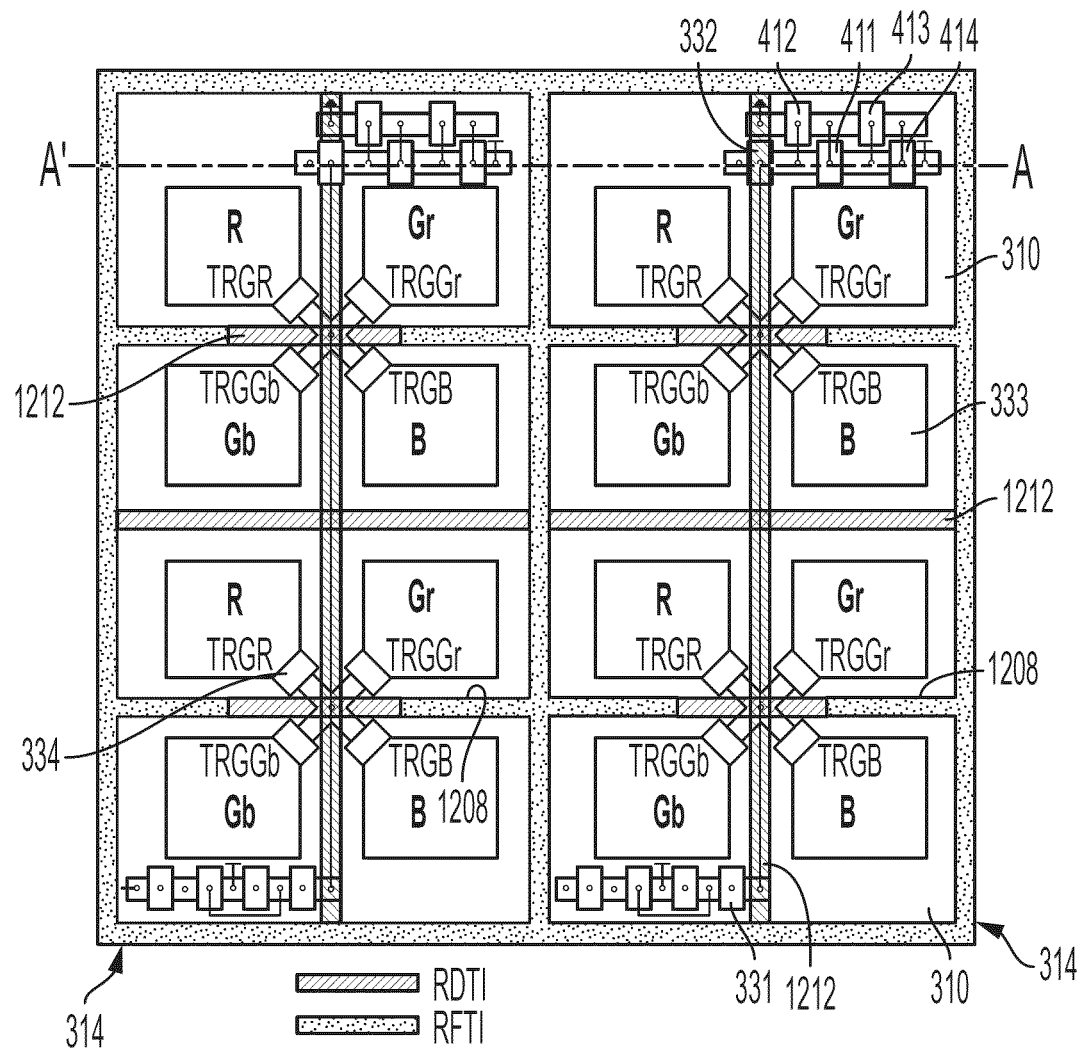
FIG. 19A is a plan view of a pixel configuration in accordance with an eighth exemplary embodiment of the present disclosure.
Figure 19B:
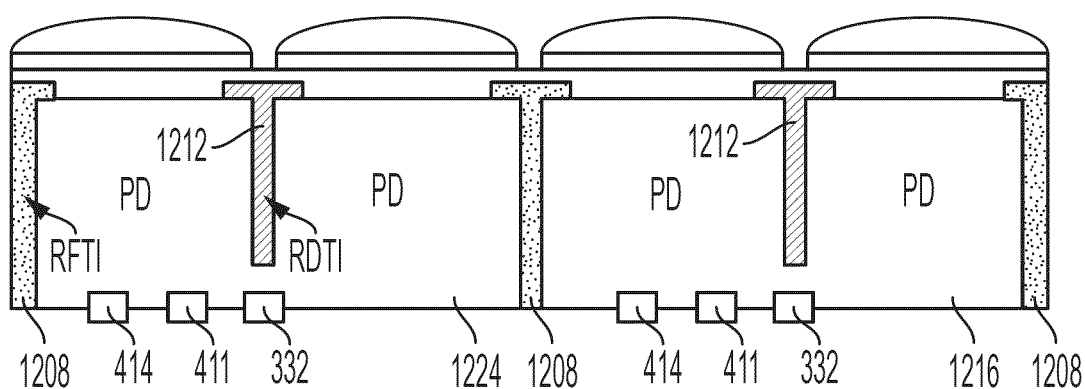
FIG. 19B is a cross section of a portion of the eighth exemplary embodiment.

FIG. 19A is a plan view of a pixel configuration in accordance with an eighth exemplary embodiment of the present disclosure, and FIG. 19B is a cross section of a portion of the eighth exemplary embodiment taken along line A-A' in FIG. 19A. In this embodiment, each pixel group 314 includes eight unit pixels 310, with the unit pixels 310 disposed in four rows and two columns. In addition, the eight unit pixels 310 within a pixel group 314 share at least some circuit elements. A mix of RFTI 1208 and RDTI 1212 separation structures are applied to provide isolation between adjacent unit pixels 310. In particular, the separation between the first and second rows of unit pixels 310 and between the third and fourth rows of unit pixels 310 is provided by two horizontal RFTI structures 1208 that extend from vertical isolation structures 1208 on either side of the pixel group 314, with a horizontal RDTI structure 1212 extending between the two horizontal RFTI structures 1208 in each case. The separation between the second and third rows of unit pixels 310 is provided entirely by an RDTI structure 1212. The separation between the first and second columns of unit pixels 310 is provided entirely by an RDTI structure 1212. Accordingly, the disposition of separation structures is similar to that of the seventh embodiment. However, there are differences in the locations of elements of the shared circuit between the seventh and eighth example embodiments.

As shown in FIGS. 19A and 19B, isolation between adjacent unit pixels 310 within a pixel group 314 is provided by a mix of RFTI 1208 and RDTI 1212 structures. In addition, circuit elements are shared between unit pixels, and at least portions of various circuit elements can be formed in areas of the substrate 1216 that are at least partially located between an end 1228 of an RDTI structure 1212 and a surface 1224 of the substrate 1216. For example, at least portions of the pixel group overflow gate transistor 332 can be at least partially formed in an area between a second end 1228 of an RDTI structure 1212 and a second surface 1224 of the substrate 1216. Accordingly, isolation is provided, while making more area available for photoelectric conversion elements 333 as compared to prior configurations.

Figure 20A:
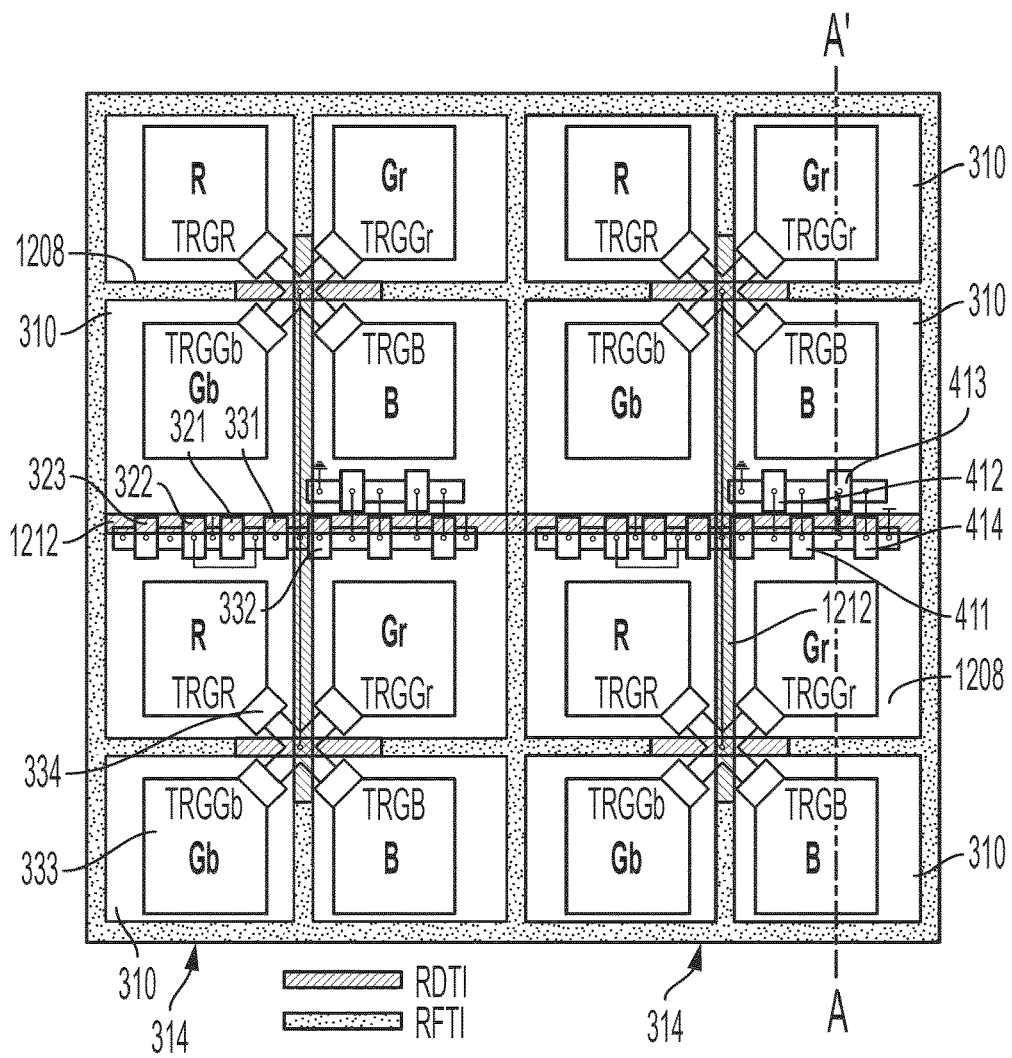
FIG. 20A is a plan view of a pixel configuration in accordance with a ninth exemplary embodiment of the present disclosure.
Figure 20B:
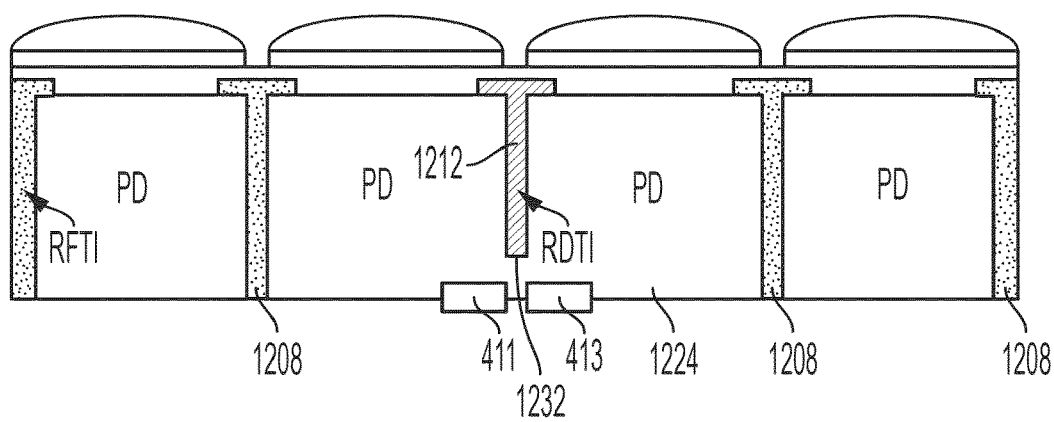
FIG. 20B is a cross section of a portion of the ninth exemplary embodiment.

FIG. 20A is a plan view of a pixel configuration in accordance with a ninth exemplary embodiment of the present disclosure, and FIG. 20B is a cross section of a portion of the ninth exemplary embodiment taken along line A-A' in FIG. 20A. In this embodiment, each pixel group 314 includes eight unit pixels 310, with the unit pixels 310 disposed in four rows and two columns. In addition, the eight unit pixels 310 within a pixel group 314 share at least some circuit elements. A mix of RFTI 1208 and RDTI 1212 separation structures are applied to provide isolation between adjacent unit pixels 310. In particular, the separation between the first and second rows of unit pixels 310 and between the third and fourth rows of unit pixels 310 is provided by two horizontal RFTI structures 1208 that extend from vertical isolation structures 1208 on either side of the pixel group 314, with a horizontal RDTI structure 1212 extending between the two horizontal RFTI structures 1208 in each case. The separation between the second and third rows of unit pixels 310 is provided entirely by an RDTI structure 1212. The separation between the first and second columns of unit pixels 310 is provided by two vertical RFTI structures that extend from horizontal isolation structures 1208 at the top and bottom boundaries of the pixel group 314 for a distance that is less than an entire vertical extent of a top row and a bottom row of unit pixels 310 respectively, and an RDTI structure 1212 that extends vertically between the two vertical RFTI structures 1208. Accordingly, the disposition of separation structures is similar to that of the seventh and eight embodiments. However, there are differences in the locations of elements of the shared circuit between this ninth example embodiment and the seventh and eighth example embodiments.

As shown in FIGS. 20A and 20B, isolation between adjacent unit pixels 310 within a pixel group 314 is provided by a mix of RFTI 1208 and RDTI 1212 structures. In addition, circuit elements are shared between unit pixels, and at least portions of various circuit elements can be formed in areas of the substrate 1216 that are at least partially located between an end 1232 of an RDTI structure 1212 and a surface 1224 of the substrate 1216. For example, at least portions of some or all of the select 323, amplification 322, reset 321, transfer gate 331, overflow gate 332, first and second log 411 and 414, and first and second amplification 412 and 413 transistors can be at least partially formed in an area between a second end 1228 of an RDTI structure 1212 and a second surface 1224 of the substrate 1216. Accordingly, isolation is provided, while making more area available for photoelectric conversion elements 333 as compared to prior configurations.

Figure 21A:
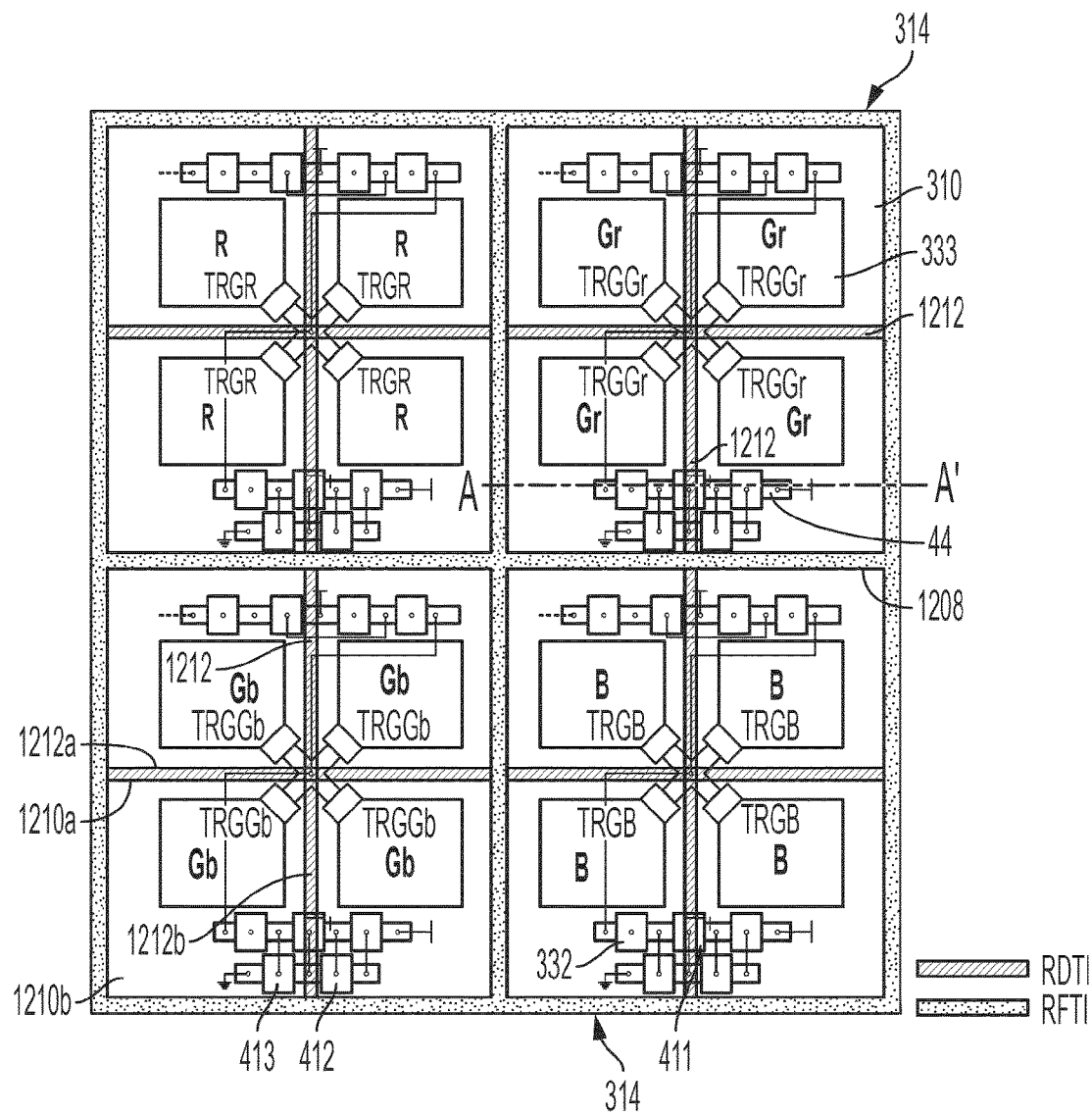
FIG. 21A is a plan view of a pixel configuration in accordance with a tenth exemplary embodiment of the present disclosure.
Figure 21B:
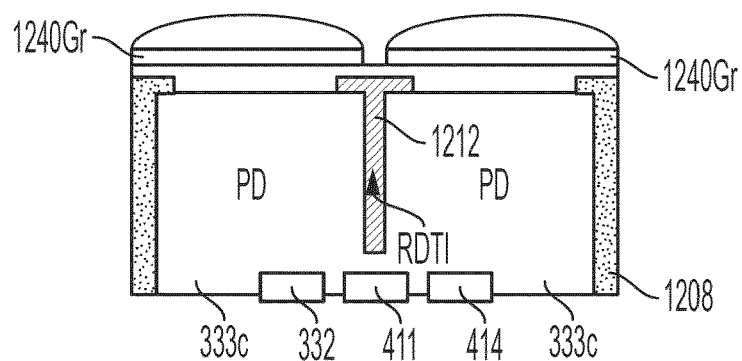
FIG. 21B is a cross section of a portion of the tenth exemplary embodiment.

FIG. 21A is a plan view of a portion of a pixel array unit 300, and FIG. 21B is a cross section taken along line A-A' in FIG. 21A, illustrating a pixel group 314 configuration 1204 in accordance with a tenth exemplary embodiment of the present disclosure. This embodiment is similar to the first example embodiment, except that each pixel group 314 includes pixels 310 that are sensitive to the same color. As in the first example, and has can be applied to other embodiments of the present disclosure, the groups 314 of unit pixels 310 are defined and are separated from one another by full thickness dielectric trench isolation (RFTI) structures 1208. Within each pixel group 314, unit pixels 310 are separated from one another by an inter-pixel group isolation structure 1210 in the form of deep trench isolation (RDTI) structures 1212. The inter pixel group isolation structure 1210 within a pixel group 314 can include a horizontal portion 1210a that extends between unit pixels 310 in adjacent rows, and a vertical portion 1210b that extends between unit pixels 310 in adjacent columns. More particularly, the pixel configuration 1204 features RDTI structures 1212 along the entire extent of the boundaries between adjacent unit pixels 310 within each pixel group 314, with a first RDTI structure 1212a extending between adjacent rows of unit pixels 310 within each pixel group 314, and a second RDTI structure 1212b extending between adjacent columns of unit pixels 310 within each pixel group 314.

As illustrated in FIG. 21B, each unit pixel 310 within the same pixel group 314 includes a color filter 1240 of the same color. In addition, as illustrated in FIG. 21A, the pixel groups 314 can be arrayed so that the pixel array unit 300 is configured as a Bayer or other imaging sensor pattern on a pixel group 314 basis, rather than on a per unit pixel 310 basis.

As shown in FIGS. 21A and 21B, isolation between adjacent unit pixels 310 within a pixel group 314 is provided by RDTI 1212 structures. In addition, circuit elements are shared between unit pixels, and at least portions of various circuit elements can be formed in areas of the substrate 1216 that are at least partially located between an end 1228 of an RDTI structure 1212 and a surface 1224 of the substrate 1216. For example, at least a portion of a log transistor 414 of the address event detection readout circuit 400 for the pixel group circuit 1100 can be formed between the second end 1232 of an RDTI structure 1212 and the second surface 1224 of the substrate 1216. As a further example, at least a portion of a drain/source region of amplification transistors 412 and 413 can be formed in an area between the second end 1232 of an RDTI structure 1212 and the second surface 1224 of the substrate 1216. As still another example, at least a portion of a node 1236 at which the unit pixel transistors 334 are connected to the pixel group transmission transistor 331 and the pixel group overflow gate transistor 332 can be formed between the second ends 1232 of two intersecting RDTI structures 1212 and the second surface 1224 of the substrate 1216.

Figure 22A:
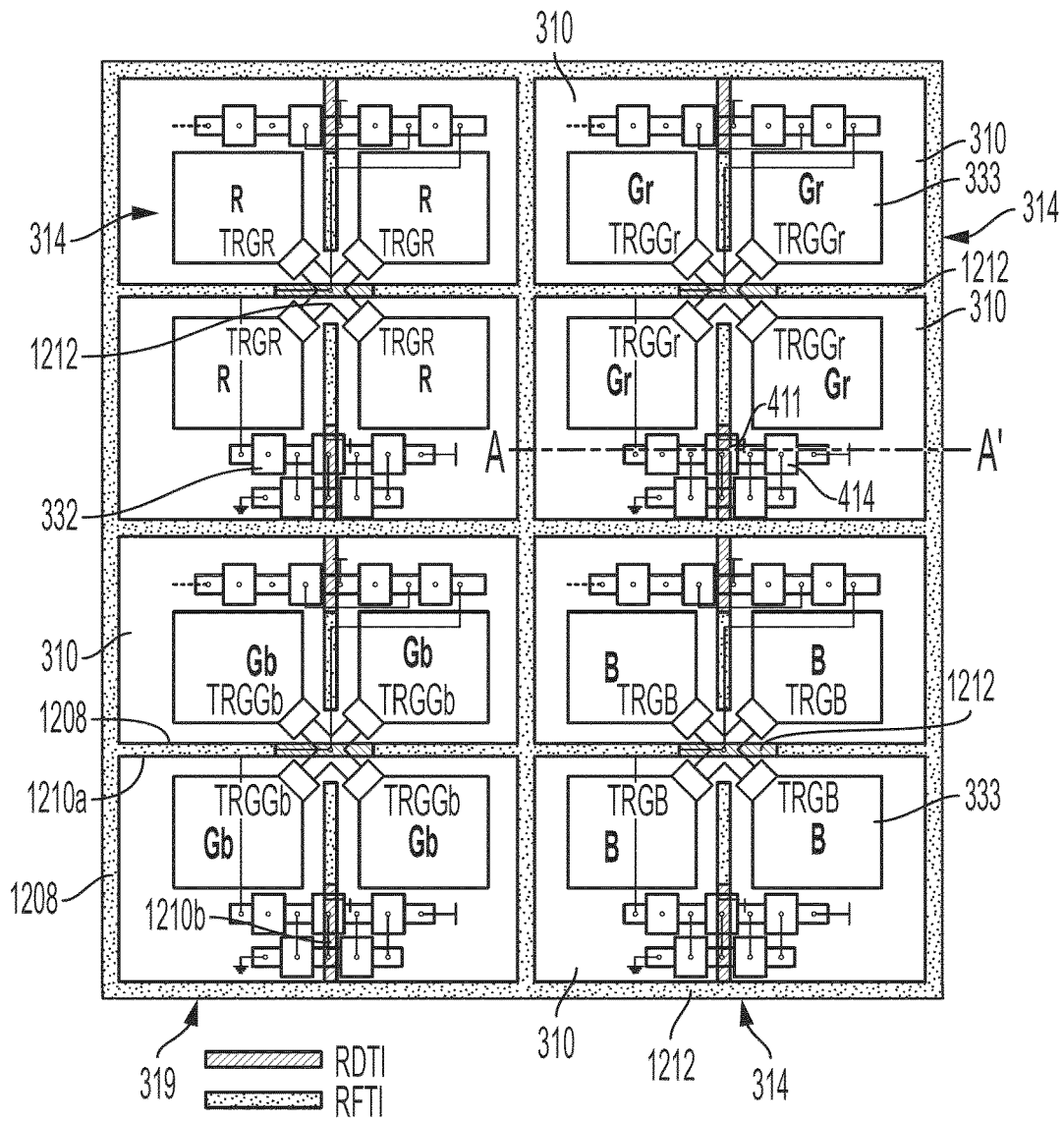
FIG. 22A is a plan view of a pixel configuration in accordance with an eleventh exemplary embodiment of the present disclosure.
Figure 22B:
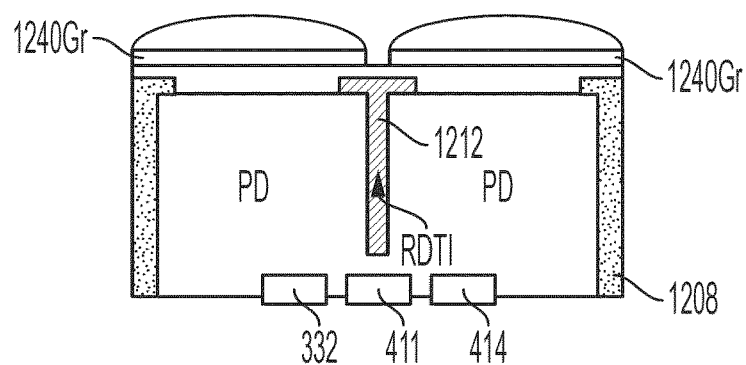
FIG. 22B is a cross section of a portion of the eleventh exemplary embodiment.

FIG. 22A is a plan view of a pixel configuration in accordance with an eleventh exemplary embodiment of the present disclosure, and FIG. 22B is a cross section of a portion of the eleventh exemplary embodiment taken along line A-A'. This embodiment is similar to the fifth example embodiment, except that each pixel group 314 includes pixels 310 that are sensitive to the same color. Accordingly, in this example, groups 314 of unit pixels 310 are defined and are separated from one another by RFTI structures 1208.

In addition, an interpixel group isolation structure 1210 is provided that includes RFTI 1208 and RDTI 1212 structures. More particularly, the inter-pixel group isolation structure 1210 within a pixel group 314 can include a horizontal portion that extends between unit pixels 310 in adjacent rows that includes both RFTI 1208 and RDTI 1212 structures, and a vertical portion 1210b that extends between unit pixels 310 in adjacent columns and that includes both RFTI 1208 and RDTI 1212 structures. In the example of FIG. 22A, two segments of RFTI structure 1208 extend horizontally from the RFTI structures 1208 between pixel groups 314 in different columns of pixel groups 314, and one segment of RDTI structure 1212 extends horizontally between the two horizontal segments of RFTI structures 1208. Two segments of RDTI structures 1212 extend vertically from the RFTI structures 1208 at the top and bottom of the pixel group 314, with one vertical segment of RFTI structure 1208 extending from the vertical RDTI structures 1212. Each vertical segment of RFTI structure 1208 within the pixel group 314 is separated from one another by a vertical segment of RDTI structure 1212 at a middle area of the pixel group 314. The vertical segment of RDTI structure 1212 also intersects the horizontal segment of RDTI structure 1212 at the middle area of the pixel group.

As depicted in FIGS. 22A and 22B, isolation between adjacent unit pixels 310 is provided, while also allowing at least portions of various circuit elements to be formed between a second end 1232 of an RDTI structure 1212 and the second surface 1224 of the substrate 1216. For example, as shown in FIG. 22B, at least a portion of a log transistor 411 can be formed between a second end 1232 of an RDTI structure 1212 that extends between different columns of unit pixels 310 within a pixel group 314. Accordingly, embodiments of the present disclosure allow for the sharing of pixel group circuit 1100 elements between unit pixels 310 within the same pixel group, while also allowing for isolation between those unit pixels 310.

Figure 23:
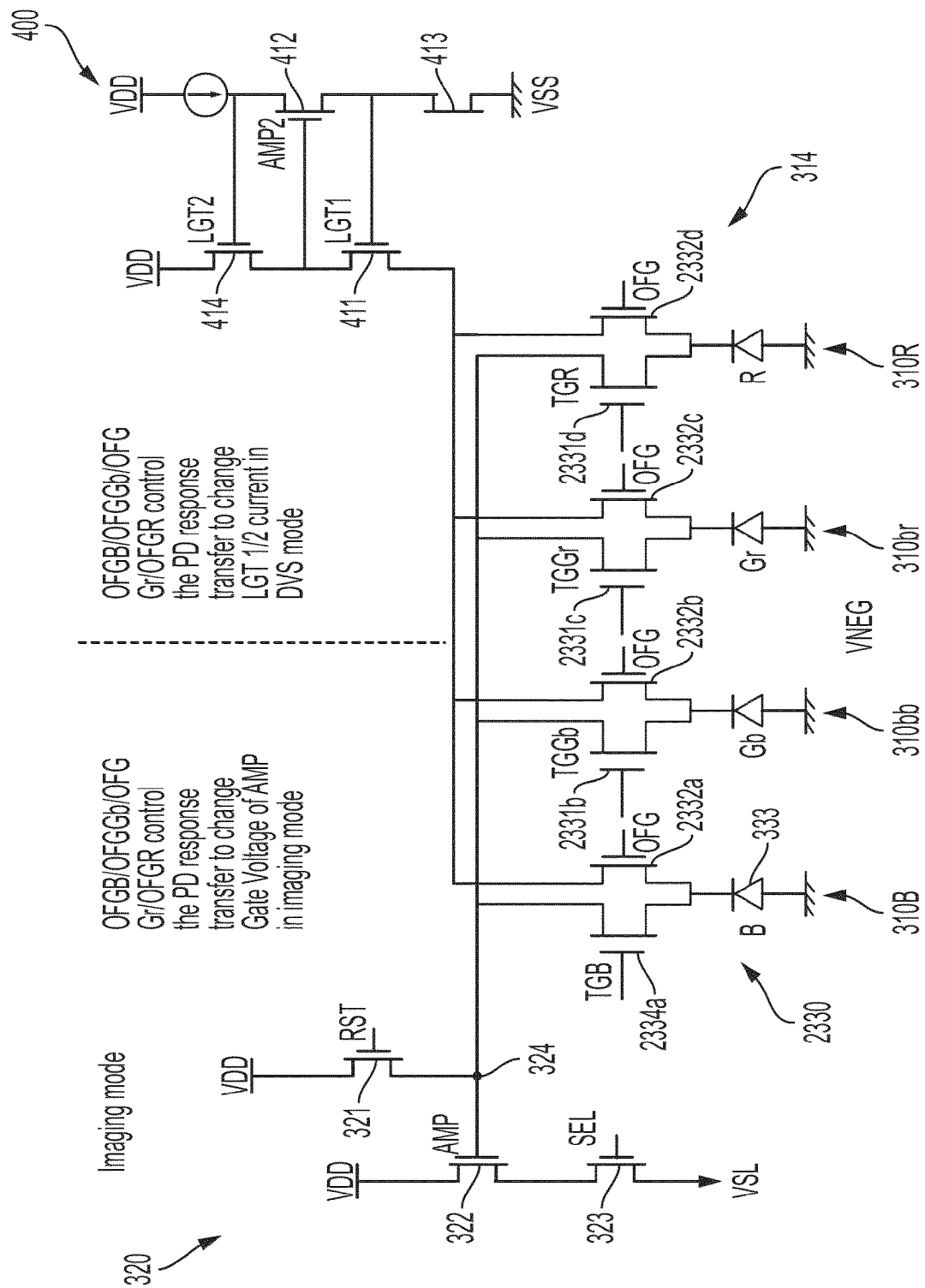
FIG. 23 is a circuit diagram illustrating a schematic configuration example of a unit pixel in accordance with at least some embodiments of the present disclosure.

FIG. 23 is a circuit diagram illustrating a schematic configuration example of a pixel group circuit 2300 for a group 314 of unit pixels 310 in accordance with at least some embodiments of the present disclosure. More particularly, FIG. 23 illustrates a pixel group circuit 2300 in which the photoelectric conversion units 333 of all of the unit pixels 310 included in a group 314 of unit pixels 310 share elements of the circuit 2300. In this example, the unit pixels 310 are part of a pixel group 314 comprising a basic Bayer array pattern 310A, with a first unit pixel 310R associated with a red color filter, a second unit pixel 310Gb associated with a green color filter, a third unit pixel 310Gr associated with a green color filter, and a fourth unit pixel 310B associated with a blue color filter. Accordingly, this example includes a group 314 of four unit pixels 310. However, other arrangements and configurations are possible.

The pixel group circuit 2300 generally includes a light receiving unit 2330 having a plurality of photoelectric conversion units 333. As an example, but without limitation, the photoelectric conversion units 333 can include photodiodes. In this example, one photoelectric conversion unit 333 is included in each unit pixel 310, although other configurations are possible. The pixel group circuit 2300 also includes a pixel imaging signal generation readout circuit 320 and an address event detection readout circuit 400. The pixel imaging signal generation readout circuit 320 and the address event detection readout circuit 400 can be configured in the same way as or similarly to the readout circuits 320 and 400 of FIGS. 5 and 11.

The pixel group circuit 2300 differs from the pixel group circuit 1100 of FIG. 11 in that the pixel group circuit 2300 eliminates the pixel group transmission transistor 331 and the pixel group overflow gate transistor 332. Instead, the pixel group circuit 2300 includes a light receiving unit 2330 having a unit pixel transmission transistor 2331 and a unit pixel overflow gate transistor 2332 for each photoelectric conversion unit 333 of each unit pixel 310 within the pixel group 314. According to this arrangement, each photoelectric conversion unit 333 of each unit pixel 310 can be selectively connected to the imaging signal generation readout circuit 320 through operation of a selected pixel's unit pixel transmission transistor 2331, and to the address event detection readout circuit 400 through operation of the selected pixel's unit pixel overflow gate transistor 2332.

In an imaging mode, the unit pixel transmission transistor 2331 associated with each selected photoelectric conversion unit 333 is placed in a conductive state in order to operatively connect the selected photoelectric conversion unit 333 to the floating diffusion 324 of the pixel imaging signal generation readout circuit 320. In an event detection or dynamic vision sensor (DVS) mode, the unit pixel overflow gate transistor 2332 associated with each selected photoelectric conversion unit 333 is placed in a conductive state in order to operatively connect the selected photoelectric conversion unit 333 to the address event detection readout circuit 400. In a typical operating condition, in the imaging mode a single one of the photoelectric conversion units 333 is operable at any one time to provide a signal to the pixel imaging signal generation readout circuit 320, while in a DVS mode one, some, or all of the photoelectric conversion units 333 are operable at any one time to provide a signal to the address event detection readout circuit 400.

Although charge from a single photoelectric conversion unit 333 is passed to the pixel imaging signal generation readout circuit 320 in a typical imaging operation, other modes in which signals from multiple photoelectric conversion units 333, corresponding to multiple unit pixels 310 are passed to the pixel imaging signal generation readout circuit 320 are possible. As can be appreciated by one of skill in the art after consideration of the present disclosure, the unit pixel overflow gate transistors 332 remain closed during an imaging operation, and the unit pixel transmission transistors 2331 remain closed during an event detection mode. As can further be appreciated by one of skill in the art after consideration of the present disclosure, the operation of the pixel image signal generation circuit 320 can be triggered by the detection of an event by the address event detection readout circuit 400 for the pixel group 314.

Accordingly, the circuit configuration 2300 of FIG. 23 is an example of an arrangement in which a plurality of unit pixels 310 of an imaging device 100 are capable of performing both event detection and imaging operations, and in which the photoelectric conversion units 333 of the respective unit pixels 310 share elements of the event detection 400 and pixel imaging signal generation readout 320 circuits.

Figure 24A:
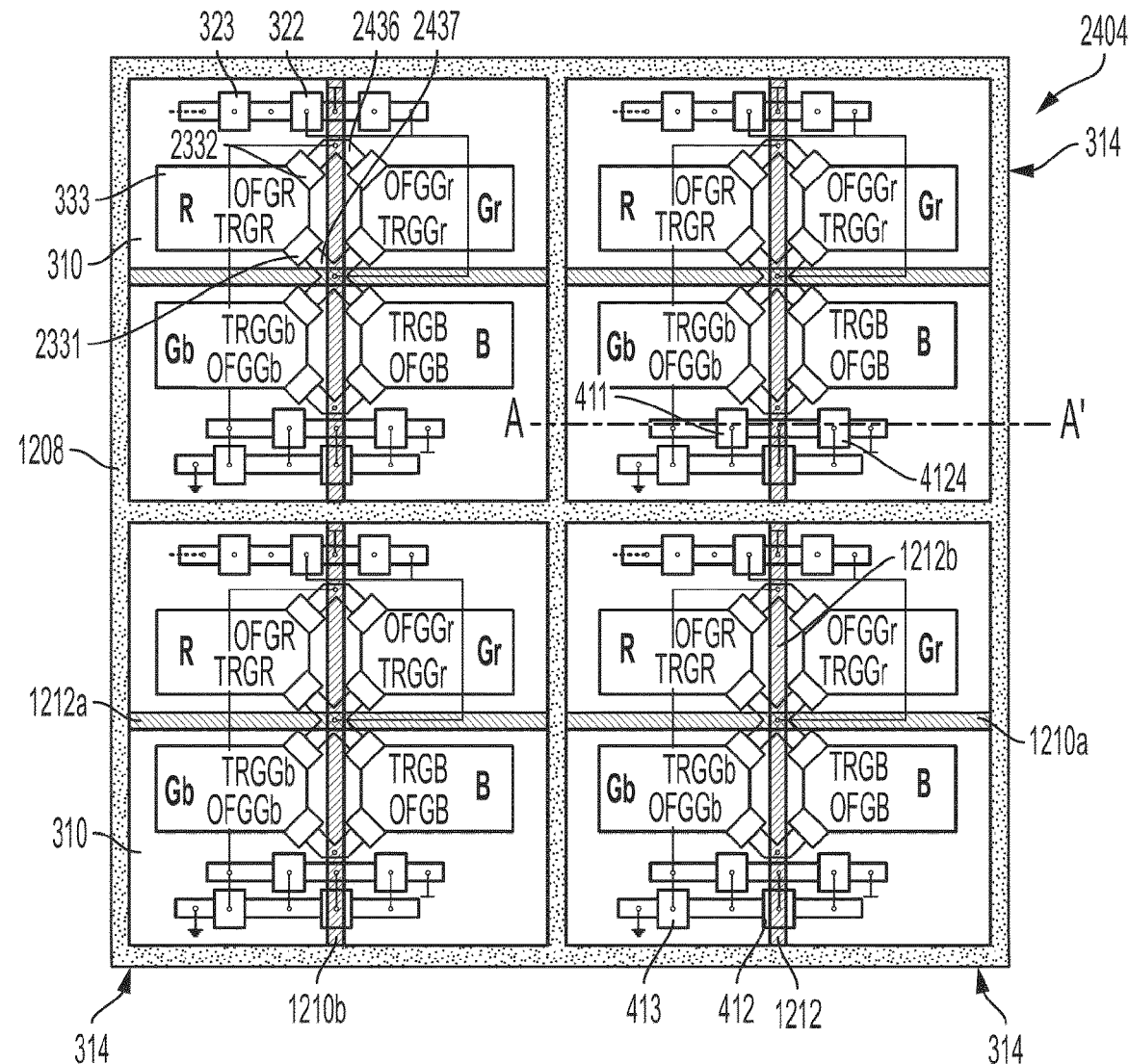
FIG. 24A is a plan view of a pixel configuration in accordance with a twelfth exemplary embodiment of the present disclosure.
Figure 24B:
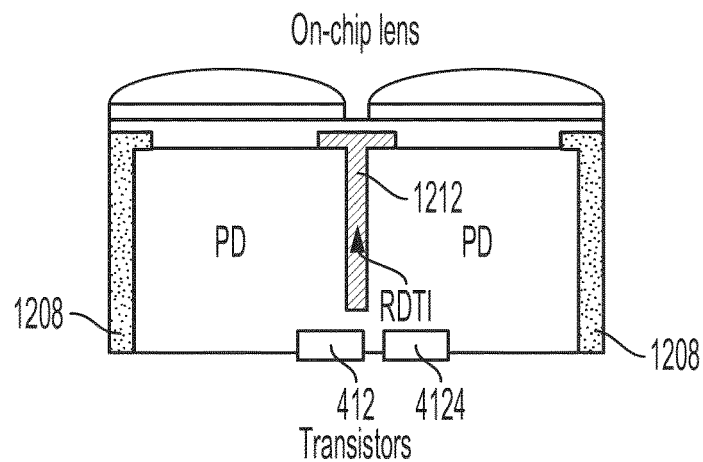
FIG. 24B is a cross section of a portion of the twelfth exemplary embodiment.

FIG. 24A is a plan view of a pixel configuration 2404 in accordance with a twelfth exemplary embodiment of the present disclosure, and FIG. 24B is a cross section of a portion of the twelfth exemplary embodiment taken along line A-A' in FIG. 24A. The pixel configuration 2404 is similar to the pixel configuration 1204 of FIG. 12A, except for the inclusion of a unit pixel transmission transistor 2331 and a unit pixel overflow gate transistor 2332 for the photoelectric conversion unit 333 of each unit pixel 310, and the exclusion of a pixel group transmission transistor 331 and an pixel group overflow gate transistor 332. Accordingly, in this example, groups 314 of unit pixels 310 are defined and are separated from one another by full thickness dielectric trench isolation (RFTI) structures 1208. Within each pixel group 314, unit pixels 310 are separated from one another by an inter-pixel group isolation structure 1210 in the form of deep trench isolation (RDTI) structures 1212. The inter pixel group isolation structure 1210 within a pixel group 314 can include a horizontal portion 1210a that extends between unit pixels 310 in adjacent rows, and a vertical portion 1210b that extends between unit pixels 310 in adjacent columns. More particularly, the pixel configuration 1204 features RDTI structures 1212 along the entire extent of the boundaries between adjacent unit pixels 310 within each pixel group 314, with a first RDTI structure 1212a extending between adjacent rows of unit pixels 310 within each pixel group 314, and a second RDTI structure 1212b extending between adjacent columns of unit pixels 310 within each pixel group 314. Although in this example four pixel groups 314 in a 2×2 array in which each of the pixel groups 314 includes four unit pixels 310 in a 2×2 sub-array or group array pattern are shown, other configurations are possible.

In accordance with embodiments of the present disclosure, and as illustrated in FIG. 24B, RFTI structures 1208 extend through the entire thickness of a substrate 1216 in which the photodiodes 333 of the unit pixels 314 are formed. That is, the RFTI structures 1208 extend from at least a first, light incident surface 1220, to a second, non-light incident surface 1224, of the substrate 1216. The RDTI structures 1212 extend from a first end 1228 at or above the first surface 1220 to a second end 1232 that is formed towards the second surface 1224 of the substrate 1216. In particular, the RDTI structures 1212 extend for distance that is less than a thickness of the substrate 1216, and thus do not reach the second surface 1224. Accordingly, substrate 1216 material remains between the second end 1232 of the RDTI structures 1212 and the second surface 1224 of the substrate 1216.

The circuit elements associated with each pixel group 314 in the example pixel group configuration 2404 of FIGS. 24A and 24B may be the same as or similar to those illustrated in the pixel group circuit 2300 of FIG. 23. In accordance with embodiments of the present disclosure, one or more circuit elements, such as transistor, conductor, or other elements of a pixel group circuit 2300, are at least partially formed or located between the second end 1232 of one or more of the RDTI structures 1212 within an area of the pixel group 314 and the second surface 1224 of the substrate 1216. For instance, in the example of FIGS. 24A and 242B, at least a portion of a log transistor 411 and/or an amplification transistor 412 of the address event detection readout circuit 400 for the pixel group circuit 1100 can be formed between the second end 1232 of an RDTI structure 1212 and the second surface 1224 of the substrate 1216. As another example, at least portions of nodes 2436 and 2437 through which the unit pixel transistors 334 are connected to the pixel imaging signal generation readout circuit 320 and the address event detection readout circuit 400 respectively can be formed between the second end 1232 of an RDTI structure 1212 and the second surface 1224. As still another example, at least portions of at least one of a node 2436 or 2437 can be formed between the second ends 1232 of two intersecting RDTI structures 1212 and the second surface 1224 of the substrate 1216.

Accordingly, embodiments of the present disclosure can provide suitable isolation between pixel groups 314 using RFTI structures 1208, and between unit pixels 310 within a pixel group 314 using RDTI structures 1212, while providing a more favorable ratio of a total area of a pixel group 314 to areas of the photoelectric conversion units 333 of the unit pixels 310 within the pixel group 314 by facilitating the sharing of pixel group circuit 1100 elements, and by enabling the formation of at least portions of elements of the pixel group circuit 1100 in areas between an end of an RDTI structure 1212 and a surface of the substrate 1216.

Figure 25A:
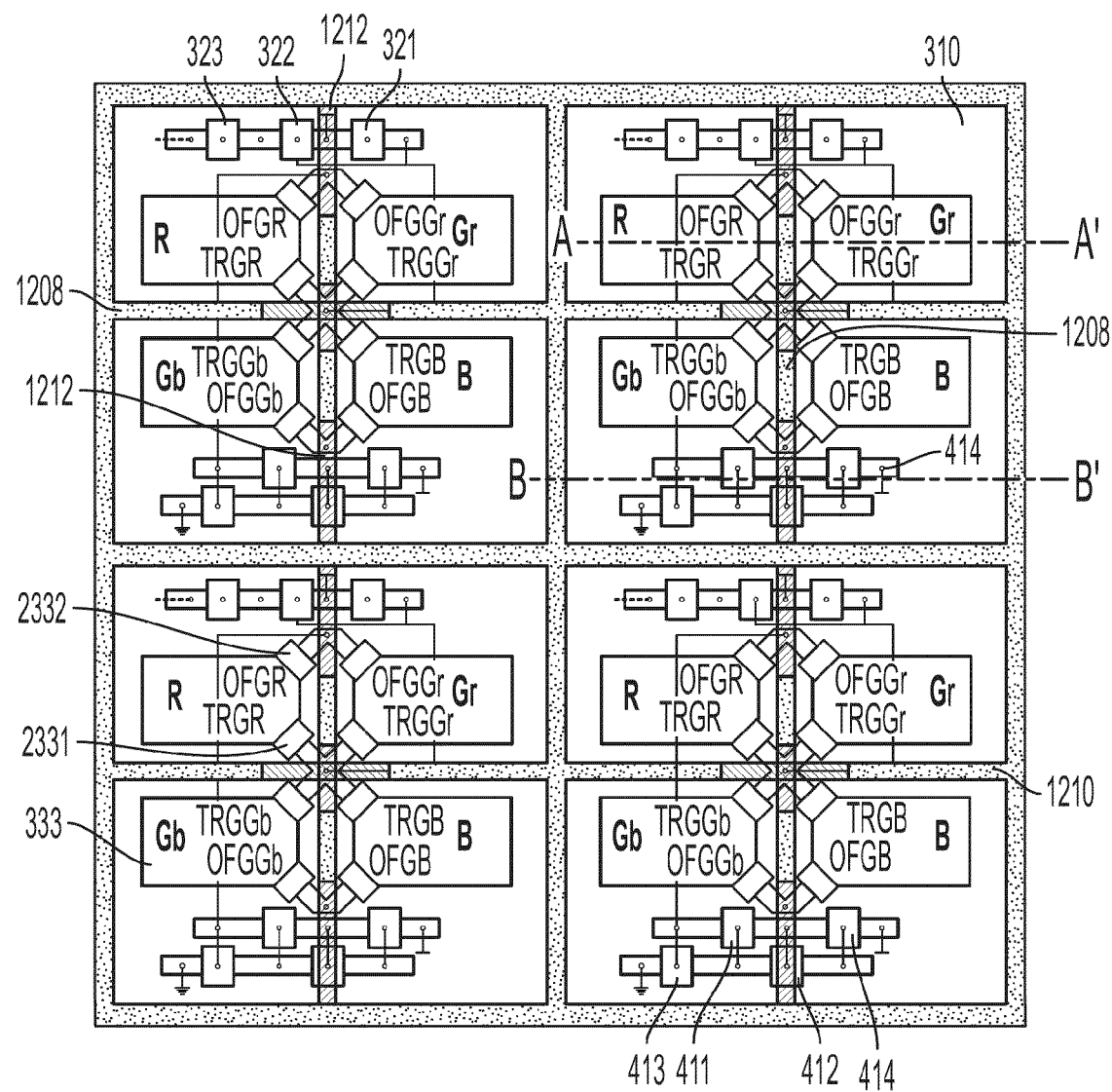
FIG. 25A is a plan view of a pixel configuration in accordance with a thirteenth exemplary embodiment of the present disclosure.
Figure 25B:
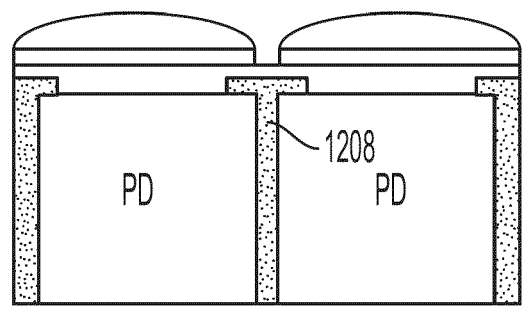
FIG. 25B is a cross section of a portion of the thirteenth exemplary embodiment.
Figure 25C:
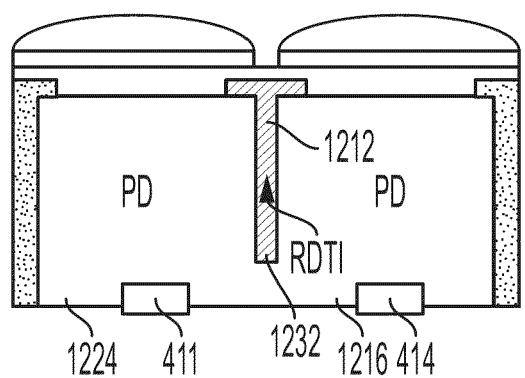
FIG. 25C is a cross section of another portion of the thirteenth exemplary embodiment.

FIG. 25A is a plan view of a pixel configuration in accordance with a thirteenth exemplary embodiment of the present disclosure, FIG. 25B is a cross section of a portion of the thirteenth exemplary embodiment taken along line A-A' in FIG. 25A, and FIG. 25C is a cross section of another portion of the thirteenth exemplary embodiment taken along line B-B' in FIG. 25A. In this example, groups 314 of unit pixels 310 are defined and are separated from one another by RFTI structures 1208. In addition, an interpixel group isolation structure 1210 is provided that includes RFTI 1208 and RDTI 1212 structures. More particularly, the inter-pixel group isolation structure 1210 within a pixel group 314 can include a horizontal portion that extends between unit pixels 310 in adjacent rows that includes both RFTI 1208 and RDTI 1212 structures, and a vertical portion 1210b that extends between unit pixels 310 in adjacent columns and that includes both RFTI 1208 and RDTI 1212 structures. In the example of FIG. 25A, two segments of RFTI structure 1208 extend horizontally from the RFTI structures 1208 between pixel groups 314 in different columns of pixel groups 314, and one segment of RDTI structure 1212 extends horizontally between the two horizontal segments of RFTI structures 1208. Two segments of RDTI structures 1212 extend vertically from the RFTI structures 1208 at the top and bottom of the pixel group 314, with one vertical segment of RFTI structure 1208 extending from the vertical RDTI structures 1212. Each vertical segment of RFTI structure 1208 within the pixel group 314 is separated from one another by a vertical segment of RDTI structure 1212 at a middle area of the pixel group 314. The vertical segment of RDTI structure 1212 also intersects the horizontal segment of RDTI structure 1212 at the middle area of the pixel group.

This exemplary embodiment can include a pixel group circuit that is configured the same as or similarly to the pixel group circuit 2300 of FIG. 23. As depicted in FIGS. 25A, 25B, and 25C, isolation between adjacent unit pixels 310 is provided, while also allowing at least portions of various circuit elements to be formed between a second end 1232 of an RDTI structure 1212 and the second surface 1224 of the substrate 1216. For example, as shown in FIG. 25B, an RFTI structure 1208 extends between at least some of a shared border between adjacent unit pixels 314. As shown in FIG. 25C, an area is available between a second end 1232 of an RDTI structure 1212 that extends between different columns of unit pixels 310 within a pixel group 314 and the second surface 1224 of the substrate 1216. In addition, at least portions of an amplification transistor 412 can be formed between the second end 1232 of a RDTI structure 1212 and the second surface 1224 of the substrate 1216. Accordingly, embodiments of the present disclosure allow for the sharing of pixel group circuit 1100 elements between unit pixels 310 within the same pixel group, while also allowing for isolation between those unit pixels 310.

Figure 26A:
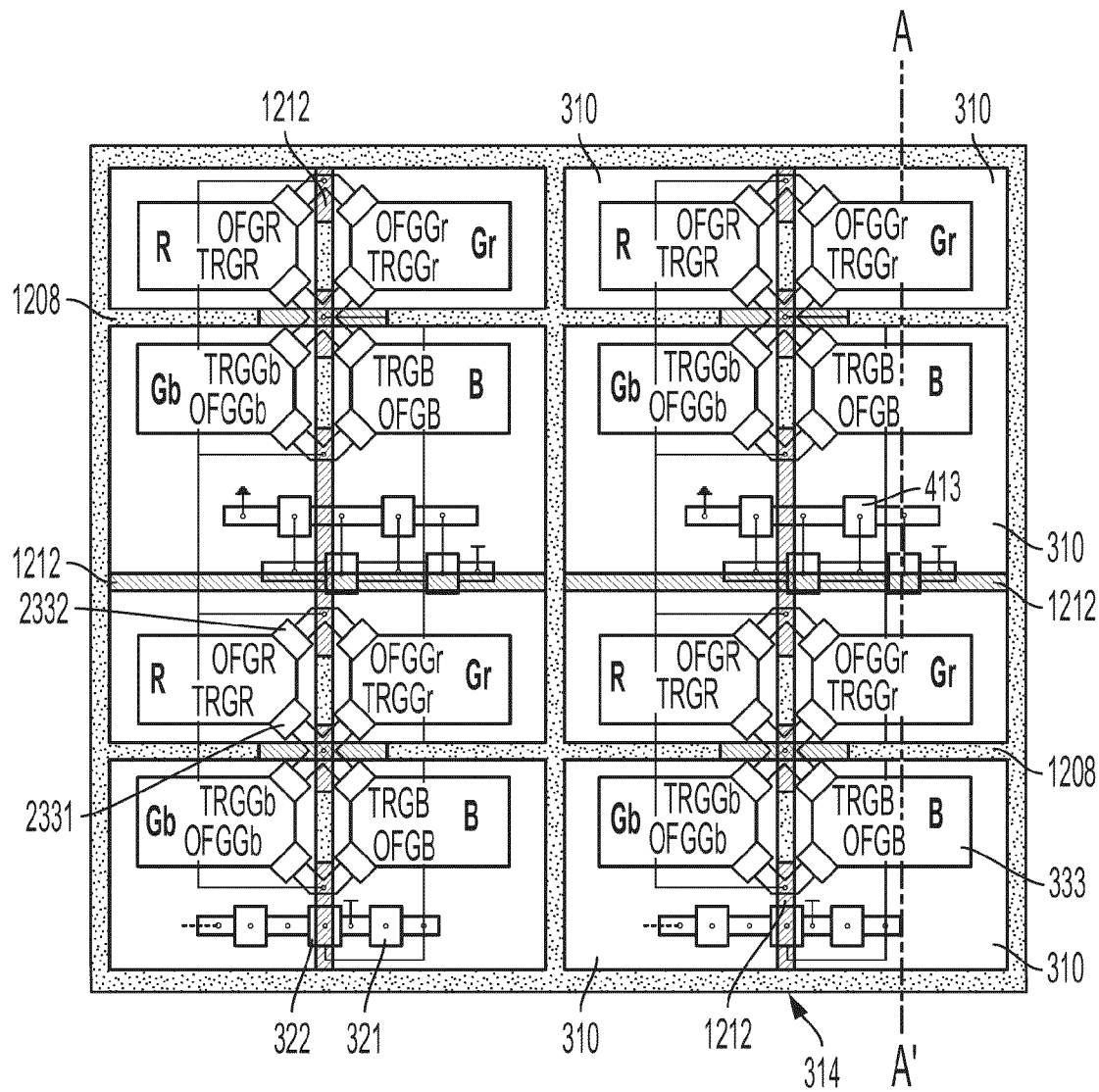
FIG. 26A is a plan view of a pixel configuration in accordance with a fourteenth exemplary embodiment of the present disclosure.
Figure 26B:
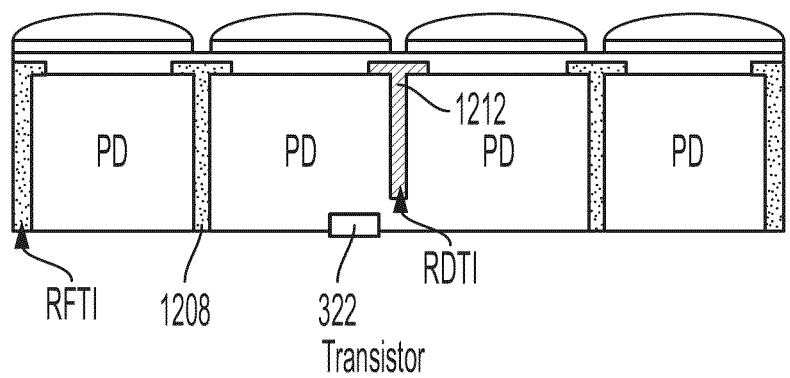
FIG. 26B is a cross section of a portion of the fourteenth exemplary embodiment.

FIG. 26A is a plan view of a pixel configuration in accordance with a fourteenth exemplary embodiment of the present disclosure, and FIG. 26B is a cross section of a portion of the fourteenth exemplary embodiment taken along line A-A' of FIG. 26A. In this embodiment, each pixel group 314 includes eight unit pixels 310, with the unit pixels 310 disposed in four rows and two columns. In addition, the eight unit pixels 310 with a pixel group 314 share at least some circuit elements. In addition, each photoelectric conversion element 333 of each unit pixel 310 is connected to a unit pixel transmission transistor 2331 and a unit pixel overflow gate transistor 2332. A mix of separation structures are applied to provide isolation between adjacent unit pixels 310. In particular, the separation between the first and second rows of unit pixels 310 and between the third and fourth rows of unit pixels 310 is provided by two horizontal RFTI structures 1208 that extend from vertical isolation structures 1208 on either side of the pixel group 314, with a horizontal RDTI structure 1212 extending between the two horizontal RFTI structures 1208 in each case. The separation between the second and third rows of unit pixels 310 is provided entirely by an RDTI structure 1212. The separation between the first and second columns of unit pixels 310 is provided entirely by an RDTI structure 1212.

As shown in FIGS. 26A and 26B, isolation between adjacent unit pixels 310 within a pixel group 314 is provided by a mix of RFTI 1208 and RDTI 1212 structures. In addition, circuit elements are shared between unit pixels, and at least portions of various circuit elements can be formed in areas of the substrate 1216 that are at least partially located between an end 1228 of an RDTI structure 1212 and a surface 1224 of the substrate 1216. For example, at least portions of an amplification transistor 413 and/or at least portions of a reset transistor 321 can be formed between an end of an RDTI structure 1212 and a second surface 1224 of the substrate 1216. Accordingly, isolation is provided, while making more area available for photoelectric conversion elements 333 as compared to prior configurations.

Figure 27A:
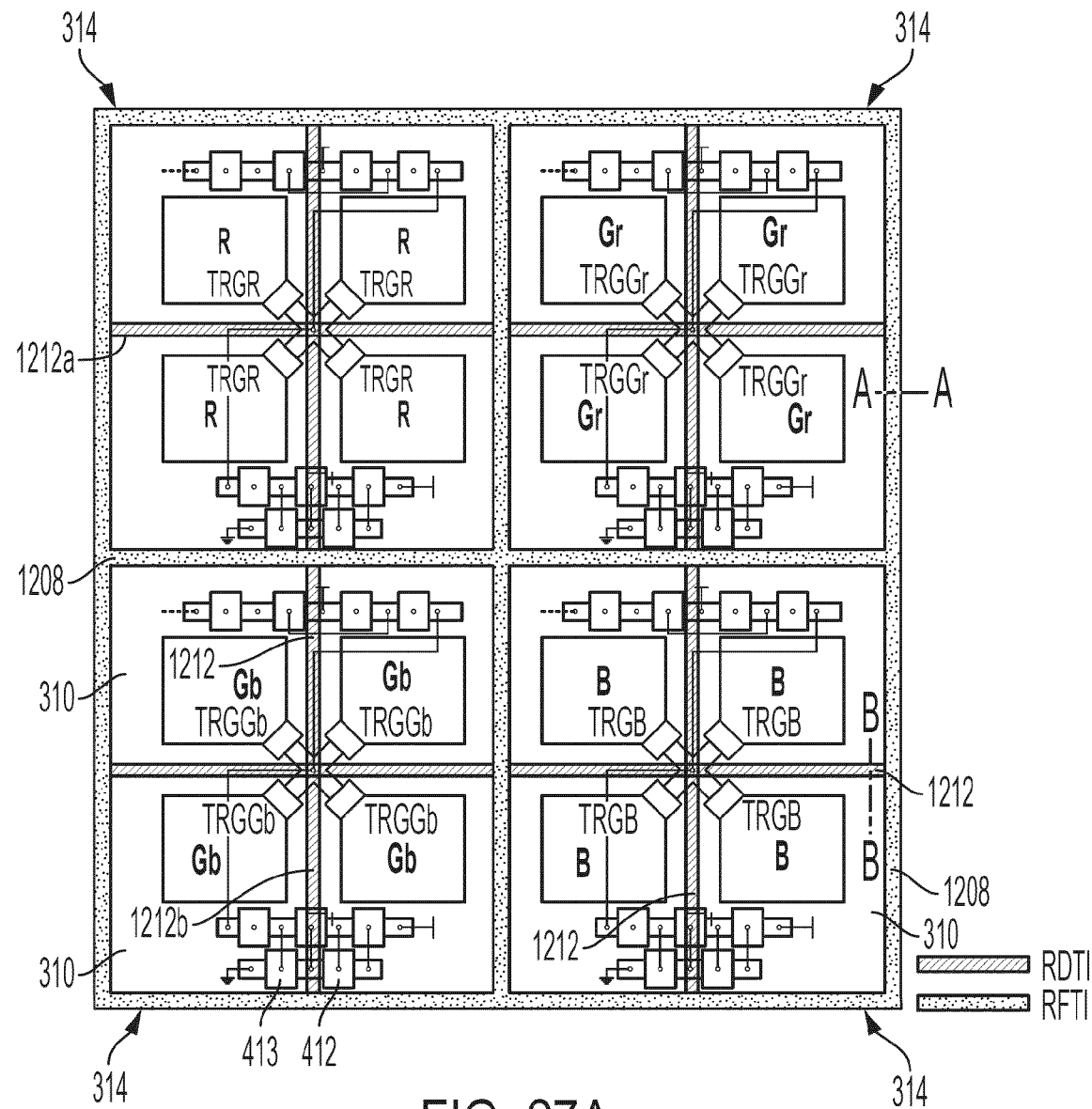
FIG. 27A is a plan view of a pixel configuration in accordance with a fifteenth exemplary embodiment of the present disclosure.
Figure 27B:
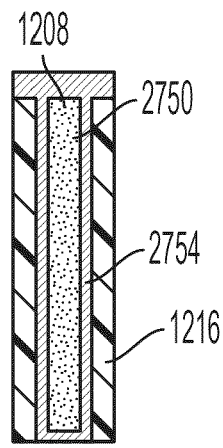
FIG. 27B is a cross section of a portion of the fifteenth exemplary embodiment.
Figure 27C:
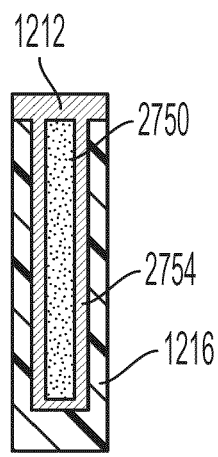
FIG. 27C is a cross section of another portion of the fifteenth exemplary embodiment.

FIG. 27A is a plan view of a pixel configuration in accordance with a fifteenth exemplary embodiment of the present disclosure, FIG. 27B is a cross section of a portion of the fifteenth exemplary embodiment taken from area A of FIG. 27A, and FIG. 27C is a cross section of another portion of the fifteenth exemplary embodiment taken from area B of FIG. 27. The arrangement of pixel groups 314 and of unit pixels 310 within the respective pixel groups 314 can be the same as or similar to the arrangement depicted in FIG. 12A. Accordingly, groups 314 of unit pixels 310 are defined and are separated from one another by full thickness dielectric trench isolation (RFTI) structures 1208. Within each pixel group 314, unit pixels 310 are separated from one another by an inter-pixel group isolation structure 1210 in the form of deep trench isolation (RDTI) structures 1212. The inter pixel group isolation structure 1210 within a pixel group 314 can include a horizontal portion 1210a that extends between unit pixels 310 in adjacent rows, and a vertical portion 1210b that extends between unit pixels 310 in adjacent columns. More particularly, the pixel configuration 1204 features RDTI structures 1212 along the entire extent of the boundaries between adjacent unit pixels 310 within each pixel group 314, with a first RDTI structure 1212a extending between adjacent rows of unit pixels 310 within each pixel group 314, and a second RDTI structure 1212b extending between adjacent columns of unit pixels 310 within each pixel group 314. Although in this example four pixel groups 314 in a 2×2 array in which each of the pixel groups 314 includes four unit pixels 310 in a 2×2 sub-array or group array pattern are shown, other configurations are possible.

In accordance with embodiments of the present disclosure, and as illustrated in FIG. 27B, the RFTI structures 1208 extend through the entire thickness of a substrate 1216, and the RDTI structures 1212 extend from a first end 1228 at or above the first surface 1220 to a second end 1232 that is formed towards the second surface 1224 of the substrate 1216. In the illustrated embodiment, the RFTI 1208 and RDTI 1212 structures have a polysilicon core 2750 that is separated from the substrate 1216 by a dielectric 2754. As an example, but without limitation, the dielectric 2754 may be in the form of an oxide or a nitride material. Moreover, the use of isolation structures 1208 and 1212 with polysilicon cores 2750 as disclosed in herein can be applied to any of the other pixel group 314 configurations and circuit configurations of embodiments of the present disclosure.

Figure 28A:
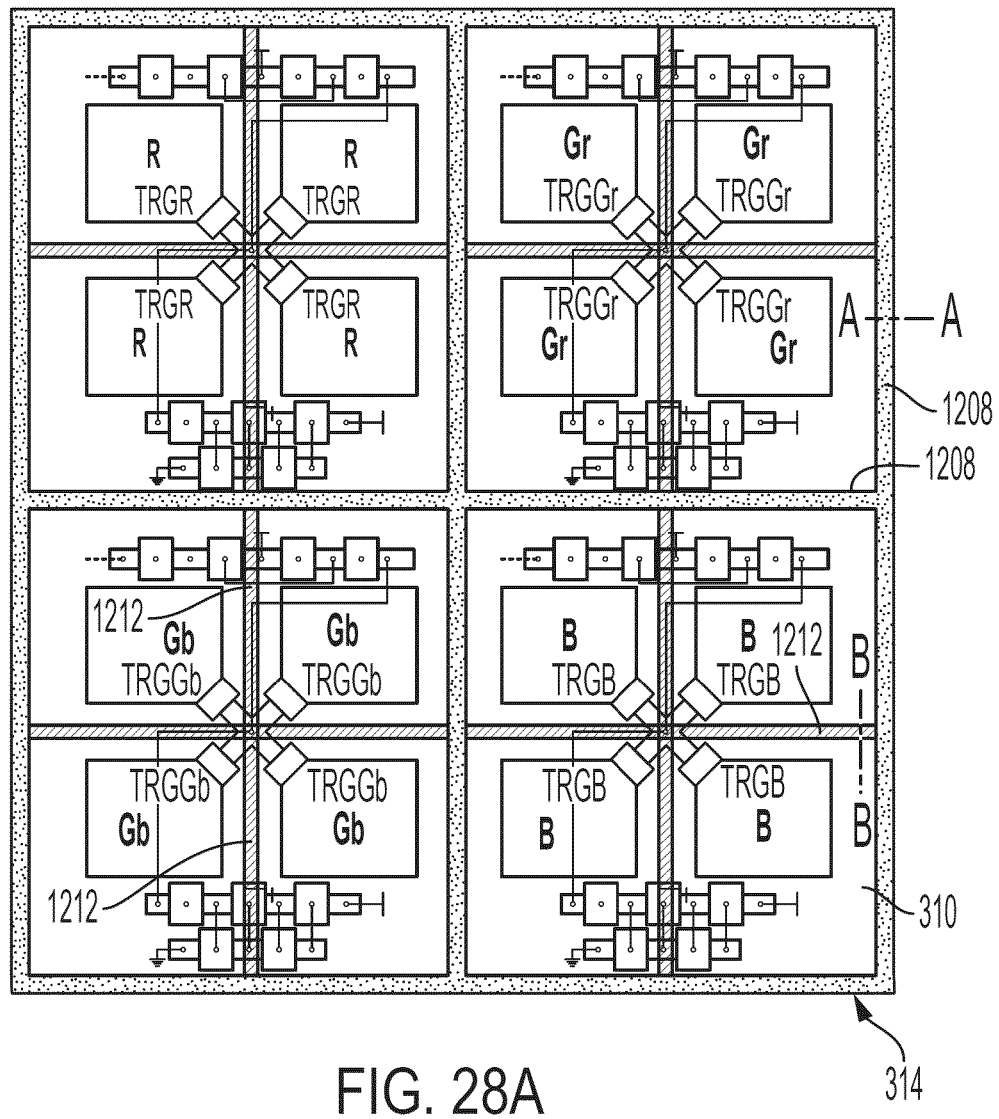
FIG. 28A is a plan view of a pixel configuration in accordance with a sixteenth exemplary embodiment of the present disclosure.
Figure 28B:
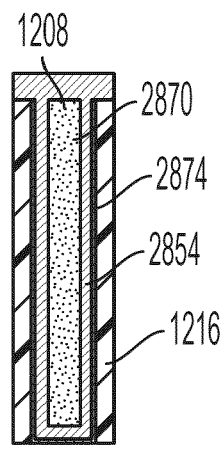
FIG. 28B is a cross section of a portion of the sixteenth exemplary embodiment.
Figure 28C:
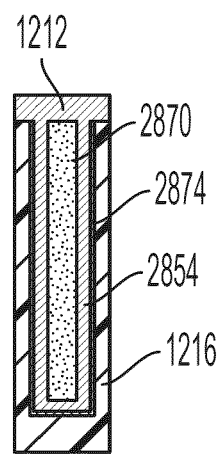
FIG. 28C is a cross section of another portion of the sixteenth exemplary embodiment.

FIG. 28A is a plan view of a pixel configuration in accordance with a sixteenth exemplary embodiment of the present disclosure, FIG. 28B is a cross section of a portion of the sixteenth exemplary embodiment, and FIG. 28C is a cross section of another portion of the sixteenth exemplary embodiment. The arrangement of pixel groups 314 and of unit pixels 310 within the respective pixel groups 314 can be the same as or similar to the arrangement depicted in FIGS. 12A and 27A. However, in this sixteenth exemplary embodiment, and as shown in FIGS. 28A and 28B, the RFTI 1208 and RDTI structures 1212 include a tungsten core 2870 within a dielectric inner layer 2854, which is in turn separated from the substrate 1216 by a passivation layer 2874. The use of isolation structures 1208 and 1212 with tungsten cores 2870 as disclosed herein can be applied to any of the other pixel group 314 configurations and circuit configurations of embodiments of the present disclosure. Moreover, different isolation structure 1208 and 1212 materials can be used in a single pixel array unit 300. For example, some isolation structures 1208 and 1212 can include a dielectric core, some isolation structures 1208 and 1212 can include a polysilicon core, and some isolation structures can include a tungsten core.

Figure 30:
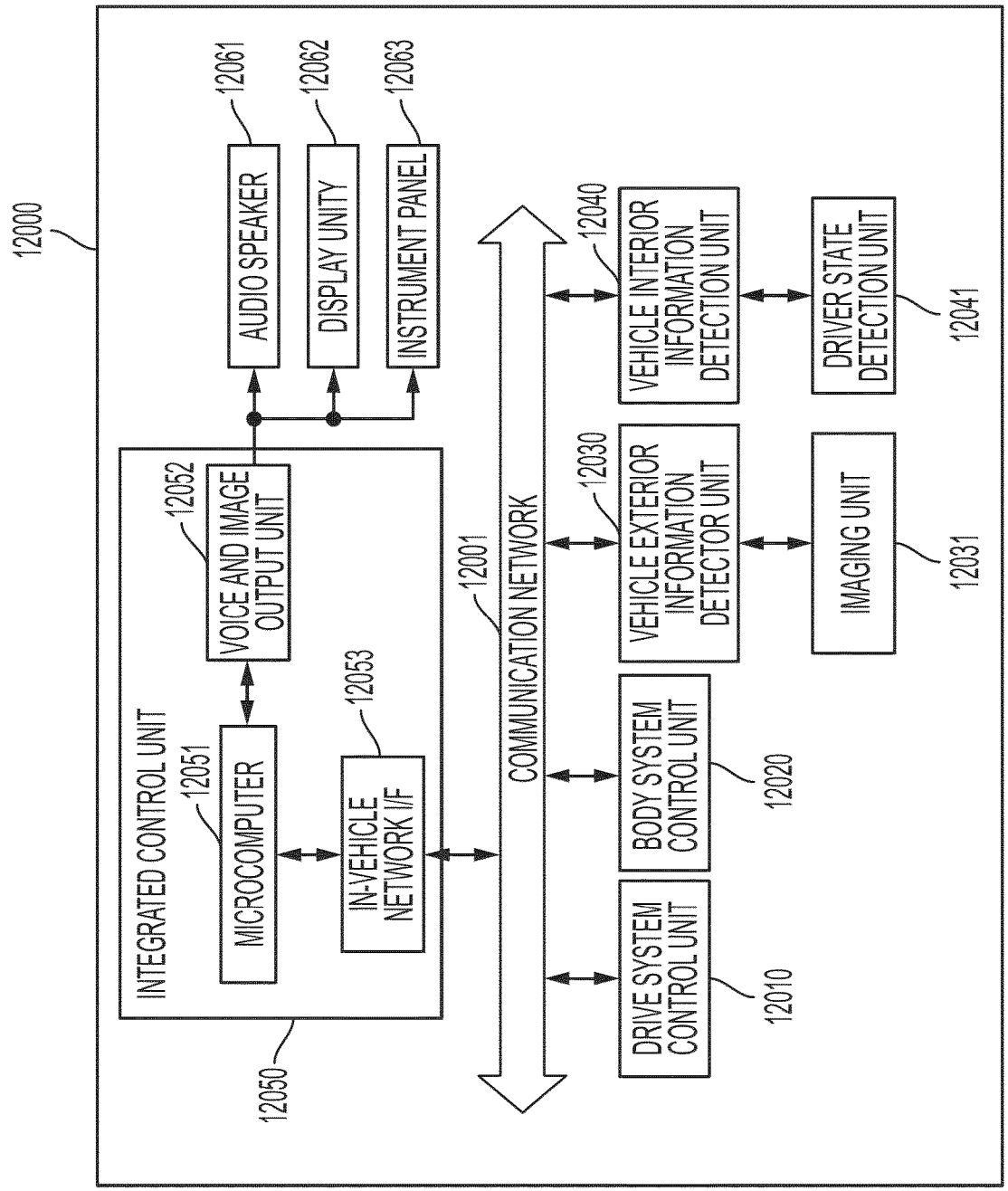
FIG. 30 is a block diagram illustrating an example of a schematic configuration of a vehicle control system.

FIG. 30 is a block diagram illustrating a schematic configuration example of a vehicle control system that is an example of a moving body control system to which the technology according to the present disclosure is applicable.

A vehicle control system 12000 includes a plurality of electronic control units which are connected to each other through a communication network 12001. In the example illustrated in FIG. 30, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an in-vehicle network I/F (interface) 12053 are illustrated in the drawing.

The drive system control unit 12010 controls an operation of a device relating to the drive system of the vehicle in accordance with various programs. For example, the drive system control unit 12010 functions as a control device of a drive force generation device such as an internal combustion engine and a drive motor which generate a drive force of the vehicle, a drive force transmission mechanism that transmits the drive force to wheels, a steering mechanism that adjusts a steering angle of the vehicle, and a braking device that generates a braking force of the vehicle, and the like.

The body system control unit 12020 controls an operation of various devices which are mounted to a vehicle body in accordance with various programs. For example, the body system control unit 12020 functions as a control device of a keyless entry system, a smart key system, a power window device, and various lamps such as a head lamp, a back lamp, a brake lamp, a blinker, and a fog lamp. In this case, an electric wave that is transmitted from a portable device that substitutes for a key, or signals of various switches can be input to the body system control unit 12020. The body system control unit 12020 receives input of the electric wave or the signals, and controls a door lock device, a power window device, a lamp, and the like of the vehicle.

The vehicle exterior information detection unit 12030 detects information regarding an outer side of the vehicle on which the vehicle control system 12000 is mounted. For example, an imaging unit 12031 is connected to the vehicle exterior information detection unit 12030. The vehicle exterior information detection unit 12030 allows the imaging unit 12031 to capture a vehicle exterior image, and receives the captured image. The vehicle exterior information detection unit 12030 may perform object detection processing of a person, a vehicle, an obstacle, a sign, a character on a load, or the like or distance detection processing on the basis of the image that is received.

The imaging unit 12031 is an optical sensor that receives light and outputs an electric signal corresponding to a light-reception amount. The imaging unit 12031 may output the electric signal as an image or as distance measurement information. In addition, light received by the imaging unit 12031 may be visible light, or invisible light such as infrared rays.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that images a driver, and the vehicle interior information detection unit 12040 may calculate the degree of fatigue or the degree of concentration of a driver on the basis of detection information that is input from the driver state detection unit 12041, or may determine whether or not the driver drowses.

The microcomputer 12051 calculates a control target value of the drive force generation device, the steering mechanism, or the braking device on the basis of vehicle interior or exterior information that is acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or impact mitigation of the vehicle, following travel based on an inter-vehicle distance, vehicle speed maintenance travel, vehicle collision alarm, vehicle lane deviation alarm, and the like.

In addition, the microcomputer 12051 can perform a cooperative control for automatic driving and the like in which the vehicle autonomously travels without depending on an operation of a driver by controlling the drive force generation device, the steering mechanism, the braking device, and the like on the basis of information in the vicinity of the vehicle which is acquired by the vehicle exterior information detection unit 12030 or the vehicle interior information detection unit 12040.

In addition, the microcomputer 12051 can output a control command to the body system control unit 12020 on the basis of the vehicle exterior information acquired by the vehicle exterior information detection unit 12030. For example, the microcomputer 12051 can perform a cooperative control to realize glare protection such as switching of a high beam into a low beam by controlling the head lamp in correspondence with a position of a preceding vehicle or an oncoming vehicle which is detected by the vehicle exterior information detection unit 12030.

The voice and image output unit 12052 transmits at least one output signal between a voice and an image to an output device capable of visually or aurally notifying a passenger in a vehicle or an outer side of the vehicle of information. In the example in FIG. 30, as the output device, an audio speaker 12061, a display unit 12062, and an instrument panel 12063 are exemplified. For example, the display unit 12062 may include at least one of an on-board display or a head-up display.

Figure 31:
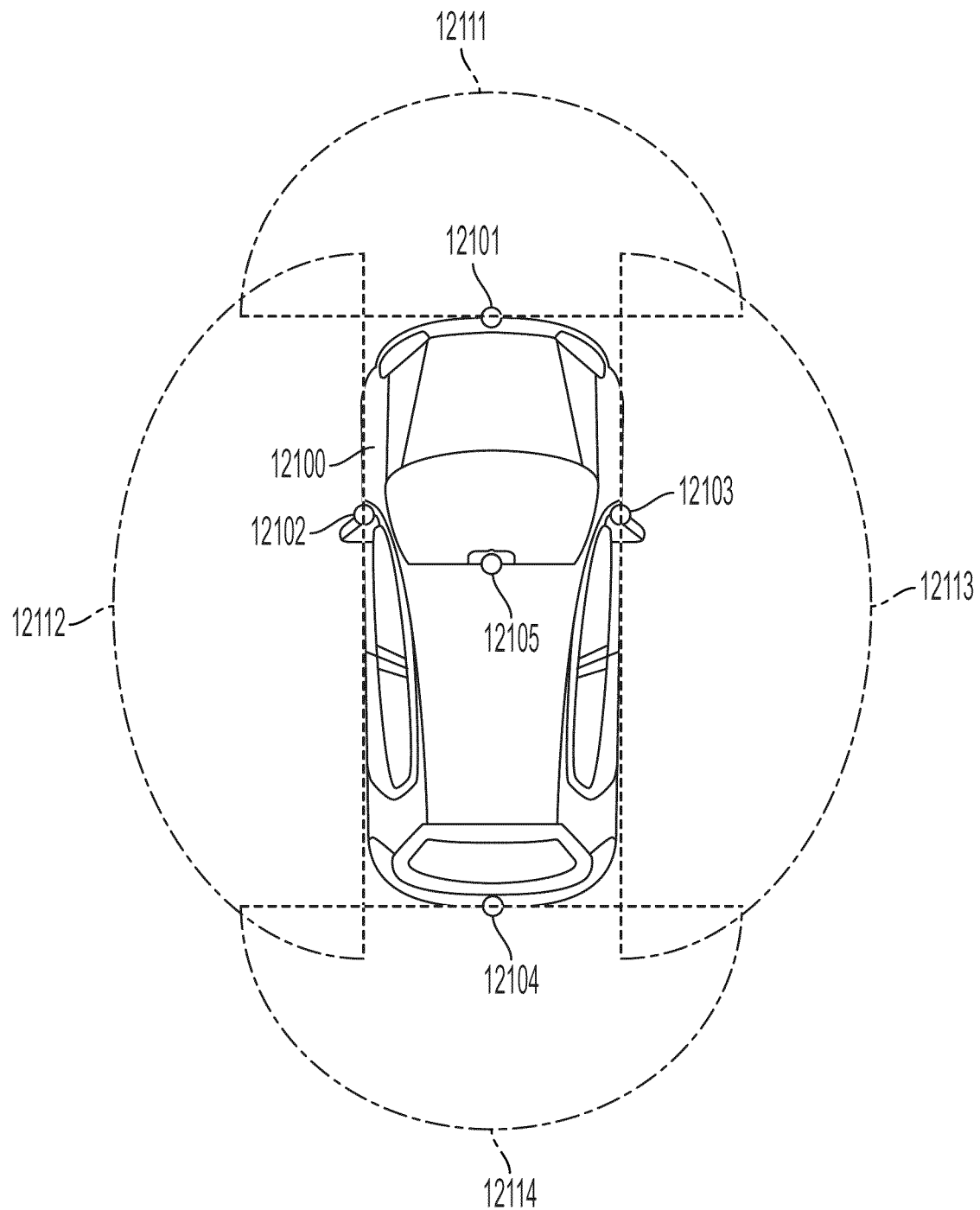
FIG. 31 is a view illustrating an example of an installation position of an out-of-vehicle information detection unit and an imaging unit.

FIG. 31 is a view illustrating an example of an installation position of the imaging unit 12031.

In FIG. 31, as the imaging unit 12031, imaging units 12101, 12102, 12103, 12104, and 12105 are provided.

For example, the imaging units 12101, 12102, 12103, 12104, and 12105 are installed at positions such as a front nose, a side-view mirror, a rear bumper, a back door, and an upper side of a windshield in a vehicle room, of the vehicle 12100. The imaging unit 12101 provided at the front nose, and the imaging unit 12105 that is provided on an upper side of the windshield in a vehicle room mainly acquire images on a forward side of the vehicle 12100. The imaging units 12102 and 12103 which are provided in the side-view mirror mainly acquire images on a lateral side of the vehicle 12100. The imaging unit 12104 that is provided in the rear bumper or the back door mainly acquires images on a backward side of the vehicle 12100. The imaging unit 12105 that is provided on an upper side of the windshield in the vehicle room can be mainly used to detect a preceding vehicle, a pedestrian, an obstacle, a traffic signal, a traffic sign, a vehicle lane, and the like.

Furthermore, FIG. 31 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view minors, an image capturing range 12114 represents an image capturing range of the imaging unit 12104 that is provided in the rear bumper or the back door. For example, when a plurality of pieces of image data captured by the imaging units 12101 to 12104 are superimposed on each other, it is possible to obtain an overlooking image when the vehicle 12100 is viewed from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform a cooperative control for automatic driving in which a vehicle autonomously travels without depending on an operation by a driver, and the like.

For example, the microcomputer 12051 can extract three-dimensional object data relating to a three-dimensional object by classifying a plurality of pieces of the three-dimensional object data into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult for the driver to visually recognize. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the driver through the audio speaker 12061 or the display unit 12062, or by performing compulsory deceleration or avoidance steering through the drive system control unit 12010.

At least one of the imaging units 12101 to 12104 may be an infrared camera that detects infrared rays. For example, the microcomputer 12051 can recognize a pedestrian by determining whether or not the pedestrian exists in images captured by the imaging units 12101 to 12104. For example, the pedestrian recognition is performed by a procedure of extracting a specific point in the images captured by the imaging units 12101 to 12104 as an infrared camera, and a procedure of performing pattern matching processing for a series of specific points indicating a contour line of an object to determine whether or not the object is a pedestrian. When the microcomputer 12051 determines that a pedestrian exists on the images captured by the imaging units 12101 to 12104, and recognizes the pedestrian, the voice and image output unit 12052 controls the display unit 12062 to overlap and display a quadrangular contour line for emphasis on the pedestrian who is recognized. In addition, the voice and image output unit 12052 may control the display unit 12062 to display an icon indicating the pedestrian or the like at a desired position.

Hereinbefore, description has been given of an example of the vehicle control system to which the technology according to the present disclosure is applicable. The technology according to the present disclosure is applicable to the imaging unit 12031, the driver state detection unit 12041, and the like among the above-described configurations.

Hereinbefore, embodiments of the present disclosure have been described, but the technical range of the present disclosure is not limited to the above-described embodiments, and various modifications can be made in a range not departing from the gist of the present disclosure. In addition, constituent elements in other embodiments and modification examples may be appropriately combined.

In addition, the effects in the embodiments described in this specification are illustrative only, and other effect may exist without a limitation.

Furthermore, the present technology can employ the following configurations.

(1)
An imaging device, comprising:
a pixel array unit, wherein the pixel array unit includes a plurality of pixel groups, wherein each pixel group includes:
a plurality of unit pixels, wherein the plurality of unit pixels includes at least first and second unit pixels;
a plurality of photoelectric conversion regions, wherein each unit pixel includes at least one of the photoelectric conversion regions;
a first readout circuit selectively coupled to the plurality of photoelectric conversion regions;
a second readout circuit selectively coupled to the plurality of photoelectric conversion regions; and
an isolation structure, wherein the isolation structure separates the first unit pixel from the second unit pixel.

(2)
The imaging device of (1), wherein the isolation structure includes a deep trench isolation structure portion.

(3)
The imaging device of (1) or (2), wherein the isolation structure includes a full thickness trench isolation structure portion.

(4)
The imaging device of (1), wherein the isolation structure is entirely a deep trench isolation structure.

(5)
The imaging device of any of (1) to (4), wherein the second readout circuit is an address event detection readout circuit.

(6)
The imaging device of any of (1) to (5), wherein the first readout circuit is an imaging signal generation circuit.

(7)
The imaging device of any of (1) to (6), further comprising:
a substrate, wherein the photoelectric conversion elements are formed in the substrate, wherein a first surface of the substrate is an incident light surface, wherein a second surface of the substrate is a non-incident light surface, and wherein at least a portion of an element of at least one of the first and second readout circuits is formed between an end of the deep trench isolation structure and the second surface of the substrate.

(8)
The imaging device of any of (1) to (7), wherein the photoelectric conversion region of the first unit pixel is selectively connected to the imaging signal generation circuit by a first unit pixel transmission transistor and a pixel group transmission transistor, and wherein the photoelectric conversion region of the second unit pixel is selectively connected to the imaging signal generation circuit by a second unit pixel transmission transistor and the pixel group transmission transistor.

(9)
The imaging device of (8), wherein the photoelectric conversion region of the first unit pixel is selectively connected to the address event detection readout circuit by the first unit pixel transmission transistor and a pixel group overflow gate transistor, and wherein the photoelectric conversion region of the second unit pixel is selectively connected to the address event detection readout circuit by the second unit pixel transmission transistor and the pixel group overflow gate transistor.

(10)
The imaging device of any of (1) to (7), wherein the photoelectric conversion region of the first unit pixel is selectively connected to the imaging signal generation circuit by a first unit pixel transmission transistor, and wherein the photoelectric conversion region of the second unit pixel is selectively connected to the imaging signal generation circuit by a second unit pixel transmission transistor.

(11)
The imaging device of (10), wherein the photoelectric conversion region of the first unit pixel is selectively connected to the address event detection readout circuit by a first unit pixel overflow gate transistor, and wherein the photoelectric conversion region of the second unit pixel is selectively connected to the address event detection readout circuit by a second unit pixel overflow gate transistor.

(12)
The imaging device of any of (1) to (11), wherein each pixel group further includes a third unit pixel and a fourth unit pixel, and wherein the first, second and third unit pixels are disposed in a 2×2 array.

(13)
The imaging device of (12), wherein each pixel group is separated from a neighbor pixel group by a full thickness trench isolation structure.

(14)
The imaging device of (12) or (13), wherein the isolation structure that separates the first unit pixel from the second unit pixel is a first isolation structure, wherein the first isolation structure separates the third unit pixel from the fourth unit pixel, wherein a second isolation structure separates the first unit pixel from the third unit pixel, wherein the second isolation structure separates the second unit pixel from the fourth unit pixel, and wherein the second isolation structure intersects the first isolation structure.

(15)
The imaging device of (14), wherein the first isolation structure is entirely a deep trench isolation structure, and wherein the second isolation structure is entirely a deep trench isolation structure.

(16)
The imaging device of (14), wherein the first isolation structure is entirely a deep trench isolation structure, wherein at least a first portion of the second isolation structure is a deep trench isolation structure, and wherein at least a second portion of the second isolation structure is a full thickness isolation structure.

(17)
The imaging device of (14), wherein at least a portion of the first isolation structure is a deep trench isolation structure, wherein at least a second portion of the first isolation structure is a full thickness isolation structure, and wherein the second isolation structure is entirely a deep trench isolation structure.

(18)
The imaging device of (14), wherein at least a portion of the first isolation structure is a deep trench isolation structure, wherein at least a second portion of the first isolation structure is a full thickness isolation structure, wherein at least a first portion of the second isolation structure is a deep trench isolation structure, and wherein at least a second portion of the second isolation structure is a full thickness isolation structure.

(19)
An electronic apparatus, comprising:
an imaging lens; and
a solid state imaging device, including: a pixel array unit, wherein the imaging lens passes incident light to the pixel array unit, wherein the pixel array unit includes a plurality of pixel groups, wherein each pixel group includes:

a plurality of unit pixels, wherein the plurality of unit pixels includes at least first and second unit pixels;

a plurality of photoelectric conversion regions, wherein each unit pixel includes at least one of the photoelectric conversion regions;

a first readout circuit selectively coupled to the plurality of photoelectric conversion regions;

a second readout circuit selectively coupled to the plurality of photoelectric conversion regions; and an isolation structure, wherein the isolation structure separates the first unit pixel from the second unit pixel.

It should be understood by those skilled in the art that various modifications, combinations, sub-combinations and alterations may occur depending on design requirements and other factors insofar as they are within the scope of the appended claims or the equivalents thereof.

The invention claimed is:

1. An imaging device, comprising:
a pixel array unit, wherein the pixel array unit includes a plurality of pixel groups, wherein each pixel group includes:
   a plurality of unit pixels, wherein the plurality of unit pixels includes at least first and second unit pixels;
   a plurality of photoelectric conversion regions, wherein each unit pixel includes at least one of the photoelectric conversion regions;
   a first readout circuit selectively coupled to the plurality of photoelectric conversion regions;
   a second readout circuit selectively coupled to the plurality of photoelectric conversion regions;
   an isolation structure, wherein the isolation structure includes a deep trench isolation structure portion and a full trench isolation structure portion, wherein the deep trench isolation structure portion extends between at least a portion of the first unit pixel and at least a portion of the second unit pixel, and wherein the full trench isolation structure portion extends between a first pixel group and a second pixel group; and
   a substrate, wherein the photoelectric conversion regions are formed in the substrate, wherein a first surface of the substrate is an incident light surface, wherein a second surface of the substrate is a non-incident light surface, wherein at least a portion of a transistor element of at least one of the first and second readout circuits is formed between an end of the deep trench isolation structure portion of the isolation structure and the second surface of the substrate, wherein the first readout circuit is an imaging signal generation circuit, wherein the photoelectric conversion region of the first unit pixel is selectively connected to the imaging signal generation circuit by a first unit pixel transmission transistor and a pixel group transmission transistor, and wherein the photoelectric conversion region of the second unit pixel is selectively connected to the imaging signal generation circuit by a second unit pixel transmission transistor and the pixel group transmission transistor.

2. The imaging device of claim 1, wherein the deep trench isolation structure portion of the isolation structure extends from the first surface of the substrate and towards the second surface of the substrate.

3. The imaging device of claim 2, wherein the isolation structure includes a full thickness trench isolation structure portion.

4. The imaging device of claim 2, wherein the first readout circuit is an imaging signal generation circuit.

5. The imaging device of claim 4, wherein the second readout circuit is an address event detection readout circuit.

6. The imaging device of claim 1, wherein the second readout circuit is an address event detection readout circuit.

7. The imaging device of claim 1, wherein the second readout circuit is an address event detection readout circuit, wherein the photoelectric conversion region of the first unit pixel is selectively connected to the address event detection readout circuit by the first unit pixel transmission transistor and a pixel group overflow gate transistor, and wherein the photoelectric conversion region of the second unit pixel is selectively connected to the address event detection readout circuit by the second unit pixel transmission transistor and the pixel group overflow gate transistor.

8. The imaging device of claim 1, wherein each pixel group further includes a third unit pixel and a fourth unit pixel, and wherein the first, second, third, and fourth unit pixels are disposed in a 2×2 array.

9. The imaging device of claim 8, wherein each pixel group is separated from a neighbor pixel group by a full thickness trench isolation structure.

10. The imaging device of claim 9, wherein the deep trench isolation structure portion that extends between at least a portion of the first unit pixel and at least a portion of the second unit pixel is a first isolation structure, wherein the first isolation structure also extends between at least a portion of the third unit pixel and at least a portion of the fourth unit pixel, wherein a second isolation structure is a deep trench isolation structure that separates at least a portion of the first unit pixel from at least a portion of the third unit pixel, wherein the second isolation structure also extends between at least a portion of the second unit pixel and at least a portion of the fourth unit pixel, and wherein the second isolation structure intersects the first isolation structure.

11. The imaging device of claim 10, wherein the first isolation structure is entirely a deep trench isolation structure, and wherein the second isolation structure is entirely a deep trench isolation structure.

12. The imaging device of claim 10, wherein the first isolation structure is entirely a deep trench isolation structure, wherein at least a first portion of the second isolation structure is a deep trench isolation structure, and wherein at least a second portion of the second isolation structure is a full thickness isolation structure.

13. The imaging device of claim 10, wherein at least a portion of the first isolation structure is a deep trench isolation structure, wherein at least a second portion of the first isolation structure is a full thickness isolation structure, and wherein the second isolation structure is entirely a deep trench isolation structure.

14. The imaging device of claim 10, wherein at least a portion of the first isolation structure is a deep trench isolation structure, wherein at least a second portion of the first isolation structure is a full thickness isolation structure, wherein at least a first portion of the second isolation structure is a deep trench isolation structure, and wherein at least a second portion of the second isolation structure is a full thickness isolation structure.

15. An imaging device, comprising:
a pixel array unit, wherein the pixel array unit includes a plurality of pixel groups, wherein each pixel group includes:
  a plurality of unit pixels, wherein the plurality of unit pixels includes at least first and second unit pixels;
  a plurality of photoelectric conversion regions, wherein each unit pixel includes at least one of the photoelectric conversion regions;
  a first readout circuit selectively coupled to the plurality of photoelectric conversion regions;
  a second readout circuit selectively coupled to the plurality of photoelectric conversion regions;
  an isolation structure, wherein the isolation structure includes a deep trench isolation structure portion and a full trench isolation structure portion, wherein the deep trench isolation structure portion extends between at least a portion of the first unit pixel and at least a portion of the second unit pixel, and wherein the full trench isolation structure portion extends between a first pixel group and a second pixel group; and
a substrate, wherein the photoelectric conversion regions are formed in the substrate, wherein a first surface of the substrate is an incident light surface, wherein a second surface of the substrate is a non-incident light surface, wherein at least a portion of a transistor element of at least one of the first and second readout circuits is formed between an end of the deep trench isolation structure portion of the isolation structure and the second surface of the substrate, wherein the first readout circuit is an imaging signal generation circuit, wherein the photoelectric conversion region of the first unit pixel is selectively connected to the imaging signal generation circuit by a first unit pixel transmission transistor, and wherein the photoelectric conversion region of the second unit pixel is selectively connected to the imaging signal generation circuit by a second unit pixel transmission transistor.

16. The imaging device of claim 15, wherein the second readout circuit is an address event detection readout circuit, wherein the photoelectric conversion region of the first unit pixel is selectively connected to the address event detection readout circuit by a first unit pixel overflow gate transistor, and wherein the photoelectric conversion region of the second unit pixel is selectively connected to the address event detection readout circuit by a second unit pixel overflow gate transistor.

17. An electronic apparatus, comprising:
an imaging lens; and
a solid state imaging device, including:
  a pixel array unit, wherein the imaging lens passes incident light to the pixel array unit, wherein the pixel array unit includes a plurality of pixel groups, wherein each pixel group includes:
    a plurality of unit pixels, wherein the plurality of unit pixels includes at least first and second unit pixels;
    a plurality of photoelectric conversion regions, wherein each unit pixel includes at least one of the photoelectric conversion regions;
    a first readout circuit selectively coupled to the plurality of photoelectric conversion regions;
    a second readout circuit selectively coupled to the plurality of photoelectric conversion regions; and
    an isolation structure, wherein the isolation structure includes a deep trench isolation structure portion and a full trench isolation structure portion, wherein the deep trench isolation structure portion extends between at least a portion of the first unit pixel and at least a portion of the second unit pixel, and wherein the full trench isolation structure portion extends between at least a first pixel group and a second pixel group; and
  a substrate, wherein the photoelectric conversion regions are formed in the substrate, wherein a first surface of the substrate is an incident light surface, wherein a second surface of the substrate is a non-incident light surface, wherein at least a portion of a transistor element of at least one of the first and second readout circuits is formed between an end of the deep trench isolation structure portion of the isolation structure and the second surface of the substrate, wherein the first readout circuit is an imaging signal generation circuit, wherein the photoelectric conversion region of the first unit pixel is selectively connected to the imaging signal generation circuit by a first unit pixel transmission transistor and a pixel group transmission transistor, and wherein the photoelectric conversion region of the second unit pixel is selectively connected to the imaging signal generation circuit by a second unit pixel transmission transistor and the pixel group transmission transistor.

18. The electronic apparatus of claim 17, wherein each pixel group of the solid state imaging device further includes a third unit pixel and a fourth unit pixel, and wherein the first, second, third, and fourth unit pixels are disposed in a 2×2 array.

19. The electronic apparatus of claim 18, wherein each pixel group is separated from a neighbor pixel group by a full thickness trench isolation structure.

20. The electronic apparatus of claim 19, wherein the deep trench isolation structure portion that extends between at least a portion of the first unit pixel and at least a portion of the second unit pixel is a first isolation structure, wherein the first isolation structure also extends between at least a portion of the third unit pixel and at least a portion of the fourth unit pixel, wherein a second isolation structure is a deep trench isolation structure that separates at least a portion of the first unit pixel from at least a portion of the third unit pixel, wherein the second isolation structure also extends between at least a portion of the second unit pixel and at least a portion of the fourth unit pixel, and wherein the second isolation structure intersects the first isolation structure.

* * * * *